(12) United States Patent
Sakamoto et al.

(10) Patent No.: US 10,446,567 B2
(45) Date of Patent: Oct. 15, 2019

(54) NONVOLATILE STORAGE ELEMENT AND REFERENCE VOLTAGE GENERATION CIRCUIT

(71) Applicant: ASAHI KASEI MICRODEVICES CORPORATION, Tokyo (JP)

(72) Inventors: Toshiro Sakamoto, Tokyo (JP); Satoshi Takehara, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/925,023

(22) Filed: Mar. 19, 2018

(65) Prior Publication Data

US 2018/0286880 A1 Oct. 4, 2018

(30) Foreign Application Priority Data

Mar. 31, 2017 (JP) ................................. 2017-071027
Feb. 23, 2018 (JP) ................................. 2018-030944

(51) Int. Cl.
| | |
|---|---|
| H01L 27/11558 | (2017.01) |
| H01L 27/088 | (2006.01) |
| G11C 16/04 | (2006.01) |
| G05F 3/24 | (2006.01) |
| G04G 19/06 | (2006.01) |
| G11C 16/14 | (2006.01) |
| H01L 27/07 | (2006.01) |
| G11C 16/26 | (2006.01) |

(52) U.S. Cl.
CPC ........ *H01L 27/11558* (2013.01); *G04G 19/06* (2013.01); *G05F 3/245* (2013.01); *G05F 3/247* (2013.01); *G11C 16/0416* (2013.01); *G11C 16/0433* (2013.01); *G11C 16/14* (2013.01); *G11C 16/26* (2013.01); *H01L 27/0727* (2013.01); *H01L 27/0883* (2013.01)

(58) Field of Classification Search
CPC ........... H01L 27/11558; H01L 27/0717; H01L 27/0883; G04G 19/06; G05F 3/245; G05F 3/247; G11C 16/0433; G11C 16/14
USPC ..................................................... 365/185.33
See application file for complete search history.

(56) References Cited

U.S. PATENT DOCUMENTS

| | | | |
|---|---|---|---|
| 4,417,263 A | 11/1983 | Matsuura | |
| 5,465,231 A | 11/1995 | Ohsaki | |
| 2003/0107090 A1* | 6/2003 | Kumeno | ........... H01L 21/82384 257/377 |

(Continued)

FOREIGN PATENT DOCUMENTS

| | | |
|---|---|---|
| JP | H04-65546 B2 | 10/1992 |
| JP | H06-334190 A | 12/1994 |

(Continued)

*Primary Examiner* — Sung Il Cho
(74) *Attorney, Agent, or Firm* — Morgan Lewis & Bockius LLP

(57) ABSTRACT

To provide a nonvolatile storage element capable of being formed by an ordinary CMOS process using single layer polysilicon without requiring exclusive forming process and a reference voltage generation circuit with high versatility and high precision. A reference voltage generation circuit includes nonvolatile storage elements formed of single layer polysilicon. The nonvolatile storage elements each include a MOS transistor including a floating gate, a MOS transistor including a floating gate, and a MOS transistor including a floating gate.

13 Claims, 50 Drawing Sheets

(56) References Cited

U.S. PATENT DOCUMENTS

| | | | |
|---|---|---|---|
| 2005/0161745 A1 | 7/2005 | Tamaki et al. | |
| 2006/0267903 A1* | 11/2006 | Kawase | G09G 3/3655 345/98 |
| 2006/0281240 A1* | 12/2006 | Grudowski | H01L 21/31111 438/199 |
| 2007/0058441 A1* | 3/2007 | Oka | G11C 16/0433 365/185.28 |
| 2009/0146731 A1 | 6/2009 | Yoshida et al. | |
| 2011/0115030 A1* | 5/2011 | Kitano | H01L 27/0207 257/392 |
| 2012/0286343 A1* | 11/2012 | Matsuo | H01L 29/7881 257/296 |
| 2014/0021526 A1 | 1/2014 | Yao et al. | |
| 2015/0187782 A1* | 7/2015 | Yamakoshi | G11C 16/0441 257/321 |
| 2015/0221372 A1* | 8/2015 | Milani | G11C 16/0408 365/185.28 |

FOREIGN PATENT DOCUMENTS

| | | |
|---|---|---|
| JP | 2002-368107 A | 12/2002 |
| JP | 2005-216909 A | 8/2005 |
| JP | 2006-013336 A | 1/2006 |
| JP | 2007-294846 A | 11/2007 |
| JP | 2013-246627 A | 12/2013 |
| JP | 2015-011454 A | 1/2015 |

\* cited by examiner

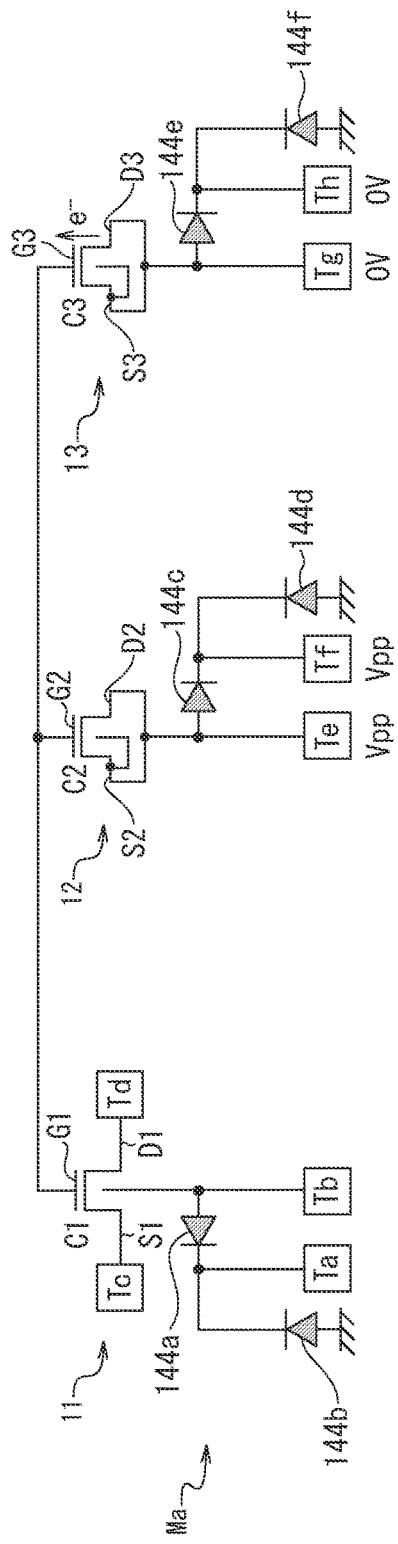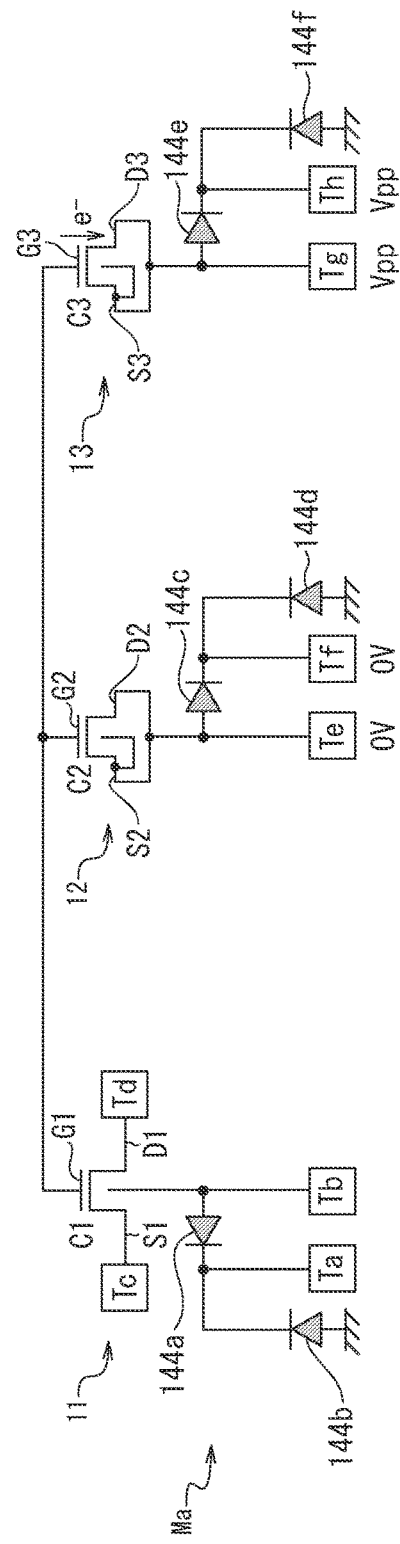

NONVOLATILE STORAGE ELEMENT AND REFERENCE VOLTAGE GENERATION CIRCUIT

CROSS REFERENCE TO RELATED APPLICATIONS AND INCORPORATION BY REFERENCE

This application claims benefit of priority under 35 USC 119 based on Japanese Patent Application No. 2017-071027 filed on Mar. 31, 2017, and Japanese Patent Application No. 2018-030944 filed on Feb. 23, 2018, the entire contents of which are incorporated by reference herein.

TECHNICAL FIELD

The present invention relates to a nonvolatile storage element and a reference voltage generation circuit.

BACKGROUND ART

Generally, in semiconductor devices incorporating a reference voltage generation circuit, manufacturing variations in threshold values Vth of respective transistors, resistance values of respective resistance elements, and the like included in the reference voltage generation circuit can cause a reference voltage Vref assumed in design to vary significantly from a desired value. Thus, semiconductor devices requiring a stable reference voltage Vref require a highly precise reference voltage generation circuit. To correct reference voltage variation in the reference voltage generation circuit caused due to manufacturing variations, semiconductor devices incorporate many auxiliary transistors for adjusting a reference voltage by correcting a wiring layer or are configured such that the reference voltage can be adjusted by a laser trimmer after manufacturing. However, correcting the reference voltage variation in the reference voltage generation circuit by such configurations leads to problems such as an increase in a layout area of the reference voltage generation circuit and an increase in the number of steps for performing voltage adjustment. Accordingly, to solve such problems, various reference voltage generation circuits have been proposed.

JP 04-65546 B2 discloses an ordinary reference voltage generation circuit. JP 04-65546 B2 proposes a reference voltage generation circuit having a structure in which, by using constant current characteristics of a depletion type MOSFET (metal oxide film semiconductor field-effect transistor) having a gate G and a source region S connected to each other, a voltage generated in an enhancement type MOSFET that has a gate G and a drain region D connected to each other and operates at the constant current is used as a reference voltage Vref.

FIG. 58 illustrates an ordinary reference voltage generation circuit 100. The reference voltage generation circuit 100 includes a depletion type MOSFET (hereinafter referred to as "depletion type transistor") Md and an enhancement type MOSFET (hereinafter referred to as "enhancement type transistor") Me that are connected in series. The gate G and the source region S of the depletion type transistor Md are connected to each other. The gate G and the drain region D of the enhancement type transistor are connected to each other. Furthermore, the gate G and the source region S of the depletion type transistor are connected to the gate G and the drain region D of the enhancement type transistor. Additionally, a high voltage supply terminal Vdd is provided at a drain region D of the depletion type transistor Md, and a low voltage supply terminal Vss is provided at a source region S of the enhancement type transistor Me. In addition, a voltage output terminal OUT is provided at a connection point between the depletion type transistor Md and the enhancement type transistor Me. In the reference voltage generation circuit 100, both the depletion type transistor Md and the enhancement type transistor Me are of N-channel type. It should be noted that the depletion and enhancement types are classified by a relationship between gate voltage and drain current. In the depletion type, when no gate voltage is applied to the gate, there exits a channel, through which drain current flows. On the other hand, in the enhancement type, without any gate voltage applied to the gate, no channel exists, and therefore no drain current flows.

FIG. 59 illustrates one example of current/voltage characteristics of the depletion type transistor Md and the enhancement type transistor Me included in the reference voltage generation circuit 100. The horizontal axis represents gate-source voltage Vgs between the gate G and the source region S, and the vertical axis represents drain current Ids. In the depletion type transistor Md, since the gate-source voltage Vgs is fixed at 0V, drain current as a constant current Iconst flows as long as the drain-source voltage between the drain region D and the source region S is in a saturation region. The drain current as the constant current Iconst also flows to the enhancement type transistor Me connected in series to the depletion type transistor Md. Accordingly, the gate-and-source voltage Vgs of the enhancement type transistor Me in which Ids=Iconst can be taken out as a reference voltage Vref from the voltage output terminal OUT.

When Vth_d represents a threshold voltage of the depletion type transistor Md and Vth_e represents a threshold voltage of the enhancement type transistor Me, the reference voltage Vref can be represented as a sum of an absolute value of the threshold voltage Vth_d and an absolute value of the threshold voltage Vth_e, i.e., "Vref =|Vth_d|+|Vth_e|".

However, the reference voltage generation circuit 100 is influenced by manufacturing variations in current/voltage characteristics of the depletion type transistor Md and current/voltage characteristics of the enhancement type transistor Me. Thus, as circuits configured such that a highly precise reference voltage can be taken out without being influenced by any manufacturing variations, JP 2002-368107 A and JP 2013-246627 A disclose reference voltage generation circuits using a FET type nonvolatile storage element. The reference voltage generation circuits as disclosed in JP 2002-368107 A and JP 2013-246627 A have substantially the same structure as the reference voltage generation circuit 100 illustrated in FIG. 58, and use nonvolatile storage elements as the depletion type transistor Md and the enhancement type transistor Me. The reference voltage generation circuits disclosed in JP 2002-368107 A and JP 2013-246627 A, respectively, use nonvolatile storage elements of the same kind, and adjust an amount of injection of electric charge into a floating gate included in the nonvolatile storage elements to form a depletion type MOSFET and an enhancement type MOSFET. The nonvolatile storage elements have a control gate and the floating gate, and are adapted to be able to control a threshold voltage Vth by injection and discharge of electrons into the floating gate. Thus, the reference voltage generation circuits enable trimming of the threshold voltage Vth to be performed later even when any manufacturing variation occurs. Accordingly, the reference voltage Vref that is taken out in the reference voltage generation circuits is hardly influenced by manufacturing variations.

SUMMARY

According to an aspect of the present invention, there is provided a reference voltage generation circuit including: a first MOS transistor including a first source terminal, a first drain terminal, and a first gate terminal in a floating state; a second MOS transistor including a second gate terminal connected to the first gate terminal, a second source terminal, a second drain terminal, and a second bulk terminal, the second source terminal, the second drain terminal, and the second bulk terminal being connected to the first source terminal and being connected to each other; a third MOS transistor including a third source terminal, a third drain terminal, and a third gate terminal in a floating state; a fourth MOS transistor including a fourth gate terminal connected to the third gate terminal, a fourth source terminal, a fourth drain terminal, and a fourth bulk terminal, the fourth source terminal, the fourth drain terminal, and the fourth bulk terminal being connected to the third drain terminal and being connected to each other; a first power source terminal; and a second power source terminal configured to have a lower voltage than a voltage of the first power source terminal when the first MOS transistor and the third MOS transistor are N-channel MOS transistors, and to have a higher voltage than the voltage of the first power source terminal when the first MOS transistor and the third MOS transistor are P-channel MOS transistors, wherein the first drain terminal is connected to the first power source terminal, the third source terminal is connected to the second power source terminal, and the first source terminal is connected to the third drain terminal; or wherein the third drain terminal is connected to the first power source terminal, the first source terminal is connected to the second power source terminal, and the first drain terminal is connected to the third source terminal.

According to another aspect of the present invention, there is provided a nonvolatile storage element including: a first MOS transistor including a first source terminal, a first drain terminal, and a first gate terminal, the first gate terminal being of one conductive type of P type or N type and being in a floating state; a second MOS transistor including a second gate terminal, a second source terminal, a second drain terminal, and a second bulk terminal, the second gate terminal being of an other conductive type of P type or N type, the second source terminal, the second drain terminal, and the second bulk terminal being connected to each other; a PN junction portion configured to form a PN junction between the first gate terminal and the second gate terminal; and a silicide formed on the PN junction portion.

According to still another aspect of the present invention, there is provided a reference voltage generation circuit including a plurality of the nonvolatile storage elements according to the above-mentioned aspect of the present invention, the plurality of the nonvolatile storage elements including at least a first nonvolatile storage element configured to serve as a depletion type MOS transistor and a second nonvolatile storage element configured to serve as an enhancement type MOS transistor, and the first nonvolatile storage element and the second nonvolatile storage element being connected in series between a first power source terminal and a second power source terminal.

BRIEF DESCRIPTION OF DRAWINGS

FIGS. 3A and 3B are diagrams for illustrating the states of electric charge injection and electric charge discharge in the nonvolatile storage element Ma according to the first embodiment of the invention;

FIGS. 8A and 8B are diagrams for illustrating the reference voltage generation circuit 1 according to the first embodiment of the invention, the diagrams being circuit structural diagrams of the nonvolatile storage element Ma represented by omitting a substrate potential (well potential) of the nonvolatile storage element Ma illustrated in FIG. 1, in which FIG. 8A is a diagram specifically representing the circuit structure of the nonvolatile storage element Ma, and FIG. 8B is a diagram simply representing the circuit structure of the nonvolatile storage element Ma;

DETAILED DESCRIPTION

The nonvolatile storage elements forming the reference voltage generation circuits disclosed in JP 2002-368107 A and JP 2013-246627 A are those using two layers of polysilicon, as used in so-called nonvolatile memories such as an EEPROM. Such nonvolatile storage elements using two layers of polysilicon require a complicated exclusive forming process, thus increasing manufacturing cost, and not being versatile for use.

It is an object of embodiments to provide a nonvolatile storage element capable of being formed by an ordinary CMOS process using single layer polysilicon without requiring exclusive forming process and a reference voltage generation circuit with high versatility and high precision.

[First Embodiment]

A reference voltage generation circuit according to a first embodiment of the present invention will be described with reference to FIG. 1 to FIG. 35.

Figure 1:
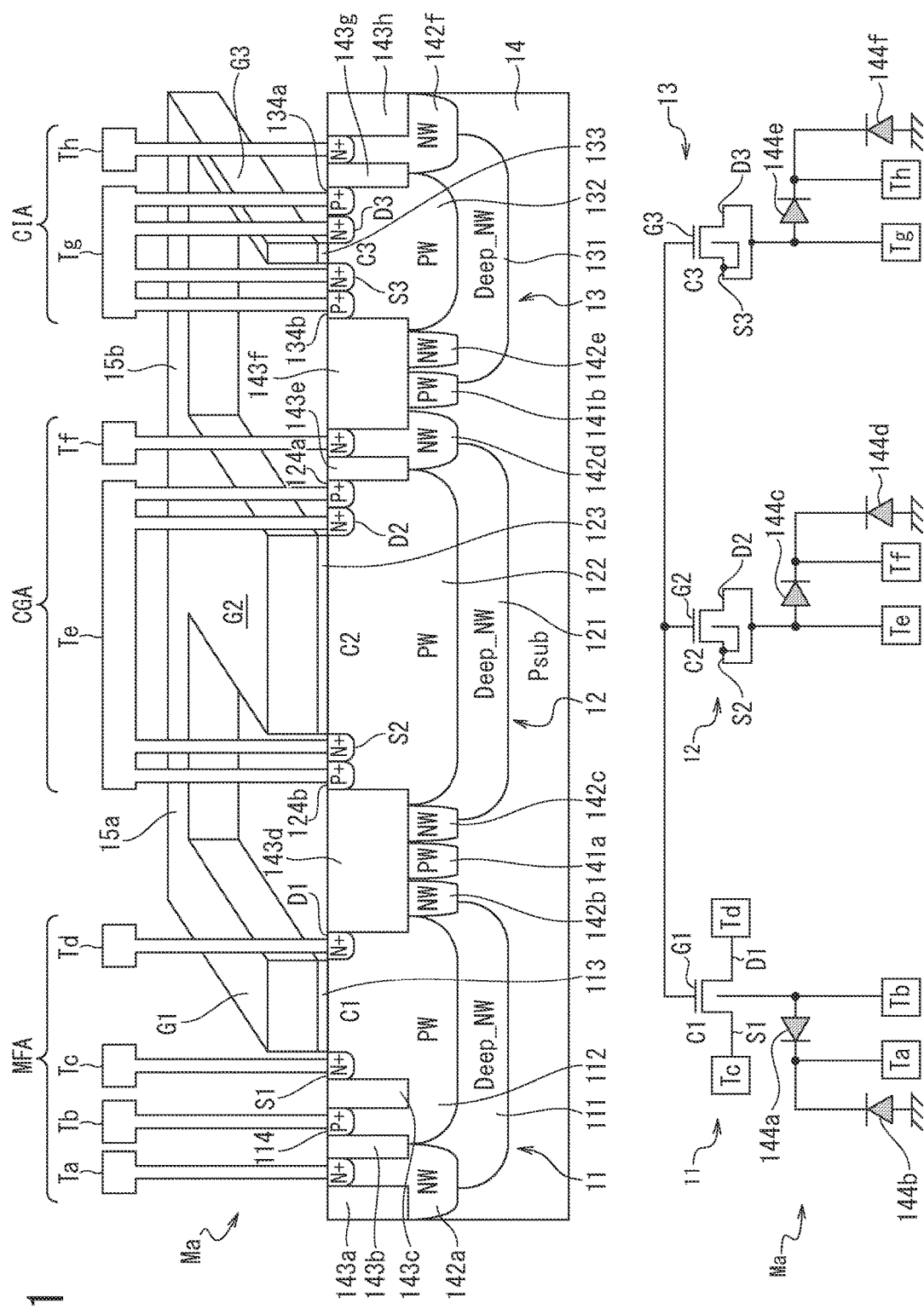
FIG. 1 is a cross-sectional view and a circuit structural diagram illustrating a schematic structure of a nonvolatile storage element Ma according to a first embodiment of the present invention.

The reference voltage generation circuit according to the present embodiment includes two or more nonvolatile storage elements formed by one layer of polysilicon (hereinafter referred to as "single layer polysilicon"). As illustrated in FIG. 1, a nonvolatile storage element Ma included in the reference voltage generation circuit according to the present embodiment includes for example, deep N-well regions 111, 121, and 131 formed on the P type semiconductor substrate 14, P-well regions 112, 122, 132, 141a, and 141b, N-well regions 142a, 142b, 142c, 142d, and 142e, element isolation regions 143a, 143b, 143c, 143d, 143e, 143f, 143g, and 143h, and floating gates G1, G2, and G3. The floating gates G1, G2, and G3 are formed of single layer polysilicon. The nonvolatile storage element Ma includes three or more areas.

A first area is a MOSFET area MFA. The MOSFET area MFA includes a MOS transistor 11 formed of a MOSFET. The MOS transistor 11 includes the floating gate G1 formed of polysilicon. The floating gate G1 is formed above the P-well region 112 via a gate insulating film 113 formed on a semiconductor substrate 14. The MOS transistor 11 includes a drain region D1 formed on one of both sides below the floating gate G1 via the gate insulating film 113 and a source region S1 formed on the other one of both sides below the floating gate G1. The drain region D1 is an N+ region formed inside the P-well region 112, and is connected to a terminal Td. The source region S1 is an N+ region formed inside the P-well region 112, and is connected to a terminal Tc. The P-well region 112 is connected to a terminal Tb via a P+ region 114 formed in a part of the P-well region 112. Additionally, the N-well region 142a formed on the semiconductor substrate 14 adjacently to the P-well region 112 is connected to a terminal Ta via an N+ region formed in a part of the N-well region 142a. The nonvolatile storage element Ma is element-isolated from other parts of the nonvolatile storage element Ma and other elements by the element isolation regions 143a to 143h. The floating gates G1, G2, and G3 are not directly connected to any electrode for electric contact therewith, and are, as the names suggest, in a floating state.

A second area is a control gate area CGA. The control gate area CGA includes a MOS transistor 12 formed of a MOSFET. The MOS transistor 12 includes the floating gate G2 formed of polysilicon. The floating gate G2 is formed above the P-well region 122 different from the P-well region 112 of the MOSFET area MFA via a gate insulating film 123. The gate insulating film 123 and the gate insulating film 113 of the MOSFET area MFA may be the same or different in kind and film thickness. The MOS transistor 12 in the control gate area CGA includes a drain region D2 formed on one of both sides below the floating gate G2 via the gate insulating film 123 and a source region S2 formed on the other one of both sides below the floating gate G2. The drain region D2 is an N+ region formed inside the P-well region 122. The source region S2 is an N+ region formed inside the P-well region 122. The drain region D2 is connected to a P+ region 124a that is formed inside the P-well region 122 and that is a contact portion of the P-well region 122. The source region S2 is connected to a P+ region 124b that is formed inside the P-well region 122 and that is a contact portion of the P-well region 122. The drain region D2, the source region S2, and the P+ regions 124a and 124b are connected to each other via a terminal Te. Additionally, the N-well region 142d formed on the semiconductor substrate 14 adjacently to the P-well region 122 is connected to a terminal Tf via an N+ region formed in a part of the N-well region 142d.

A third area is an electric charge injection area CIA. The electric charge injection area CIA includes a MOS transistor 13 formed of a MOSFET. The MOS transistor 13 includes the floating gate G3 formed of polysilicon. The floating gate G3 is formed above the P-well region 132 different from those of the MOSFET area MFA and the control gate area CGA via a gate insulating region 133. The gate insulating film 133 and at least one of the gate insulating film 113 of the MOSFET area MFA or the gate insulating film 123 of the control gate area CGA may be the same or different in kind and film thickness. The MOS transistor 13 in the electric charge injection area CIA includes a drain region D3 formed on one of both sides below the floating gate G3 via the gate insulating film 133 and a source region S3 formed on the other one of both sides below the floating gate G3. The drain region D3 is an N+ region formed inside the P-well region 132. The source region S3 is an N+ region formed inside the P-well region 132. In the electric charge injection area CIA, the drain region D3 is connected to a P+ region 134a that is formed inside the P-well region 132 and that is a contact portion of the P-well region 132, similarly to the control gate area CGA. The source region S3 is connected to a P+ region 134b that is formed inside the P-well region 132 and that is a contact portion of the P-well region 132. The drain region D3, the source region S3, and the P+ regions 134a and 134b are connected to each other via a terminal Tg. Additionally, the N-well region 142f formed on the semiconductor substrate 14 adjacently to the P-well region 132 is connected to a terminal Th via an N+ region formed in a part of the N-well region 142f.

The floating gate G1 used in the MOSFET area MFA, the floating gate G2 used in the control gate area CGA, and the floating gate G3 used in the electric charge injection area CIA are connected by the same polysilicon. A connection portion 15a connecting the floating gate G1 and the floating gate G2 across the MOSFET area MFA and the control gate area CGA is provided on the element isolation region 143d. A connection portion 15b connecting the floating gate G2 and the floating gate G3 across the control gate area CGA and the electric charge injection area CIA is provided on the element isolation region 143f. The floating gates G1, G2, and G3 and the connection portions 15a and 15b are formed of the same polysilicon.

In the MOSFET area MFA, a PN junction portion 144a is formed between the P-well region 112 and the deep N-well region 111, and a PN junction portion 144b is formed between the deep N-well region 111 and the semiconductor substrate 14. In the control gate area CGA, a PN junction portion 144c is formed between the P-well region 122 and the deep N-well region 121, and a PN junction portion 144d is formed between the deep N-well region 121 and the semiconductor substrate 14. In the electric charge injection area CIA, a PN junction portion 144e is formed between the P-well region 132 and the deep N-well region 131, and a PN junction portion 144f is formed between the deep N-well region 131 and the semiconductor substrate 14.

Roles of the respective areas MFA, CGA, and CIA are as follows: the MOSFET area MFA is an area configured to work as a MOSFET during operation of the reference voltage generation circuit; the control gate area CGA is an area configured to control potentials of the floating gate G1 of the MOSFET area MFA and the floating gate G3 of the electric charge injection area CIA; and the electric charge injection area CIA is an area configured to inject/discharge electric charge into/from the floating gate G3. In the respective areas MFA, CGA, and CIA, the gate insulating films 113, 123, and 133 are located between the floating gates G1, G2, and G3 and the semiconductor substrate 14, whereby electric charge injected into the floating gates G1, G2, and G3 are confined. Thus, depending on an amount of the electric charge confined in the floating gates G1, G2, and G3, the current/voltage characteristics of the MOS transistor 11 in the MOSFET area MFA become variable. In other words, a device formed by the structure as illustrated in FIG. 1 becomes a nonvolatile storage element. It should be noted that the control gate area CGA serves as a floating gate control terminal of the MOSFET area MFA and the electric charge injection area CIA. Due to this, an insulating film capacitance C2 of the control gate area CGA needs to be made sufficiently larger than an insulating film capacitance C1 of the MOSFET area MFA and an insulating film capacitance C3 of the electric charge injection area CIA.

The nonvolatile storage element Ma can be formed by a so-called ordinary CMOS process, without using any special process. Note that a predetermined level of voltage is set to be applied to the respective terminals Ta to Th of the nonvolatile storage element Ma.

Figure 2:
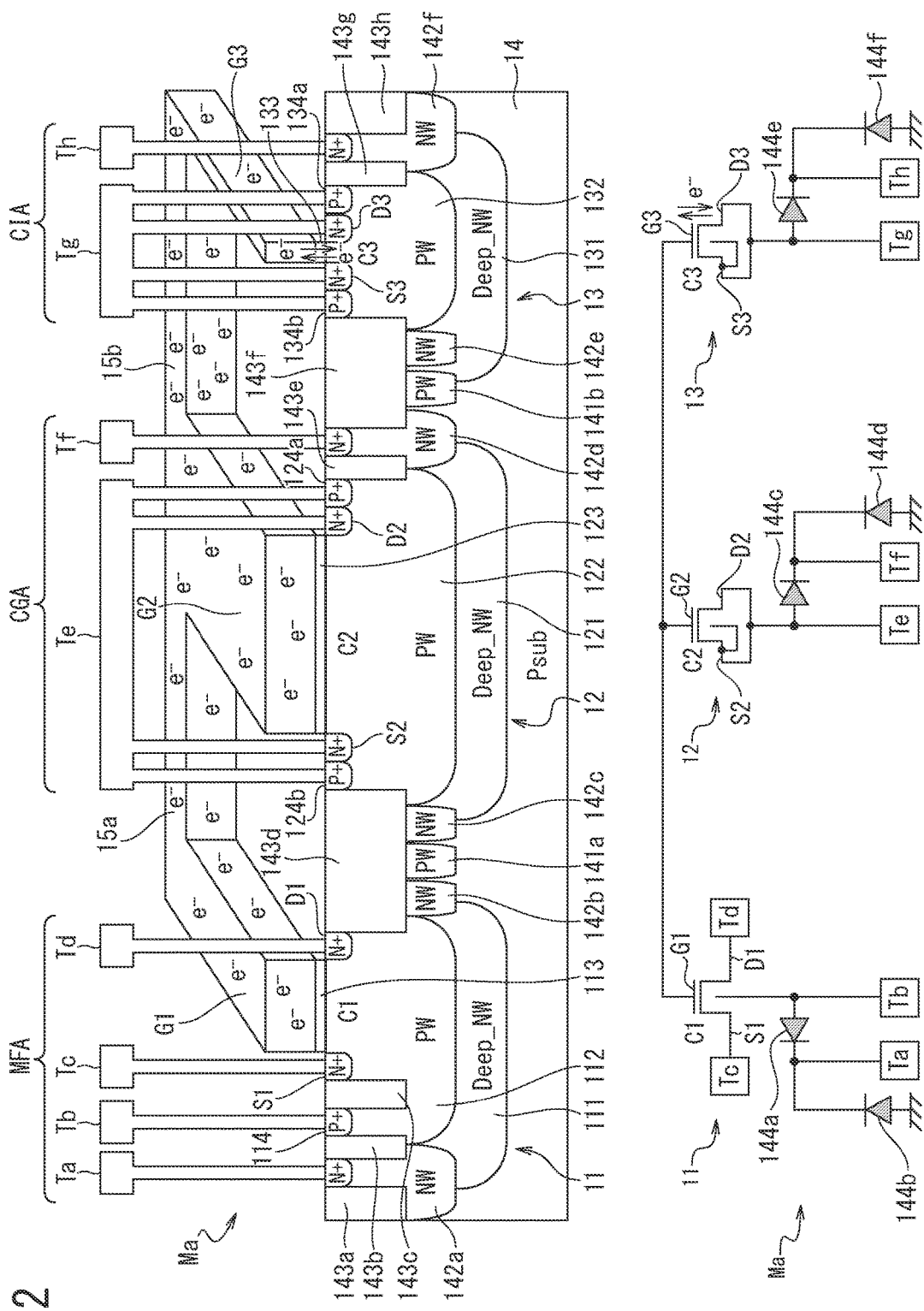
FIG. 2 is diagrams for illustrating states of electric charge injection and electric charge discharge in the nonvolatile storage element Ma according to the first embodiment of the invention.

The threshold voltage Vth of the MOS transistor 11 provided in the MOSFET area MFA of the nonvolatile storage element Ma is controlled by the amount of electric charge injected into the floating gate G1. As illustrated in FIG. 2, electrons e− are injected/discharged into/from the floating gates G1, G2, and G3 of the nonvolatile storage element Ma via the gate insulating film 133 of the electric charge injection area CIA.

As illustrated in FIG. 3A, when injecting the electrons e− into the floating gates G1, G2, and G3, for example, 0 V is applied from the terminals Tg and Th to fix the P-well region 132, the N-well regions 142e and 142f, and the deep N-well region 131 of the electric charge injection area CIA at 0 V. At this time, for example, a pulse voltage Vpp of +10 V or more is applied from the terminals Te and Tf to the P-well region 122, the N-well regions 142c and 142d, and the deep N-well region 121 of the control gate area CGA. Thereby, as indicated by an upward-pointing linear arrow in FIG. 3A, the electrons e− are injected into the floating gate G3 from an inversion layer formed immediately under the gate insulating film 133 through the gate insulating film 133 (see FIG. 2) of the electric charge injection area CIA; the electrons e− are injected into the floating gate G2 via the connection portion 15b; and the electrons e− are injected into the floating gate G1 via the connection portion 15a.

On the other hand, as illustrated in FIG. 3B, when discharging the electrons e− from the floating gates G1, G2, and G3, for example, 0 V is applied from the terminals Te and Tf to fix the P-well region 122, the N-well regions 142c and 142d, and the deep N-well region 121 of the control gate area CGA at 0 V. At this time, for example, a pulse voltage Vpp of +10 V or more is applied to the P-well region 132, the N-well regions 142e and 142f, and the deep N-well region 131 of the electric charge injection area CIA from the terminals Tg and Th. Thereby, as indicated by a downward-pointing linear arrow in FIG. 3B, the electrons e− are discharged from the floating gate G3 to the P-well region 132 side of the electric charge injection area CIA through the gate insulating film 133. At this time, the electrons e− existing in the floating gate G1 are discharged to the P-well region 132 side through the connection portions 15a and 15b, the floating gate G3, and the gate insulating film 133.

Additionally, at this time, the electrons e− existing in the floating gate G2 are discharged to the P-well region 132 side through the connection portion 15b, the floating gate G3, and the gate insulating film 133.

In this manner, the nonvolatile storage element Ma can inject/discharge electric charge via the gate insulating film 133 provided in the electric charge injection area CIA by controlling voltages to be applied to the terminals Te and Tf provided in the control gate area CGA and the respective terminals Tg and Th provided in the electric charge injection area CIA. Note that although the present example has described the example of injection/discharge of electric charge using the positive pulse voltage, both a positive pulse voltage and a negative pulse voltage may be used to control injection/discharge of electric charge into/from the floating gates G1, G2, and G3. The nonvolatile storage element Ma does not use the MOSFET area MFA for injecting/discharging electric charge.

Next will be a description of the reference voltage generation circuit using the nonvolatile storage element according to the present embodiment. The reference voltage generation circuit according to the present embodiment is a circuit configured to generate a reference voltage by using a plurality of single layer polysilicon type nonvolatile storage elements. The reference voltage generation circuit according to the present embodiment uses the nonvolatile storage elements by bringing into two states: enhancement type transistor(s) and depletion type transistor(s). The nonvolatile storage element(s) used as the enhancement type transistor (s) and the nonvolatile storage element (s) used as the depletion type transistor(s) are the same in size and structure as element.

The reference voltage generation circuit according to the present embodiment is a circuit configured to eliminate manufacturing variation that occurs due to difference between characteristics of the respective circuit elements forming the circuit. The reference voltage generation circuit according to the present embodiment includes at least one or more depletion type transistors and at least one or more enhancement type transistors to which a current that is the same as or relevant to a current that flows to the one or more depletion type transistors flows. The one or more depletion type transistors and the one or more enhancement type transistors forming the reference voltage generation circuit according to the present embodiment are single-layer polysilicon type nonvolatile storage elements. Herein, the term "relevant current" means a current correlated with the current that flows to the one or more depletion type transistors. For example, the "relevant current" may be a current that is "X" times the current that flows to the one or more depletion type transistors, a current obtained by adding a current value Y to the current that flows to the one or more depletion type transistors, or a current having a more complicated relationship with the current than the two examples. In other words, the "relevant current" is a current represented by a function using, as a parameter, a value of the current that flows to the one or more depletion type transistors.

Figure 4:
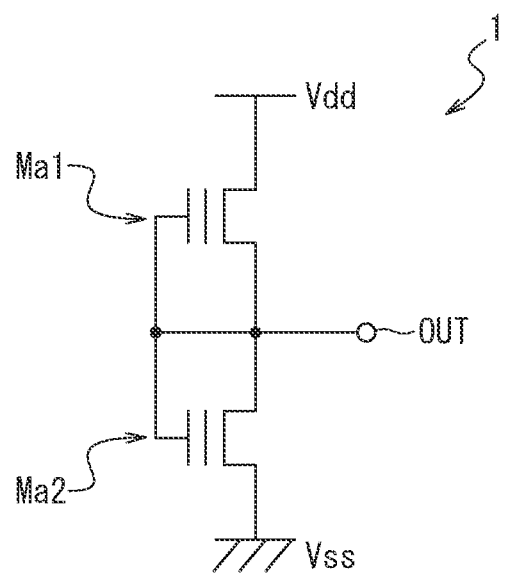
FIG. 4 is a diagram simply representing a circuit structure for illustrating a reference voltage generation circuit 1 according to the first embodiment of the invention.

As illustrated in FIG. 4, a reference voltage generation circuit 1 according to the present embodiment includes a plurality of (two in the present example) nonvolatile storage elements Ma1 and Ma2. The nonvolatile storage elements Ma1 and Ma2 are simply represented in FIG. 4, but actually have the structure illustrated in FIG. 1. When the reference voltage generation circuit 1 illustrated in FIG. 4 is represented by using the nonvolatile storage element Ma illustrated in FIG. 1, the circuit 1 can be represented as a structure illustrated in FIG. 5. A nonvolatile storage element Ma1 and a nonvolatile storage element Ma2, respectively, correspond to the nonvolatile storage element Ma illustrated in FIG. 1. At least some (all in the present example) of the plurality of nonvolatile storage elements Ma1 and Ma2 are connected in series. To a connection portion between the plurality of nonvolatile storage elements Ma1 and Ma2 connected in series is connected a voltage output terminal OUT from which a reference voltage Vref is output. The nonvolatile storage element Ma1 and the nonvolatile storage element Ma2 are driven by the MOS transistor 11 of the MOSFET area MFA during circuit operation, and thus both operate as transistors.

The nonvolatile storage element Ma1 and the nonvolatile storage element Ma2 are connected in series between a high voltage supply terminal Vdd to which high voltage is supplied and a low voltage supply terminal Vss to which low voltage is supplied. Hereinafter, the sign "Vdd" is also used as the sign of a high voltage output from the high voltage supply terminal Vdd, and the sign "Vss" is also used as the sign of a low voltage output from the low voltage supply terminal Vss. The drain region D1 of the nonvolatile storage element Ma1 is connected to the high voltage supply terminal Vdd via the terminal Td, and the source region S1 of the nonvolatile storage element Ma2 is connected to the low voltage supply terminal Vss via the terminal Tc. The source region S1 of the nonvolatile storage element Ma1 and the source region S2, the drain region D2, and the P+ regions 124a and 124b (see FIG. 1) of the nonvolatile storage element Ma1 are connected to each other via the terminal Tc and the terminal Te. Additionally, the drain region D1 of the nonvolatile storage element Ma2 and the source region S2, the drain region D2, and the P+ regions 124a and 124b (see FIG. 1) of the nonvolatile storage element Ma2 are connected to each other via the terminal Td and the terminal Te.

Furthermore, the source region S1, the source region S2, the drain region D2, and the P+ regions 124a and 124b of the nonvolatile storage element Ma1 are connected to the drain region D1, the source region S2, the drain region D2, and the P+ regions 124a and 124b of the nonvolatile storage element Ma2 via the terminals Tc and Te of the nonvolatile storage element Ma1 and the terminals Td and Te of the nonvolatile storage element Ma2.

Figure 5:
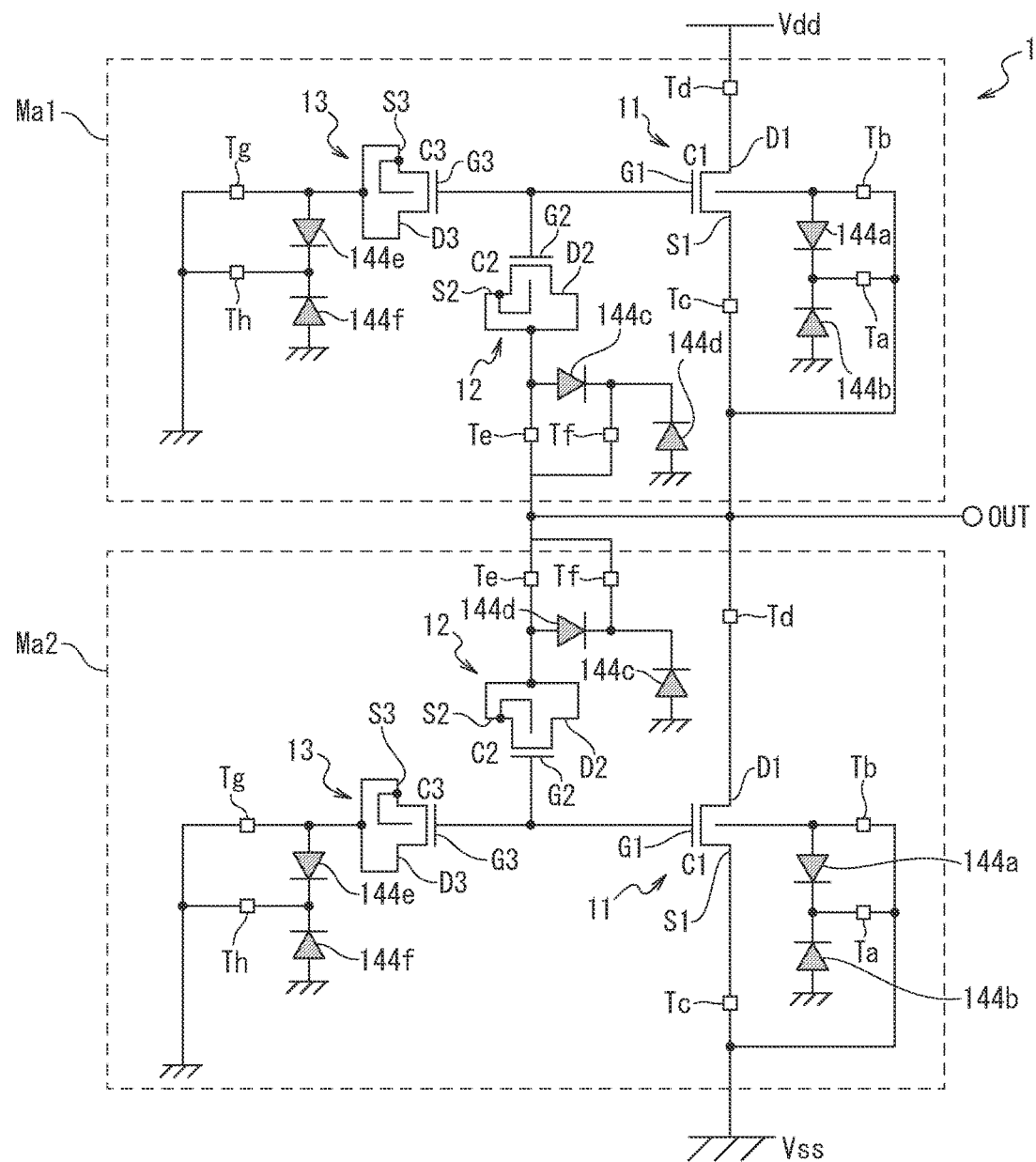
FIG. 5 is a diagram specifically representing a circuit structure for illustrating the reference voltage generation circuit 1 according to the first embodiment of the invention.

Still furthermore, the voltage output terminal OUT is connected to a connection portion between the source region S1 of the nonvolatile storage element Ma1 and the drain region D1 of the nonvolatile storage element Ma2. In FIG. 5, the terminals Ta to Tf are illustrated in such a manner as to provide a clear comparison with FIG. 1. However, in the reference voltage generation circuit 1, the respective regions such as the source regions, the drain regions, and the floating gates provided in each of the nonvolatile storage element Ma1 and the nonvolatile storage element Ma2 may obviously be connected not via the terminals but directly by predetermined electrode plugs or wiring.

In the reference voltage generation circuit 1, the nonvolatile storage element Ma2 on a lower stage side (a low voltage supply terminal Vss side) is adjusted into an enhancement state, and the nonvolatile storage element Ma1 on an upper stage side (a high voltage supply terminal Vdd side) is adjusted into a depletion state. The nonvolatile storage elements Ma1 and Ma2 both include a control gate (for example, the P-well region 122 of the control gate area CGA) and floating gates (for example, the floating gates G1, G2, and G3 of the respective areas). Thereby, the nonvolatile storage elements Ma1 and Ma2 can perform writing and erasing, and can hold a rewritten state for a long period. The threshold voltage of a depletion type transistor becomes negative, whereas the threshold voltage of an enhancement type transistor becomes positive. Thus, the plurality of nonvolatile storage elements provided in the reference voltage generation circuit 1 of the present embodiment include at least the nonvolatile storage element Ma1 having a negative threshold voltage and the nonvolatile storage element Ma2 having a positive threshold voltage.

An element area of each of the nonvolatile storage elements Ma1 and Ma2 provided in the reference voltage generation circuit 1 may be from 1000 $\mu m^2$ to 1 $mm^2$. The nonvolatile storage elements Ma1 and Ma2 do not have any array structure, even when having any such element area. Note that, although the present example uses signs of MOS transistors in FIGS. 1, 2, 3, and 5 as signs representing the control gate area and the electric charge injection area, the control gate area and the electric charge injection area are not areas in which the current (the source-drain current) as the MOS transistors is caused to flow, and thus do not necessarily have to be of any transistor structure. For example, the areas may be of a MOS capacitor structure.

Constituent elements of the reference voltage generation circuit 1 can be made to correspond as follows.

The MOS transistor 11 of the nonvolatile storage element Ma1 corresponds to one example of a first MOS transistor. The source region S1 of the MOS transistor 11 of the nonvolatile storage element Ma1 corresponds to one example of a first source terminal. The drain region D1 of the MOS transistor 11 of the nonvolatile storage element Ma1 corresponds to one example of a first drain terminal. The floating gate G1 of the MOS transistor 11 of the nonvolatile storage element Ma1 corresponds to one example of a first gate terminal.

The MOS transistor 12 of the nonvolatile storage element Ma1 corresponds to one example of a second MOS transistor. The source region S2 of the MOS transistor 12 of the nonvolatile storage element Ma1 corresponds to one example of a second source terminal. The drain region D2 of the MOS transistor 12 of the nonvolatile storage element Ma1 corresponds to one example of a second drain terminal. The floating gate G2 of the MOS transistor 12 of the nonvolatile storage element Ma1 corresponds to one example of a second gate terminal. The P-well region 122 of the nonvolatile storage element Ma1 corresponds to one example of a second bulk terminal.

The MOS transistor 11 of the nonvolatile storage element Ma2 corresponds to one example of a third MOS transistor. The source region S1 of the MOS transistor 11 of the nonvolatile storage element Ma2 corresponds to one example of a third source terminal. The drain region D1 of the MOS transistor 11 of the nonvolatile storage element Ma2 corresponds to one example of a third drain terminal. The floating gate G1 of the MOS transistor 11 of the nonvolatile storage element Ma2 corresponds to one example of a third gate terminal.

The MOS transistor 12 of the nonvolatile storage element Ma2 corresponds to one example of a fourth MOS transistor. The source region S2 of the MOS transistor 12 of the nonvolatile storage element Ma2 corresponds to one example of a fourth source terminal. The drain region D2 of the MOS transistor 12 of the nonvolatile storage element Ma2 corresponds to one example of a fourth drain terminal. The floating gate G2 of the MOS transistor 12 of the nonvolatile storage element Ma2 corresponds to one example of a fourth gate terminal. The P-well region 122 of the nonvolatile storage element Ma2 corresponds to one example of a fourth bulk terminal.

In the reference voltage generation circuit 1, the MOS transistors 11 of the nonvolatile storage elements Ma1 and Ma2 are N-channel MOS transistors, and the low voltage supply terminal Vss has a lower voltage than the voltage of the high voltage supply terminal Vdd. Thus, in the reference voltage generation circuit 1, the high voltage supply terminal Vdd corresponds to one example of a first power source terminal, and the low voltage supply terminal Vss corresponds to one example of a second power source terminal. Furthermore, in the reference voltage generation circuit 1, the drain region D1 of the MOS transistor 11 of the nonvolatile storage element Ma1 is connected to the high voltage supply terminal Vdd via the terminal Td, and the source region S1 of the MOS transistor 11 of the nonvolatile storage element Ma2 is connected to the low voltage supply terminal Vss via the terminal Tc. The source region S1 of the MOS transistor 11 of the nonvolatile storage element Ma1 is connected to the drain region D1 of the MOS transistor 11 of the nonvolatile storage element Ma2 via the terminals Tc and Td.

As will be described below, there are two adjustment methods to adjust the nonvolatile storage elements Ma1 and Ma2 of the reference voltage generation circuit 1 illustrated in FIG. 5 to bring into an enhancement state and a depletion state.

Figure 6A:
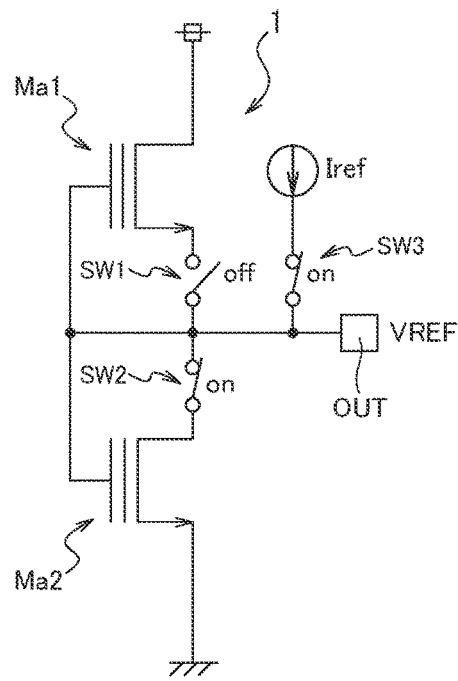
FIGS. 6A and 6B are diagrams for illustrating the reference voltage generation circuit 1 according to the first embodiment of the invention, the diagrams illustrating a first adjustment method for adjusting nonvolatile storage elements Ma1 and Ma2 of the reference voltage generation circuit 1 to bring into an enhancement state and a depletion state.
Figure 6B:
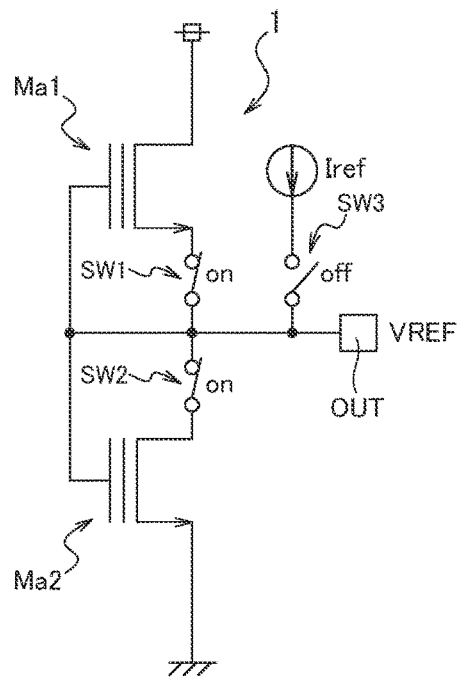

FIGS. 6A and 6B are diagrams for illustrating a first adjustment method for adjusting the nonvolatile storage elements Ma1 and Ma2 of the reference voltage generation circuit 1 to bring into an enhancement state and a depletion state. As illustrated in FIGS. 6A and 6B, there are provided a switch SW1 and a switch SW2 connected in series between the nonvolatile storage element Ma1 and the nonvolatile storage element Ma2, and a switch SW3 between a connection portion between the switch SW1 and the switch SW2 (in other words, the voltage output terminal OUT) and an external current source.

First, as illustrated in FIG. 6A, the switch SW1 is turned OFF (an open state), whereas the switch SW2 and the switch SW3 are turned ON (closed states). In this state, an adjustment current Iref is input from outside to the nonvolatile storage element Ma2 on the lower side via the switch SW3 to bring the nonvolatile storage element Ma2 into an enhancement state, thereby adjusting so that a desired reference voltage VREF is output from the voltage output terminal OUT. After that, as illustrated in FIG. 6B, the switch SW3 is turned OFF to stop the adjustment current Iref from outside, and the switch SW1 and the switch SW2 are turned ON to bring the nonvolatile storage element Ma1 on the upper side into a depletion state, thereby adjusting so that a current that flows to the nonvolatile storage element Ma1 becomes the same as the adjustment current Iref from outside. The adjustment is made so that the desired reference voltage VREF is output, while monitoring voltage output from the voltage output terminal OUT.

Figure 7A:
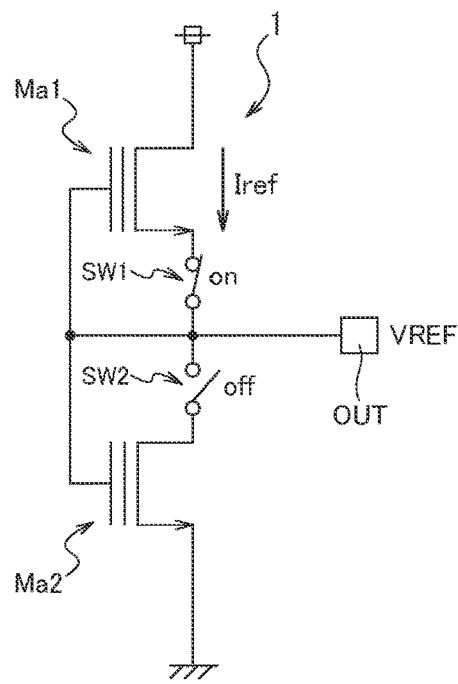
FIGS. 7A and 7B are diagrams for illustrating the reference voltage generation circuit 1 according to the first embodiment of the invention, the diagrams illustrating a second adjustment method for adjusting the nonvolatile storage elements Ma1 and Ma2 of the reference voltage generation circuit 1 to bring into an enhancement state and a depletion state.
Figure 7B:
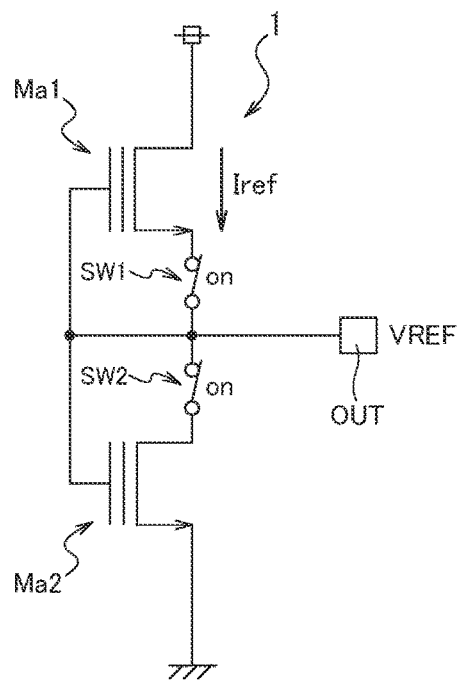

FIGS. 7A and 7B are diagrams for illustrating a second adjustment method for adjusting the nonvolatile storage elements Ma1 and Ma2 of the reference voltage generation circuit 1 to bring into an enhancement state and a depletion state. As illustrated in FIGS. 7A and 7B, there are provided the switches SW1 and SW2 connected in series between the nonvolatile storage element Ma1 and the nonvolatile storage element Ma2.

First, as illustrated in FIG. 7A, the switch SW1 is turned ON (a closed state), whereas the switch SW2 is turned OFF (an open state). In this state, the nonvolatile storage element Ma1 on the upper side is brought into a depletion state, thereby adjusting so that the adjustment current Iref that flows to the nonvolatile storage element Ma1 has a desired value. After that, as illustrated in FIG. 7B, the switches SW1 and SW2 are both turned ON (closed states) to bring the nonvolatile storage element Ma2 on the lower side into an enhancement state, thereby adjusting so that a desired reference voltage VREF is output from the voltage output terminal OUT. The adjustment is made so that the desired reference voltage VREF is output, while monitoring voltage output from the voltage output terminal OUT.

EXAMPLE 1

Figure 8A:
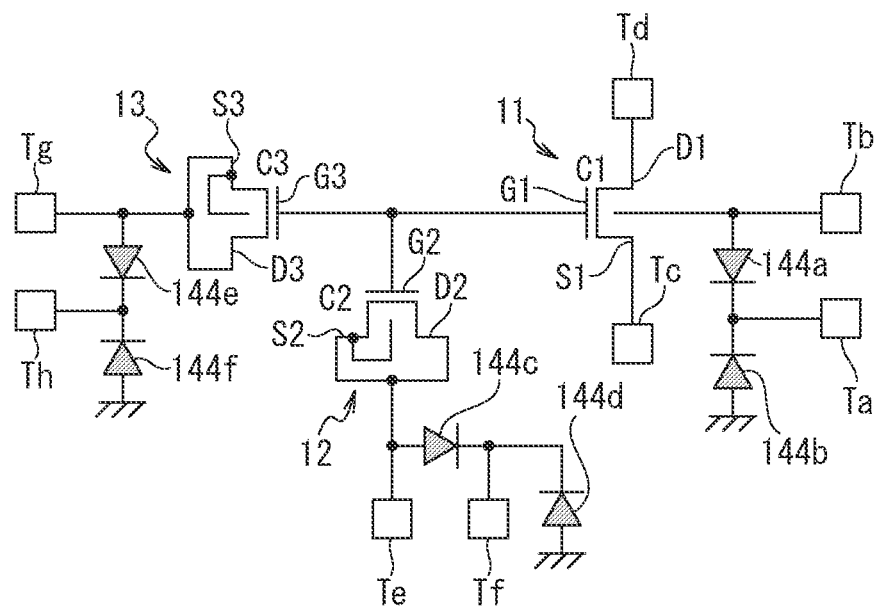
Figure 8B:
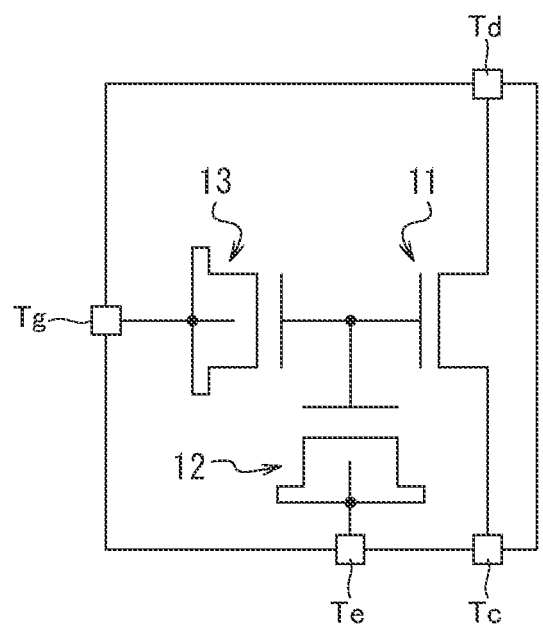

FIGS. 8A and 8B are diagrams for illustrating the nonvolatile storage element Ma represented by omitting a substrate potential (a well potential) of the nonvolatile storage element Ma illustrated in FIG. 1. The well potential in FIG. 1, that is, the terminals Ta, Tf, and Th each are at a potential of the N-well regions 142a, 142d, and 142f. The well potential may be set to a potential such that forward current does not flow through the PN junction portions 144a to 144f represented by diodes in FIG. 8A, and therefore description thereof will be omitted in the description below. FIG. 8B illustrates the nonvolatile storage element Ma represented by omitting the PN junction portions 144a to 144f.

Figure 9:
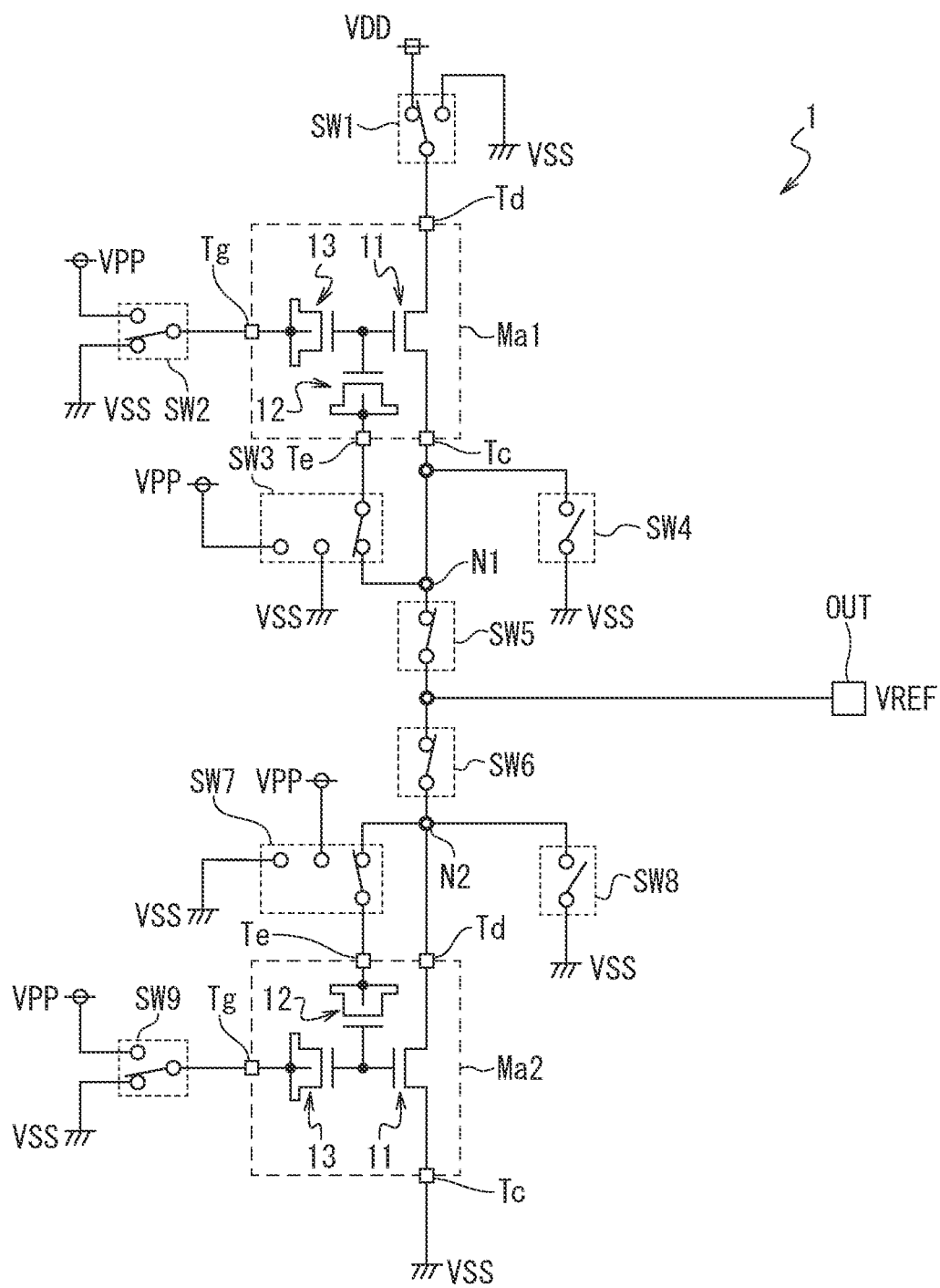
FIG. 9 is a structural diagram illustrating an actual circuit example of the reference voltage generation circuit 1 according to the first embodiment of the invention.

FIG. 9 is a structural diagram illustrating an actual circuit example of the reference voltage generation circuit 1 according to the present embodiment.

States of the switches SW1 to SW9 in a state where the reference voltage generation circuit 1 illustrated in FIG. 9 outputs a reference voltage VREF from the voltage output terminal OUT are as follows:
SW1: VDD
SW2: VSS
SW3: ON-state (connected to a connection node N1 between one terminal of the switch SW5 and the terminal Tc)
SW4: OFF-state (open)
SW5: ON-state (connected)
SW6: ON-state (connected)
SW7: ON-state (connected to a connection node N2 between one terminal of the switch SW6 and the terminal Td)
SW8: OFF-state (open)
SW9: VSS When the nonvolatile storage element Ma1 is in a depletion state and the nonvolatile storage element Ma2 is in an enhancement state in the state illustrated in FIG. 9, the reference voltage VREF is generated. In other words, the reference voltage generation circuit 1 according to the present embodiment includes switch portions configured to set each terminal of the MOS transistors 11, 12, and 13 of the nonvolatile storage element Ma1 and the MOS transistors 11, 12, and 13 of the nonvolatile storage element Ma2 to a desired potential.

An adjustment sequence by the first adjustment method illustrated in FIGS. 6A and 6B described above is as described in <Adjustment Sequence (1)> to <Adjustment Sequence (4)> illustrated in FIG. 10 to FIG. 21. Note that, in the present example, rewriting for transitioning the threshold voltage of each nonvolatile storage element to a minus direction is referred to as "writing", and rewriting for transitioning the threshold voltage thereof to a plus direction is referred to as "erasing".

<Adjustment Sequence (1)>

Figure 10:
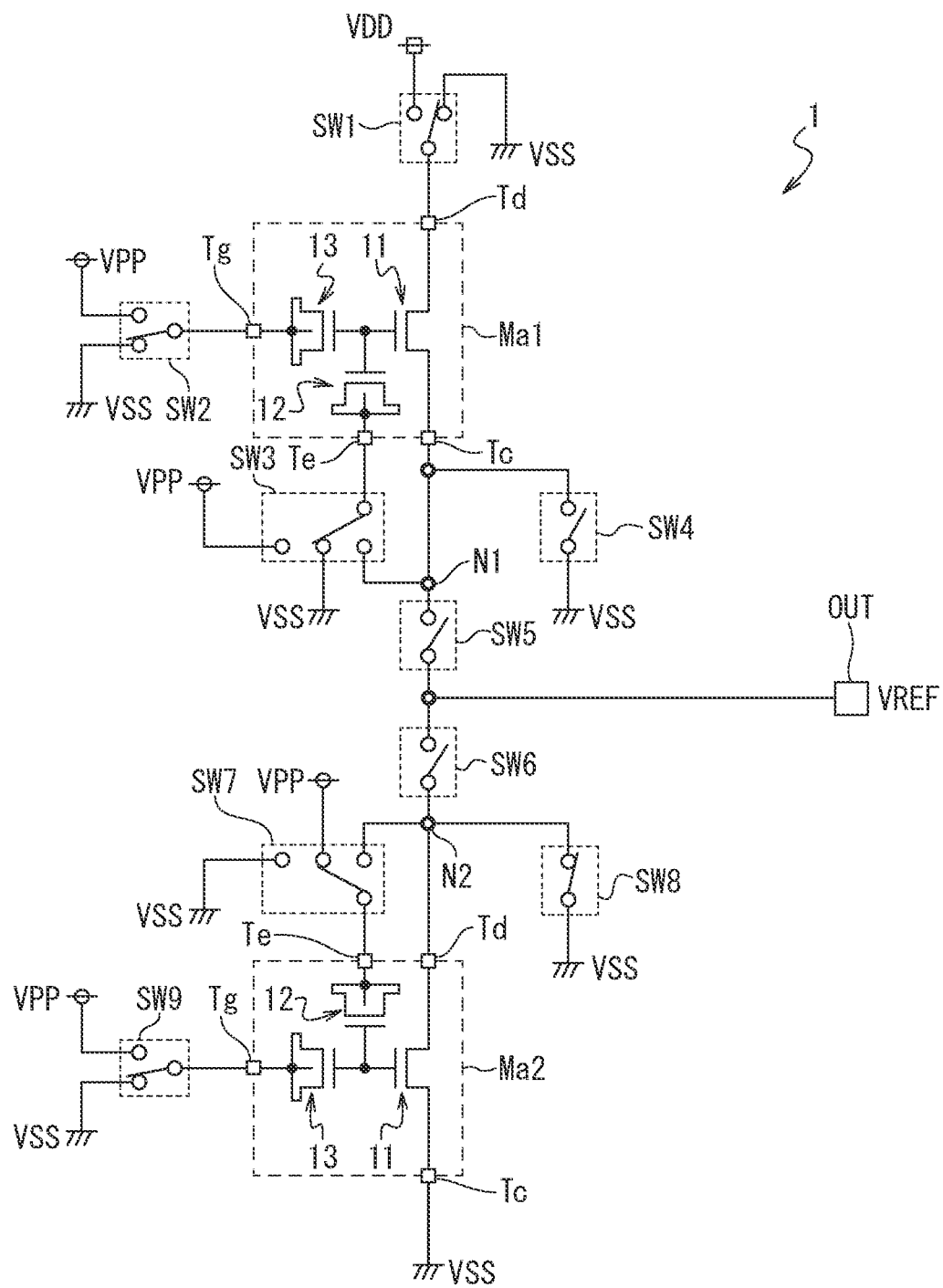
FIG. 10 is a diagram illustrating a state where the nonvolatile storage element Ma2 is caused to transition into an enhancement state in the actual circuit example of the reference voltage generation circuit 1 according to the first embodiment of the invention illustrated in FIG. 9.

FIG. 10 is a diagram illustrating a state where the nonvolatile storage element Ma2 is caused to transition into an enhancement state in the actual circuit example of the reference voltage generation circuit 1 according to the present embodiment illustrated in FIG. 9.

Figure 11:
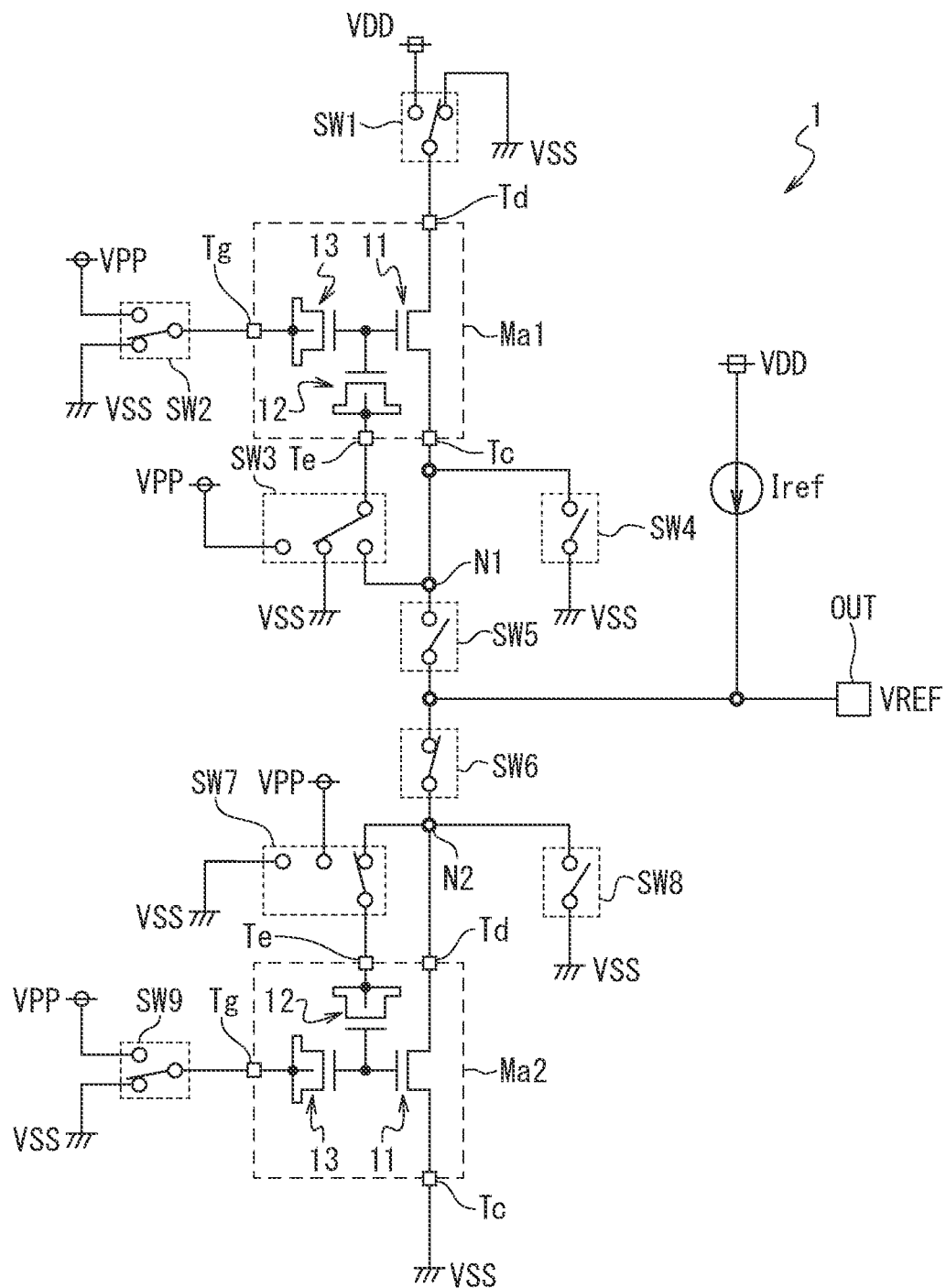
FIG. 11 is a diagram illustrating a state where a reference voltage VREF is confirmed in the actual circuit example of the reference voltage generation circuit 1 according to the first embodiment of the invention illustrated in FIG. 9.
Figure 12:
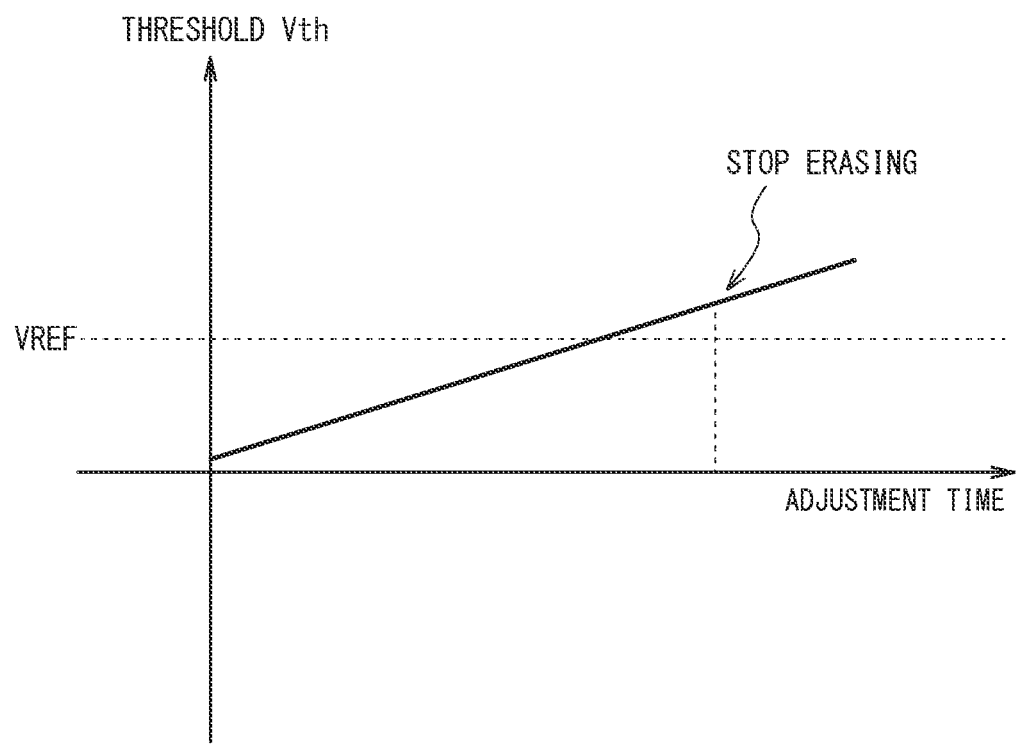
FIG. 12 is a diagram illustrating a relationship of a threshold voltage of the nonvolatile storage element Ma2 to erasing time in the state of the reference voltage generation circuit 1 illustrated in FIG. 10.

The nonvolatile storage element Ma2 is brought into an enhancement state (the threshold value is set to be larger than a desired reference voltage VREF). The states of the switches SW1 to SW9 in the state of transition to the enhancement direction (in other words, the state where the threshold value is adjusted to the plus direction) are as follows:
SW1: VSS
SW2: VSS
SW3: VSS
SW4: Optional (OFF-state (open) in FIG. 10)
SW5: OFF-state (open)
SW6: OFF-state (open)
SW7: VPP
SW8: ON-state (connected)
SW9: VSS FIG. 11 is a diagram illustrating a state where a reference voltage VREF is confirmed in the actual circuit example of the reference voltage generation circuit 1 according to the present embodiment illustrated in FIG. 9. The states of the switches SW1 to SW9 in the confirmation state are as follows:
SW1: VSS
SW2: VSS
SW3: VSS
SW4: Optional (OFF-state (open) in FIG. 11)
SW5: OFF-state (open)
SW6: ON-state (connected)
SW7: ON-state (connected to N2)
SW8: OFF-state (open)
SW9: VSS FIG. 12 is a diagram illustrating a relationship of a threshold voltage of the nonvolatile storage element Ma2 to erasing time in FIG. 10. The horizontal axis represents adjustment time, and the vertical axis represents the threshold voltage of the nonvolatile storage element Ma2. As in FIG. 12, the threshold voltage of the nonvolatile storage element Ma2 changes with time and gradually increases in the state of FIG. 10 described above. By optionally adjusting the erasing time, a threshold voltage Vth of the nonvolatile storage element Ma2 is set to a value larger than the desired reference voltage VREF. As illustrated in FIG. 11, to confirm the threshold voltage Vth, an adjustment current Iref is input from outside, and a reference voltage VREF output from the voltage output terminal OUT is monitored.

<Adjustment Sequence (2)>

Figure 13:
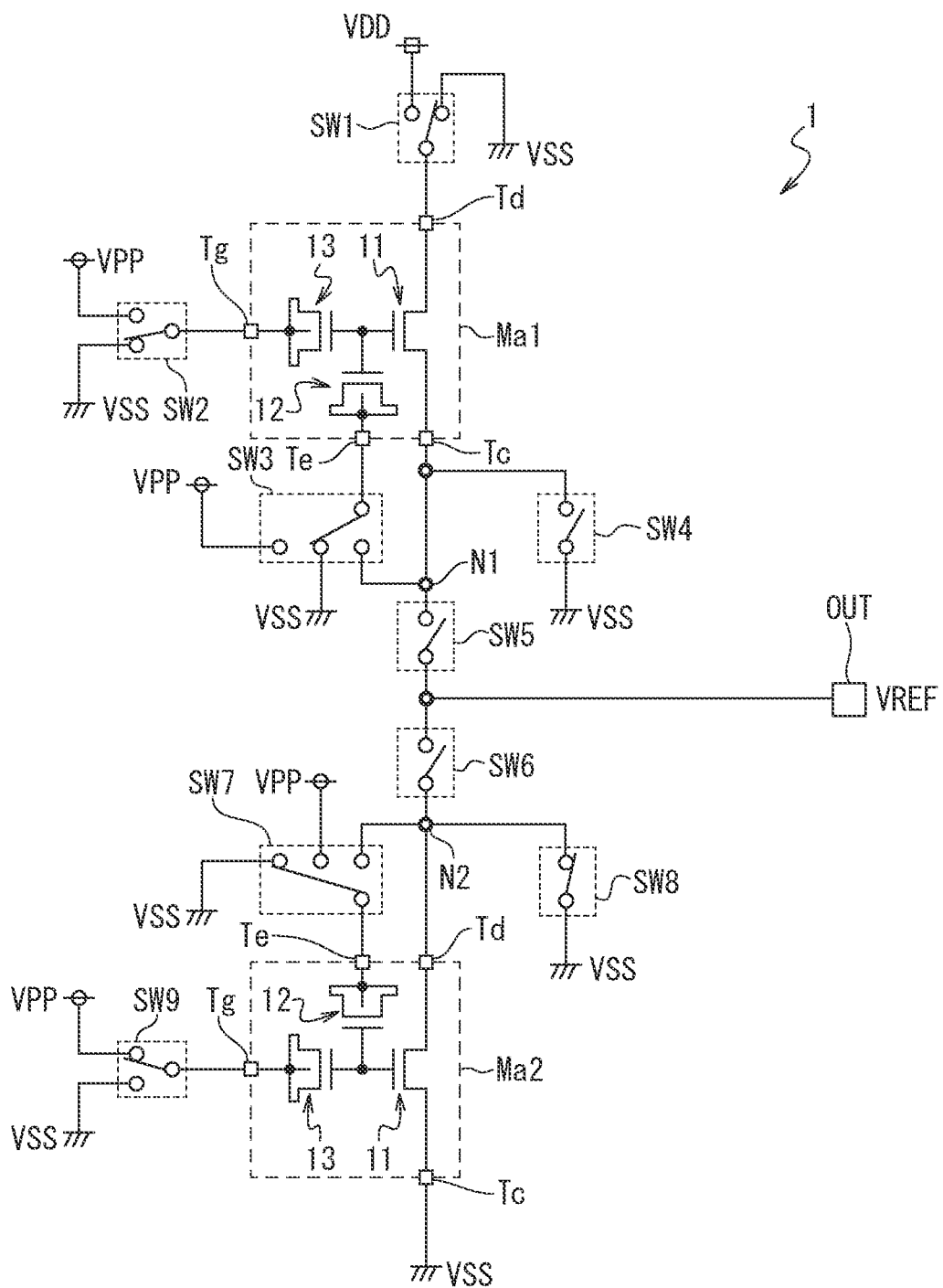
FIG. 13 is a diagram illustrating a state where the nonvolatile storage element Ma2 is caused to transition into a desired enhancement state (a state where the threshold voltage of the nonvolatile storage element Ma2 is adjusted to a minus direction) in the actual circuit example of the reference voltage generation circuit 1 according to the first embodiment of the invention illustrated in FIG. 9.

FIG. 13 is a diagram illustrating a state where the nonvolatile storage element Ma2 is caused to transition into a desired enhancement state in the actual circuit example of the reference voltage generation circuit 1 according to the present embodiment illustrated in FIG. 9 (a state where the threshold voltage of the nonvolatile storage element Ma2 is adjusted to the minus direction).

Figure 14:
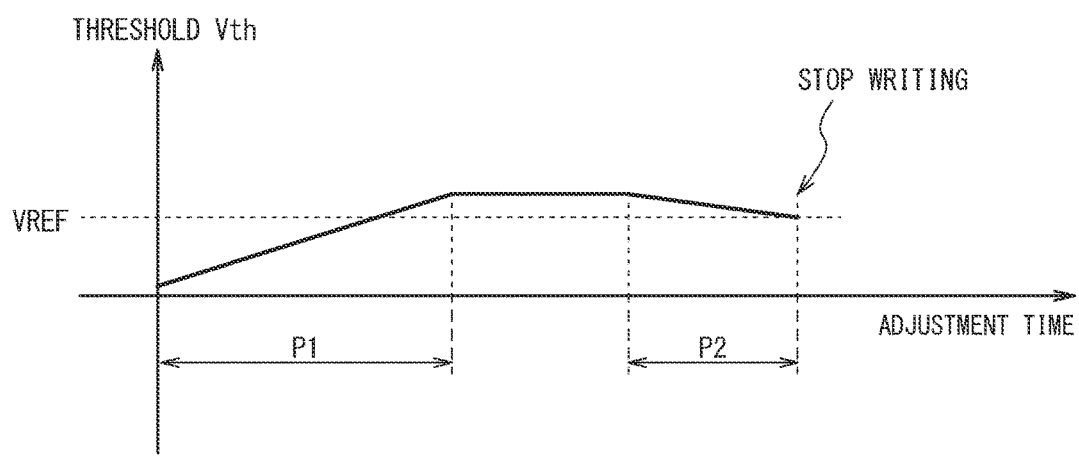
FIG. 14 is a diagram illustrating a relationship of the threshold voltage of the nonvolatile storage element Ma2 to writing time in the state of the reference voltage generation circuit 1 illustrated in FIG. 13.

The nonvolatile storage element Ma2 is caused to transition to a depletion direction (in other words, the threshold voltage is adjusted to the minus direction) to gradually reduce the threshold voltage, and the nonvolatile storage element Ma2 is brought into the desired enhancement state (the threshold voltage is made equal to the desired reference voltage VREF), thereby adjusting so that the desired reference voltage VREF is output. As in FIG. 11, the adjustment is made by inputting the adjustment current Iref from outside and confirming while monitoring the reference voltage VREF output from the voltage output terminal OUT. When the reference voltage VREF is excessively reduced from the desired voltage, the <Adjustment Sequence (1)> is again performed. The states of the switches SW1 to SW9 in the state where the transition to the depletion direction is performed (the state where the threshold voltage is adjusted to the minus direction) are as follows:
SW1: VSS
SW2: VSS
SW3: VSS
SW4: Optional (OFF-state (open) in FIG. 13)
SW5: OFF-state (open)
SW6: OFF-state (open)
SW7: VSS
SW8: ON-state (connected)
SW9: VPP FIG. 14 is a diagram illustrating a relationship of the threshold voltage of the nonvolatile storage element Ma2 to writing time in FIG. 13. The horizontal axis represents adjustment time, and the vertical axis represents threshold voltage. As indicated by a period P2 in FIG. 14, in the state of FIG. 13, the threshold value Vth of the nonvolatile storage element Ma2 changes with time and gradually reduces. By optionally adjusting the writing time, the threshold voltage p Vth of the nonvolatile storage element Ma2 is set to a desired value of the reference voltage VREF. Note that a period P1 depicted in FIG. 14 represents a period of rewriting in which the threshold voltage of the nonvolatile storage element Ma2 in the state of FIG. 11 is caused to transition to the plus direction.

Figure 15:
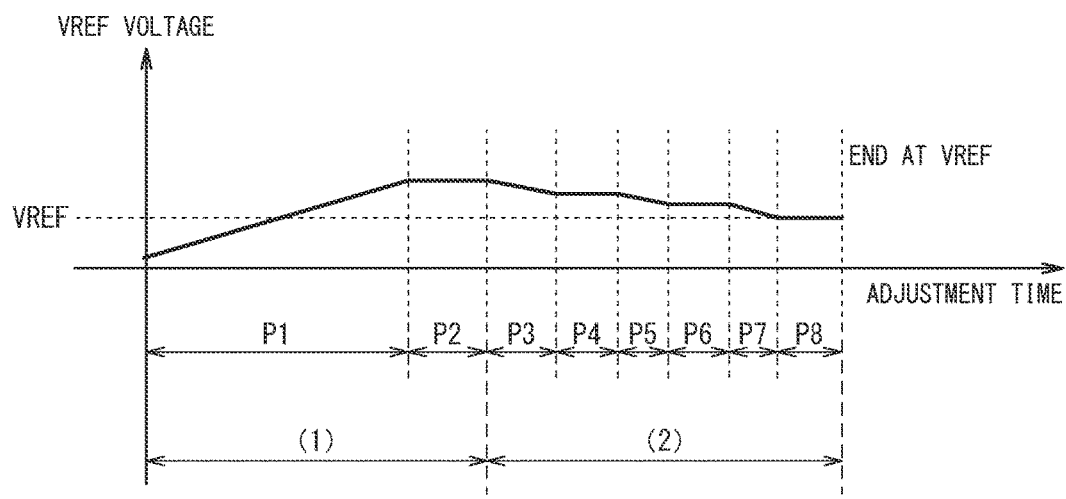
FIG. 15 is a diagram illustrating a state of transition of the reference voltage VREF with respect to adjustment time for adjusting the state of the nonvolatile storage element Ma2.

FIG. 15 is a diagram illustrating a state of transition of the reference voltage VREF with respect to adjustment time. The horizontal axis represents adjustment time, and the vertical axis represents threshold voltage. FIG. 15 illustrates the state of transition of the reference voltage VREF in the above-described <Adjustment Sequence (1)> and <Adjustment Sequence (2)>. As illustrated in FIG. 15, in a period P1, the nonvolatile storage element Ma2 is caused to transition to an enhancement direction to make the threshold voltage Vth larger than the desired reference voltage VREF. Next, in periods P2 to P8, the transition of the nonvolatile storage element Ma2 to a depletion direction (in other words, the state where the threshold voltage Vth is adjusted to the minus direction) and the monitoring of the value of the reference voltage VREF output from the voltage output terminal OUT (in other words, the state where the adjustment current Iref is input from outside) are repeated. In FIG. 15, the periods P2, P4, P6, and P8 are periods in which the value of the reference voltage VREF is monitored. The periods P3, P5, and P7 are periods in which the nonvolatile storage element Ma2 is caused to transition to the depletion direction. In the period P8, when the value of the reference voltage VREF output from the voltage output terminal OUT becomes a desired value, the adjustment of the reference voltage VREF made by using the adjustment current Iref from outside is ended.

<Adjustment Sequence (3)>

Figure 16:
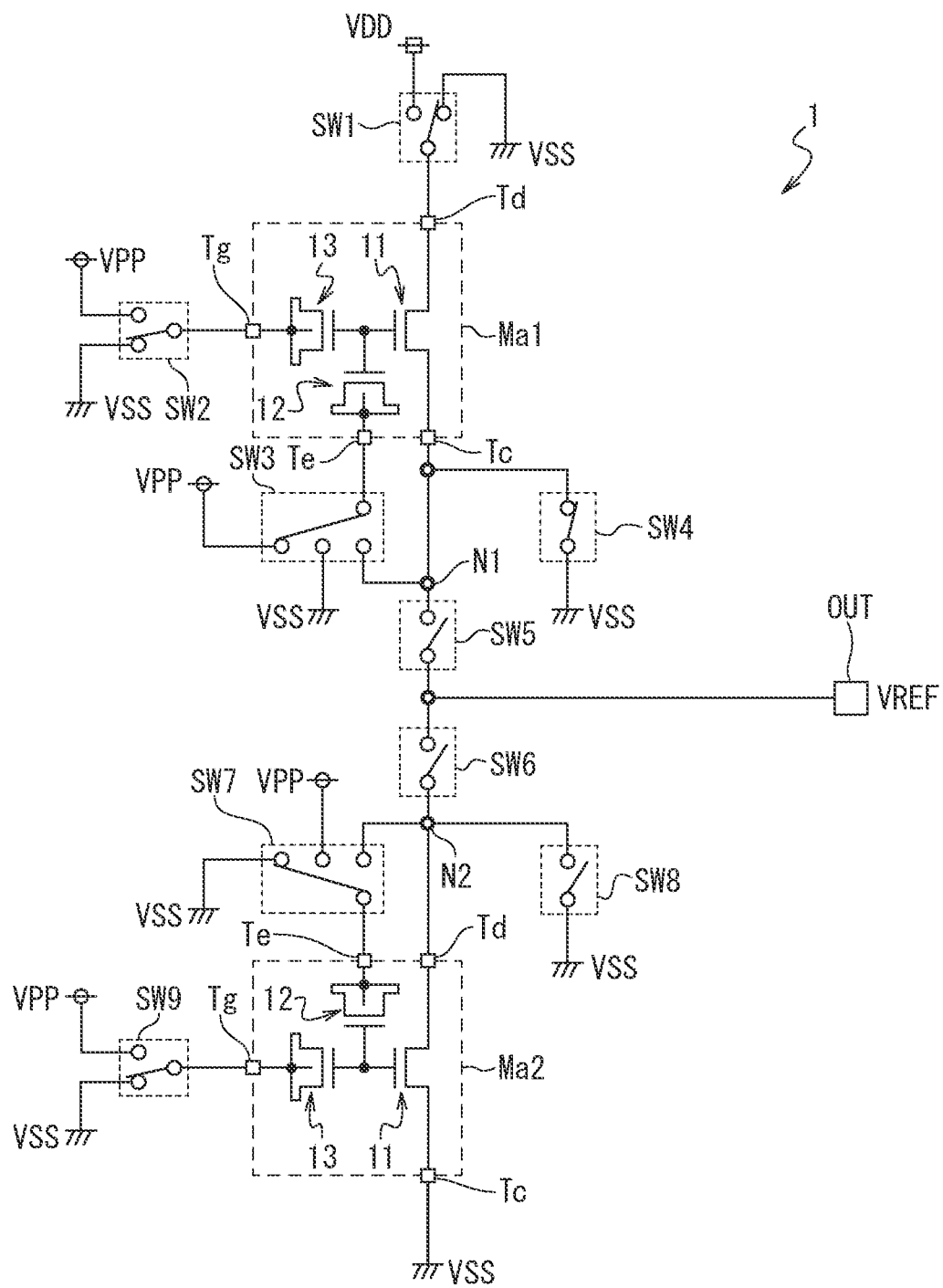
FIG. 16 is a diagram illustrating a state where the nonvolatile storage element Ma1 is caused to transition into an enhancement state in the actual circuit example of the reference voltage generation circuit 1 according to the first embodiment of the invention illustrated in FIG. 9.

FIG. 16 is a diagram illustrating a state where the nonvolatile storage element Ma1 is caused to transition into an enhancement state in the actual circuit example of the reference voltage generation circuit 1 according to the present embodiment illustrated in FIG. 9.

Figure 17:
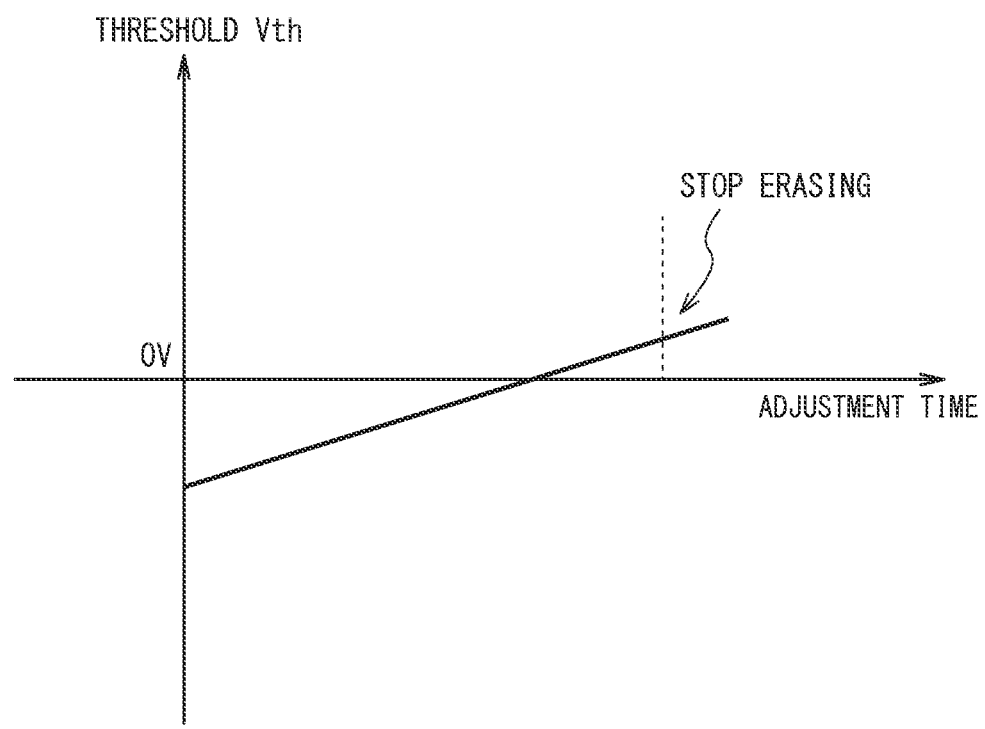
FIG. 17 is a diagram illustrating a relationship of a threshold voltage of the nonvolatile storage element Ma1 to erasing time in the state of the reference voltage generation circuit 1 illustrated in FIG. 16.

The nonvolatile storage element Ma1 is once brought into an enhancement state. At this time, the nonvolatile storage element Ma2 in the desired enhancement state is not connected to the nonvolatile storage element Ma1. States of the switches SW1 to SW9 in the state where the nonvolatile storage element Ma1 is caused to transition to the enhancement direction (in other words, the state where the threshold voltage is adjusted to the plus direction) are as follows:
SW1: VSS
SW2: VSS
SW3: VPP
SW4: ON-state (connected)
SW5: OFF-state (open)
SW6: OFF-state (open)
SW7: VSS
SW8: Optional (OFF-state (open) in FIG. 16)
SW9: VSS FIG. 17 is a diagram illustrating a relationship of a threshold voltage of the nonvolatile storage element Ma1 to erasing time in FIG. 16. The horizontal axis represents adjustment time, and the vertical axis represents the threshold voltage of the nonvolatile storage element Ma1. As illustrated in FIG. 17, the threshold voltage Vth of the nonvolatile storage element Ma1 changes with time and gradually increases in the state of FIG. 16. By optionally adjusting the erasing time, the threshold voltage Vth of the nonvolatile storage element Ma1 is once brought into the enhancement state.

<Adjustment Sequence (4)>

Figure 18:
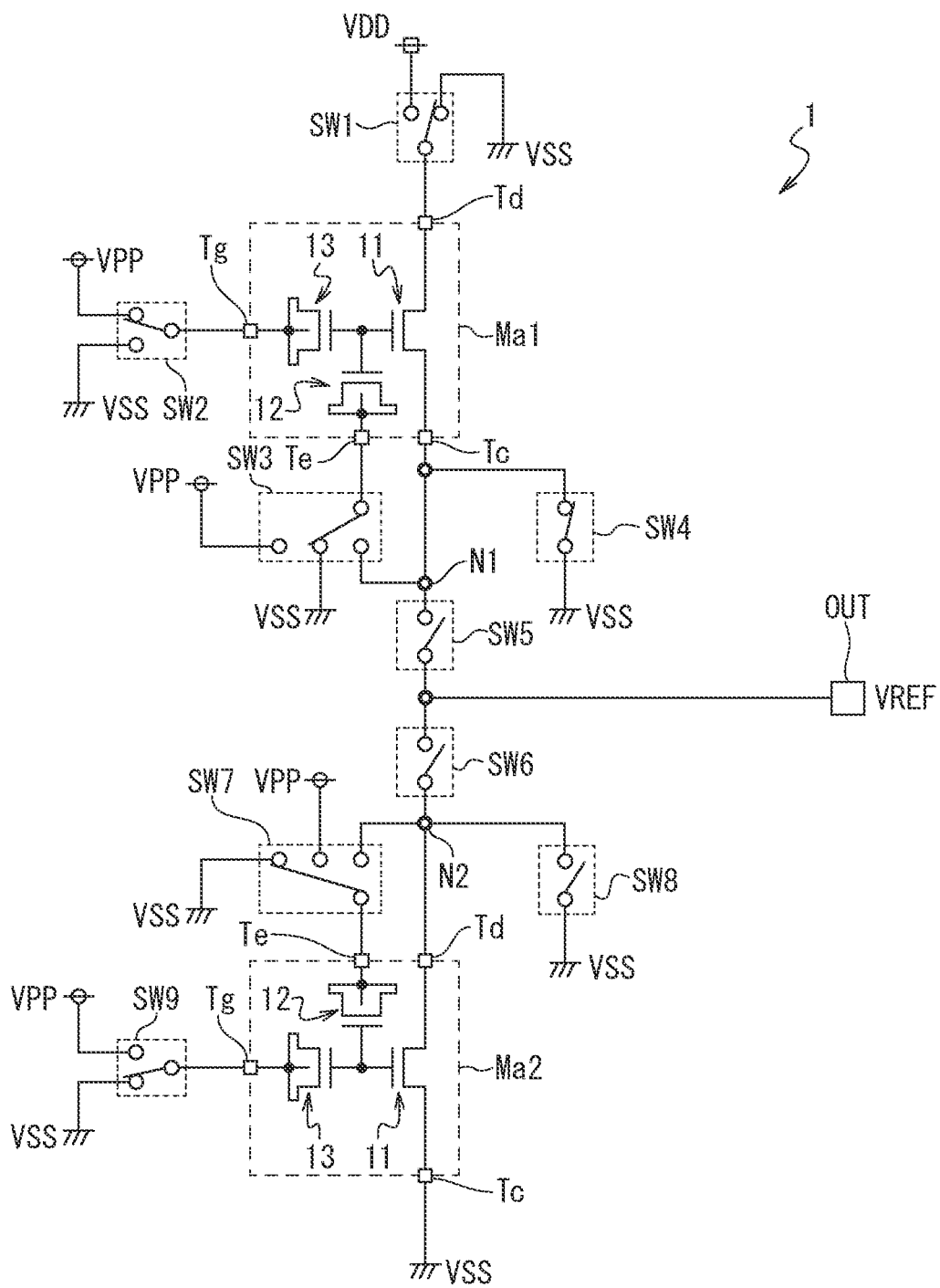
FIG. 18 is a diagram illustrating a state where the nonvolatile storage element Ma1 is caused to transition into a desired depletion state in the actual circuit example of the reference voltage generation circuit 1 according to the first embodiment of the invention illustrated in FIG. 9.

FIG. 18 is a diagram illustrating a state where the nonvolatile storage element Ma1 is caused to transition into a desired depletion state in the actual circuit example of the reference voltage generation circuit 1 according to the first embodiment of the invention illustrated in FIG. 9.

Figure 19:
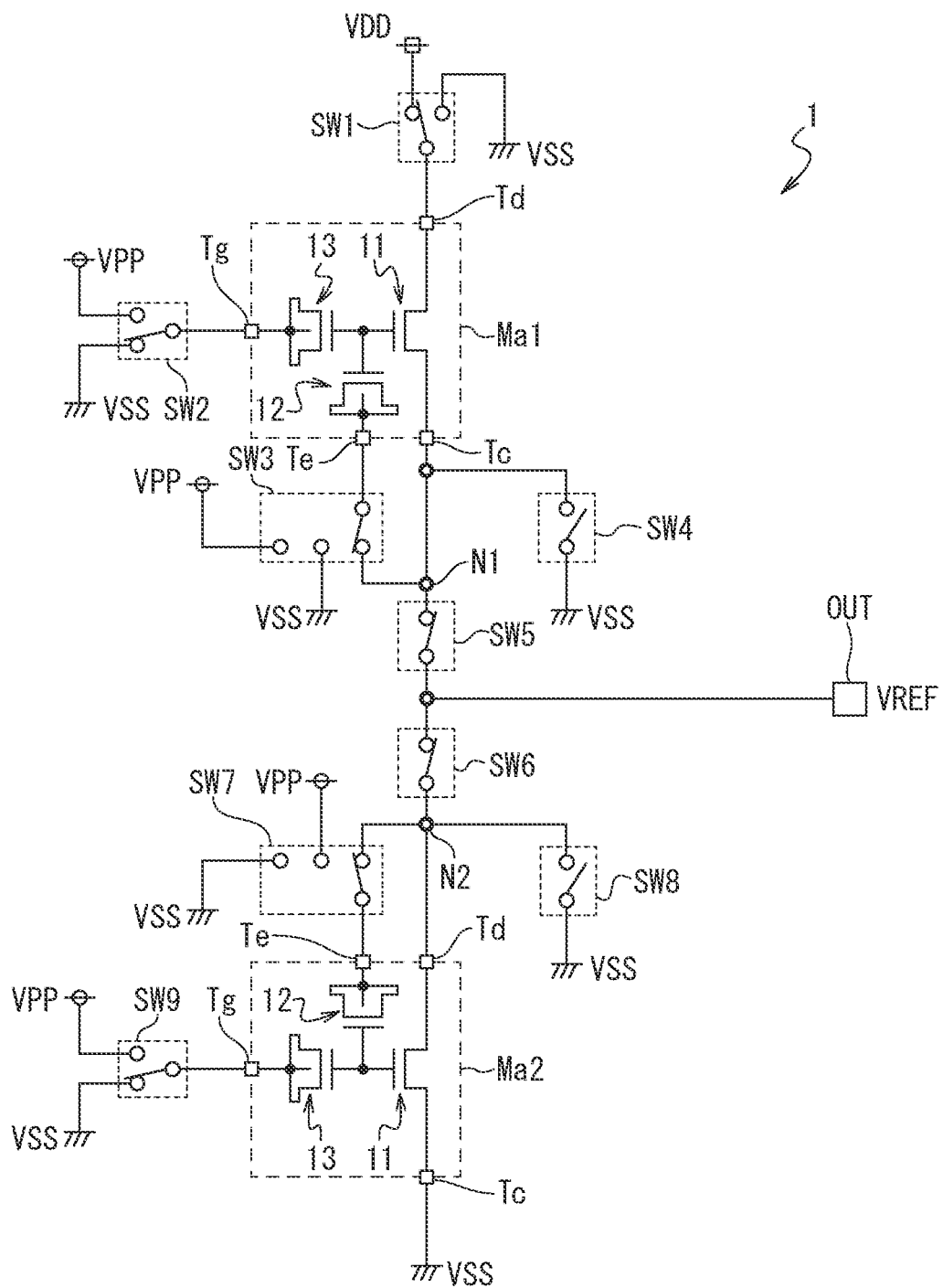
FIG. 19 is a diagram illustrating a state where the reference voltage VREF is confirmed in the actual circuit example of the reference voltage generation circuit 1 according to the first embodiment of the invention illustrated in FIG. 9.

By bringing the nonvolatile storage element Ma1 into the desired depletion state, an adjustment is made so that a desired reference voltage VREF is output. The states of the switches SW1 to SW9 in the state where the nonvolatile storage element Ma1 is caused to transition to the depletion direction (in other words, the state where the threshold voltage of the nonvolatile storage element Ma1 is adjusted to the minus direction) are as follows:
SW1: VSS
SW2: VPP
SW3: VSS
SW4: ON-state (connected)
SW5: OFF-state (open)
SW6: OFF-state (open)
SW7: VSS
SW8: Optional (OFF-state (open) in FIG. 18)
SW9: VSS FIG. 19 is a diagram illustrating a state where the reference voltage VREF is confirmed in the actual circuit example of the reference voltage generation circuit 1 according to the present embodiment illustrated in FIG. 9 (in other words, FIG. 19 illustrates the same state as FIG. 9). The states of the switches SW1 to SW9 in the confirmation state are as follows:
SW1: VDD
SW2: VSS
SW3: ON-state (connected to the connection node N1 between one terminal of the switch SW5 and the terminal Tc)
SW4: OFF-state (open)
SW5: ON-state (connected)
SW6: ON-state (connected)
SW7: ON-state (connected to the connection node N2 between one terminal of the switch SW6 and the terminal Td)
SW8: OFF-state (open)
SW9: VSS As illustrated in FIG. 19, the nonvolatile storage element Ma2 in the desired enhancement state is also connected, and the adjustment is performed while monitoring and confirming the reference voltage VREF. When the reference voltage VREF is excessively higher than the desired voltage, the above-described <Adjustment Sequence (3)> is again performed.

Figure 20:
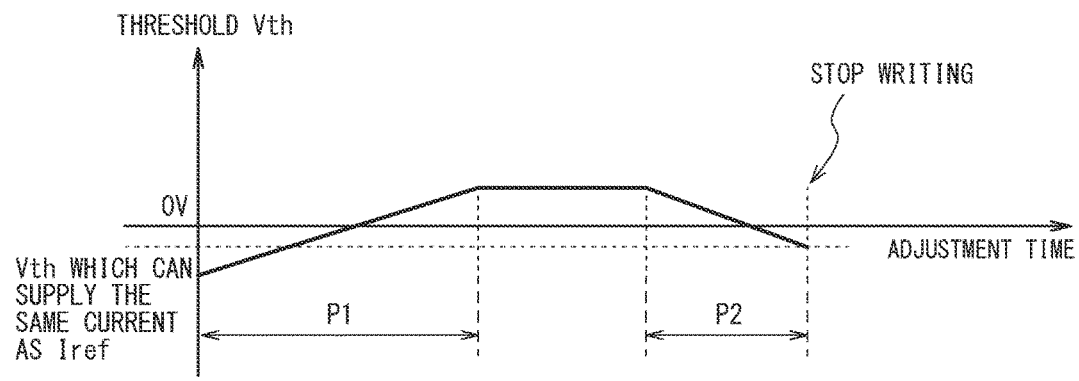
FIG. 20 is a diagram illustrating a relationship of the threshold voltage of the nonvolatile storage element Ma1 to writing time in the state of the reference voltage generation circuit 1 illustrated in FIG. 18.

FIG. 20 is a diagram illustrating a relationship of the threshold voltage of the nonvolatile storage element Ma1 to writing time in FIG. 18. The horizontal axis represents adjustment time, and the vertical axis represents the threshold voltage. As depicted by a period P2 in FIG. 20, the threshold voltage of the nonvolatile storage element Ma1 changes with time and gradually decreases in the state illustrated in FIG. 18. By adjusting the writing time, the threshold voltage Vth of the nonvolatile storage element Ma1 is adjusted so that the reference voltage VREF with a desired value is output from the voltage output terminal OUT. This is the same as making an adjustment such that a current that flows to the nonvolatile storage element Ma1 becomes the same as the adjustment current Iref input from outside. Note that a period P1 depicted in FIG. 20 represents a period of rewriting in which the threshold voltage of the nonvolatile storage element Ma1 in the state illustrated in FIG. 16 is caused to transition to the plus direction.

Figure 21:
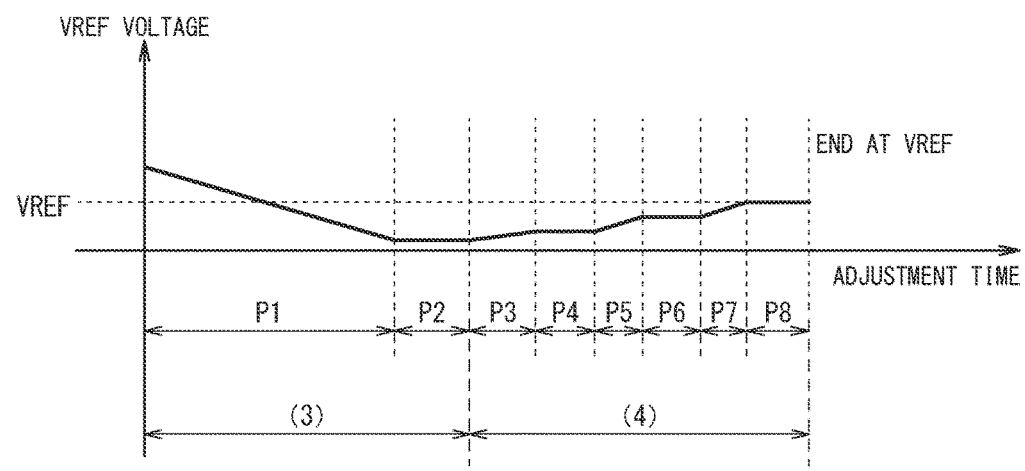
FIG. 21 is a diagram illustrating a state of transition of the reference voltage VREF with respect to adjustment time for adjusting the state of the nonvolatile storage element Ma1.

FIG. 21 is a diagram illustrating a state of transition of the reference voltage VREF with respect to adjustment time. The horizontal axis represents adjustment time, and the vertical axis represents threshold voltage. FIG. 21 illustrates the state of transition of the reference voltage VREF in the above-described <Adjustment Sequence (3)> and <Adjustment Sequence (4)>. As illustrated in FIG. 21, in a period P1, the nonvolatile storage element Ma1 is caused to transition to an enhancement direction to make the threshold voltage Vth smaller than the desired reference voltage VREF. Next, in periods P2 to P8, the transition of the nonvolatile storage element Ma1 to a depletion direction (in other words, the state where the threshold voltage Vth is adjusted to the plus direction) and the monitoring of the value of the reference voltage VREF output from the voltage output terminal OUT are repeated. In FIG. 21, the periods P2, P4, P6, and P8 are periods in which the value of the reference voltage VREF is monitored. The periods P3, P5, and P7 are periods in which the nonvolatile storage element Ma1 is caused to transition to the depletion direction. In the period P8, when the value of the reference voltage VREF output from the voltage output terminal OUT becomes a desired value, the adjustment of the reference voltage VREF is ended.

Additionally, adjustment sequences by the second adjustment method illustrated in FIG. 7A and FIG. 7B described above are as described in <Adjustment Sequence (1)> to <Adjustment Sequence (4)> that will be described below.

<Adjustment Sequence (1)>

Figure 22:
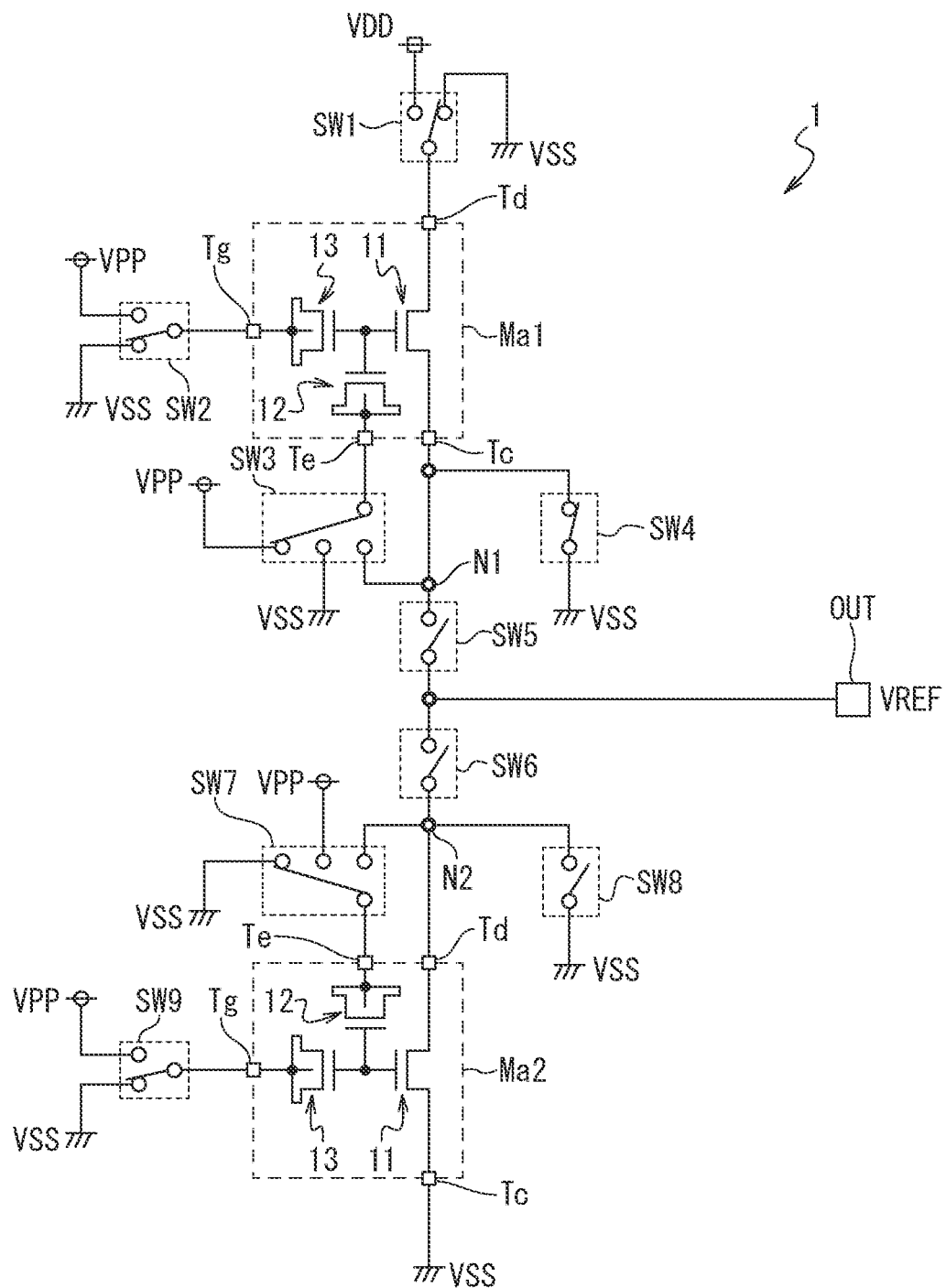
FIG. 22 is a diagram illustrating a state where the nonvolatile storage element Ma1 is caused to transition into an enhancement state in the actual circuit example of the reference voltage generation circuit 1 according to the first embodiment of the invention illustrated in FIG. 9.
Figure 23:
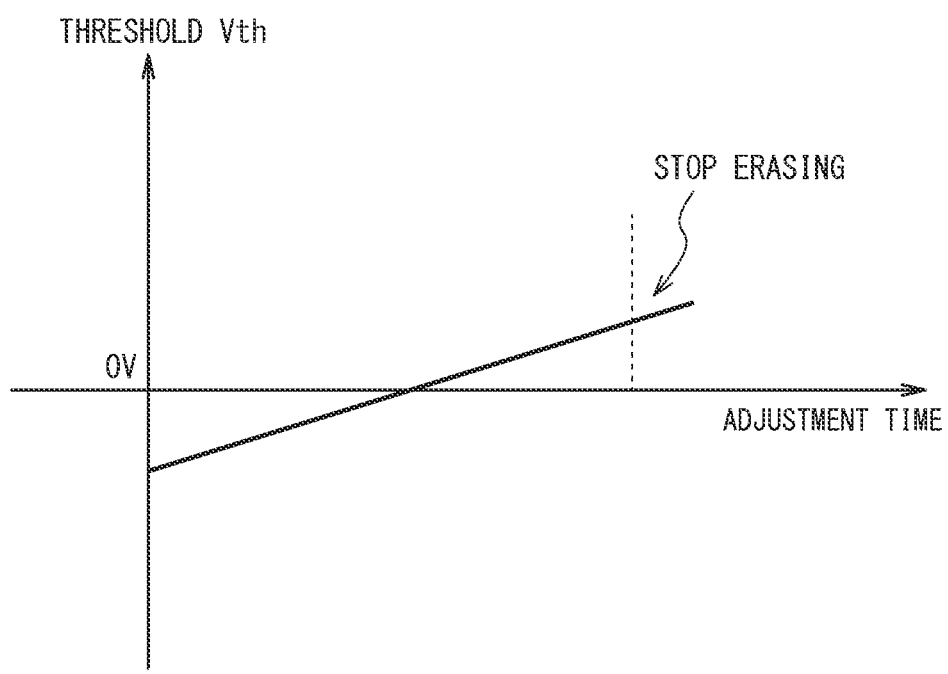
FIG. 23 is a diagram illustrating a relationship of the threshold voltage of the nonvolatile storage element Ma1 to erasing time in the state of the reference voltage generation circuit 1 illustrated in FIG. 22.

FIG. 22 is a diagram illustrating a state where the nonvolatile storage element Ma1 is caused to transition into an enhancement state in the actual circuit example of the reference voltage generation circuit 1 according to the present embodiment illustrated in FIG. 9. The nonvolatile storage element Ma1 is once brought into the enhancement state. The states of the switches SW in the state where transition to the enhancement direction is performed (in other words, the state where the threshold voltage of the nonvolatile storage element Ma1 is adjusted to the plus direction) are as follows:

SW1: VSS
SW2: VSS
SW3: VPP
SW4: ON-state (connected)
SW5: OFF-state (open)
SW6: OFF-state (open)
SW7: VSS
SW8: Optional (OFF-state (open) in FIG. 22)
SW9: VSS FIG. 23 is a diagram illustrating a relationship of the threshold voltage of the nonvolatile storage element Ma1 to erasing time in FIG. 22. The horizontal axis represents adjustment time, and the vertical axis represents the threshold voltage of the nonvolatile storage element Ma1. As illustrated in FIG. 23, the threshold voltage Vth of the nonvolatile storage element Ma1 changes with time and gradually increases in the state of FIG. 22. By adjusting the erasing time, the threshold voltage Vth of the nonvolatile storage element Ma1 is once brought into an enhancement state.

<Adjustment Sequence (2)>

Figure 24:
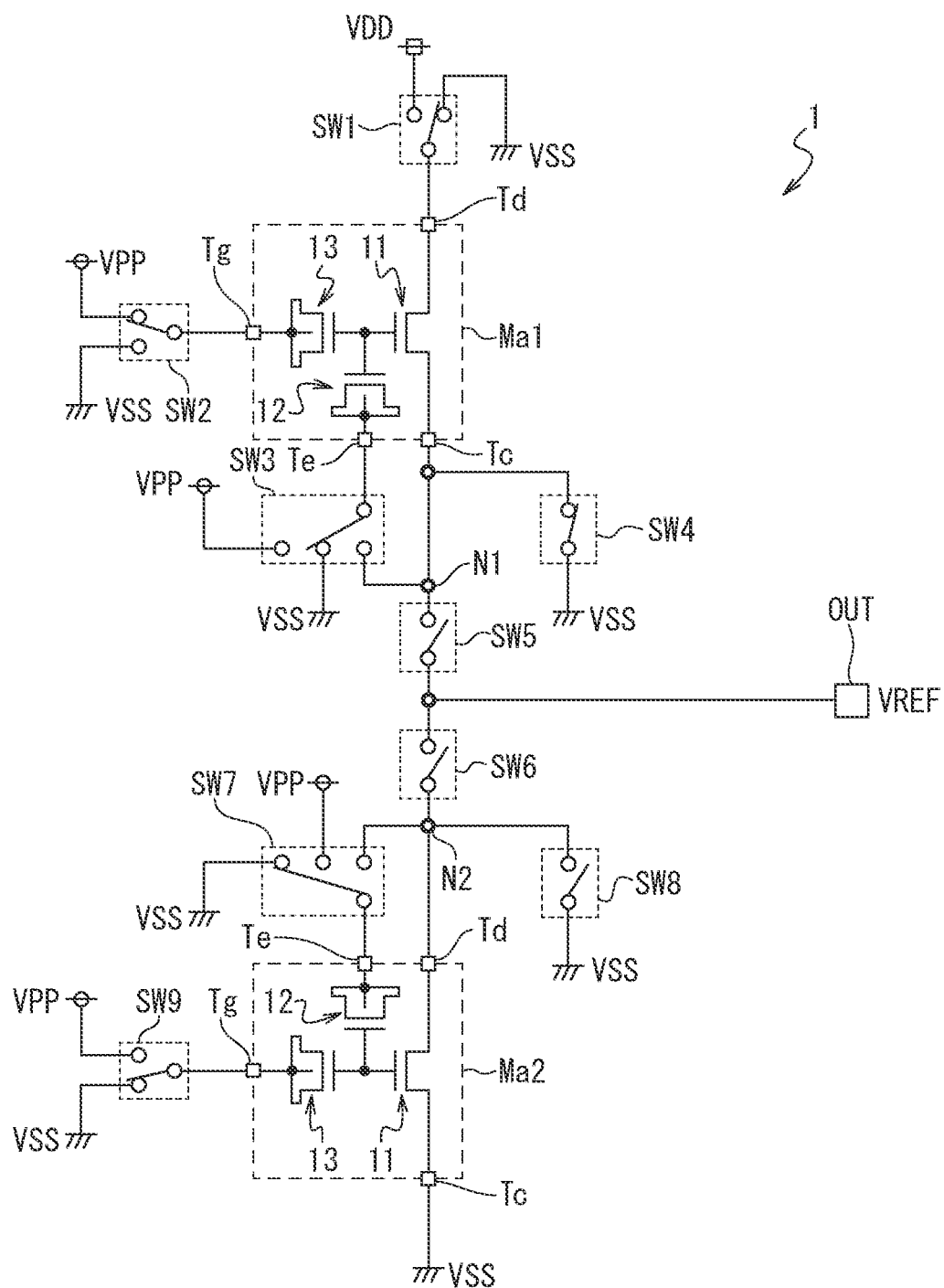
FIG. 24 is a diagram illustrating a state where the nonvolatile storage element Ma1 is caused to transition into a desired depletion state in the actual circuit example of the reference voltage generation circuit 1 according to the first embodiment of the invention illustrated in FIG. 9.

FIG. 24 is a diagram illustrating a state where the nonvolatile storage element Ma1 is caused to transition into a desired depletion state in the actual circuit example of the reference voltage generation circuit 1 according to the present embodiment illustrated in FIG. 9.

Figure 25:
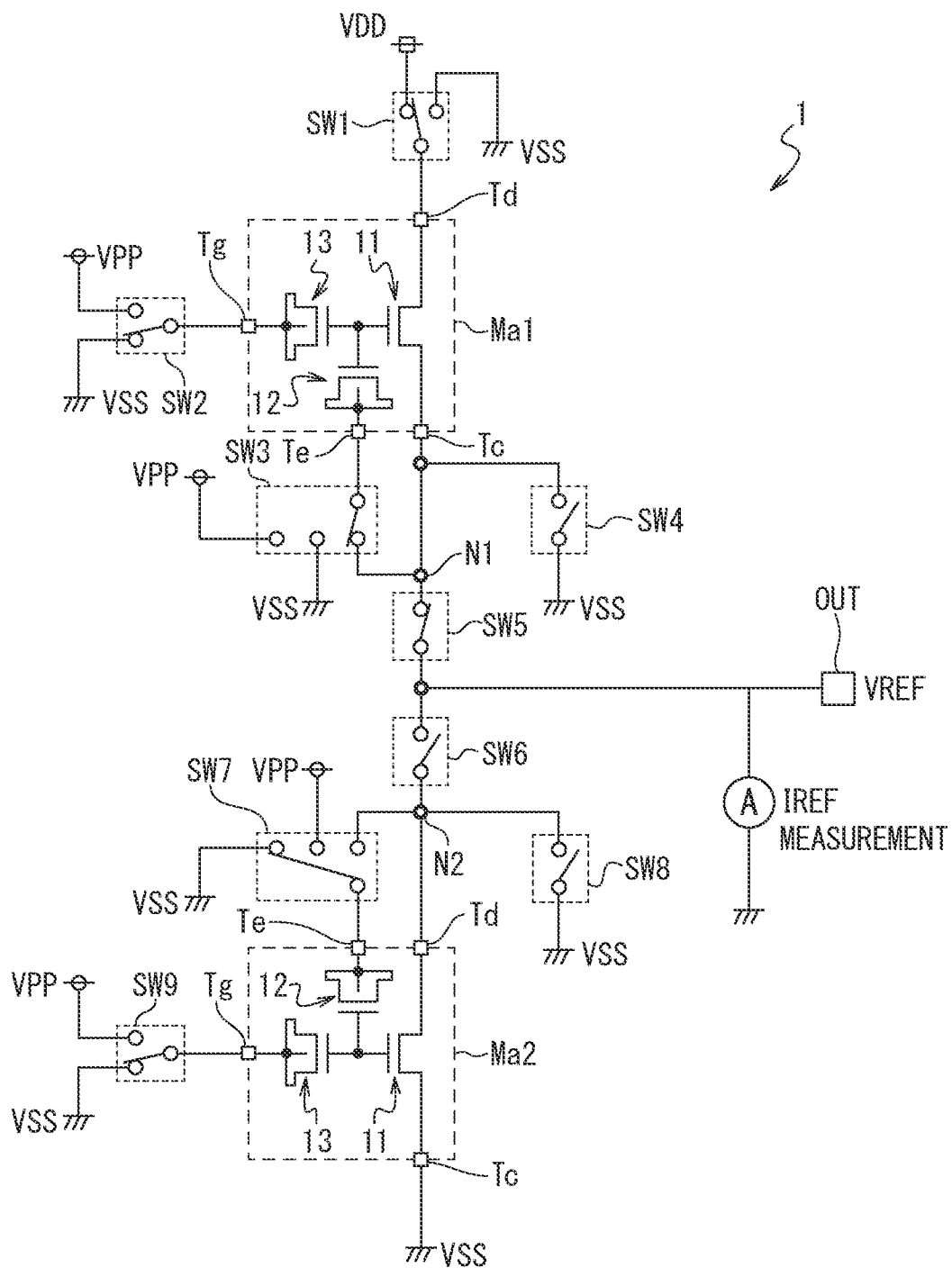
FIG. 25 is a diagram illustrating a state where a reference current IREF is confirmed in the actual circuit example of the reference voltage generation circuit 1 according to the first embodiment of the invention illustrated in FIG. 9.
Figure 26:
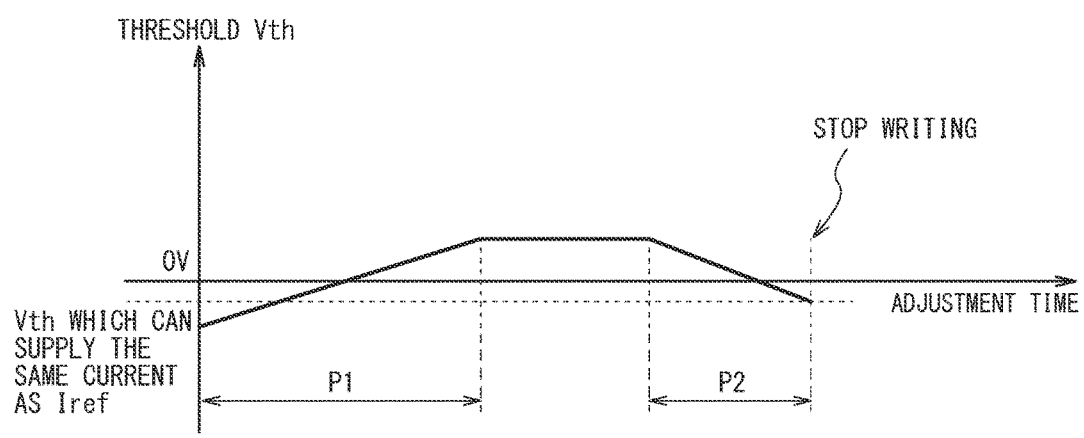
FIG. 26 is a diagram illustrating a relationship of the threshold voltage of the nonvolatile storage element Ma1 to writing time in the state of the reference voltage generation circuit 1 illustrated in FIG. 24.

By bringing the nonvolatile storage element Ma1 into the desired depletion state, an adjustment is made so that a desired reference current IREF flows. The transition of the nonvolatile storage element Ma1 into the desired depletion state is performed while monitoring and confirming a reference current IREF. When the reference current IREF becomes larger than the desired current value, the above-described <Adjustment Sequence (1)> is again performed. The states of the switches SW1 to SW9 in the state where the transition to the depletion direction is performed (in other words, the state where the threshold voltage of the nonvolatile storage element Ma1 is adjusted to the minus direction) are as follows:

SW1: VSS
SW2: VPP
SW3: VSS
SW4: ON-state (connected)
SW5: OFF-state (open)
SW6: OFF-state (open)
SW7: VSS
SW8: Optional (OFF-state (open) in FIG. 24)
SW9: VSS FIG. 25 is a diagram illustrating a state where the reference current IREF is confirmed in the actual circuit example of the reference voltage generation circuit 1 according to the present embodiment illustrated in FIG. 9. States of the switches SW1 to SW9 in the confirmation state are as follows:

SW1: VDD
SW2: VSS
SW3: ON-state (connected to the connection node N1 between one terminal of the switch SW5 and the terminal Tc)
SW4: OFF-state (open)
SW5: ON-state (connected)
SW6: OFF-state (open)
SW7: VSS
SW8: Optional (OFF-state (open) in FIG. 25)
SW9: VSS FIG. 26 is a diagram illustrating a relationship of the threshold voltage of the nonvolatile storage element Ma1 to writing time in FIG. 24. The horizontal axis represents adjustment time, and the vertical axis represents the threshold voltage of the nonvolatile storage element Ma1. As depicted by a period P2 in FIG. 26, the threshold voltage of the nonvolatile storage element Ma1 changes with time and gradually decreases in the state illustrated in FIG. 24. By adjusting the writing time, the threshold voltage Vth of the nonvolatile storage element Ma1 is adjusted so that a desired adjustment current Iref is output. Note that a period P1 depicted in FIG. 26 represents a period of erasing in which the threshold voltage of the nonvolatile storage element Ma1 in the state illustrated in FIG. 23 is caused to transition to the plus direction.

Figure 27:
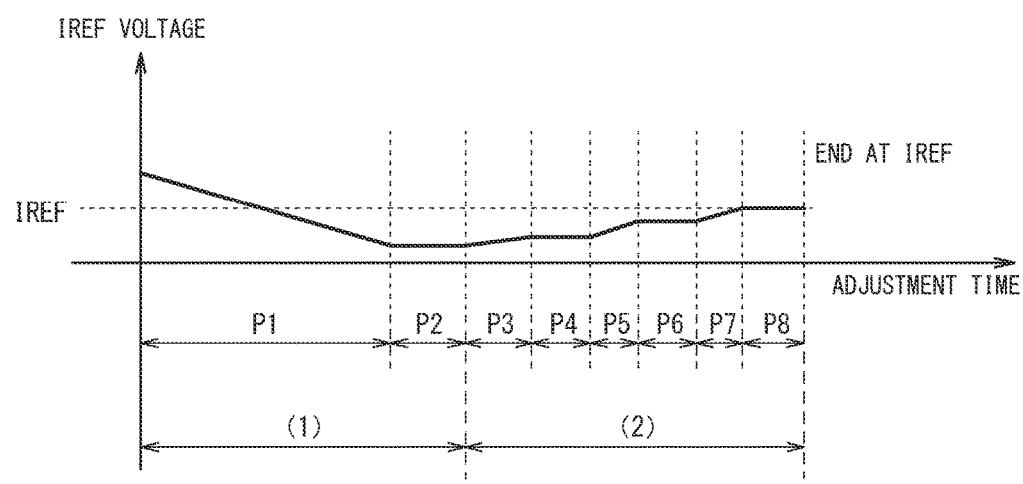
FIG. 27 is a diagram illustrating a state of transition of the reference current IREF with respect to adjustment time for adjusting the state of the nonvolatile storage element Ma1.

FIG. 27 is a diagram illustrating a state of transition of the reference current IREF with respect to adjustment time. The horizontal axis represents adjustment time, and the vertical axis represents the reference current IREF that flows to the nonvolatile storage element Ma1. FIG. 27 illustrates the state of transition of the reference current IREF in the above-described <Adjustment Sequence (1)> and <Adjustment Sequence (2)>. As illustrated in FIG. 27, in a period P1, the nonvolatile storage element Ma1 is caused to transition to an enhancement direction to make the reference current IREF smaller than a desired current value. Next, in periods P2 to P8, the transition of the nonvolatile storage element Ma1 to a depletion direction (in other words, the state where the threshold voltage Vth is adjusted to the minus direction) and the monitoring of the value of the reference current IREF are repeated. In FIG. 27, the periods P2, P4, P6, and P8 are periods in which the value of the reference current IREF is monitored. The periods P3, P5, and P7 are periods in which the nonvolatile storage element Ma1 is caused to transition to the depletion direction. In the period P8, when the value of the reference current IREF becomes a desired value (described as "IREF" in FIG. 27), the adjustment of the reference current IREF is ended.

<Adjustment Sequence (3)>

Figure 28:
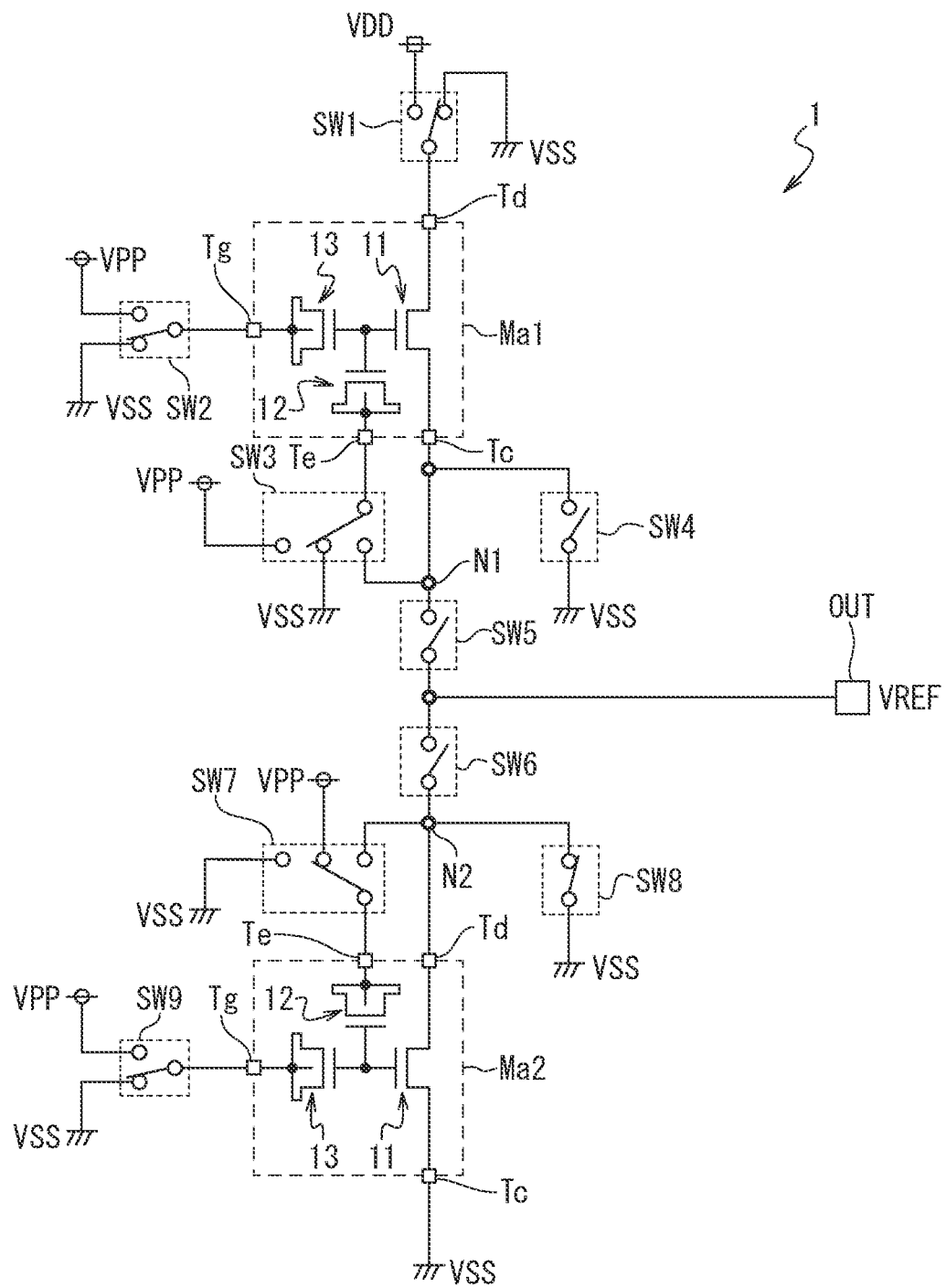
FIG. 28 is a diagram illustrating a state where the nonvolatile storage element Ma2 is caused to transition into an enhancement state in the actual circuit example of the reference voltage generation circuit 1 according to the first embodiment of the invention illustrated in FIG. 9.

FIG. 28 is a diagram illustrating a state where the nonvolatile storage element Ma2 is caused to transition into an enhancement state in the actual circuit example of the reference voltage generation circuit 1 according to the present embodiment illustrated in FIG. 9.

Figure 29:
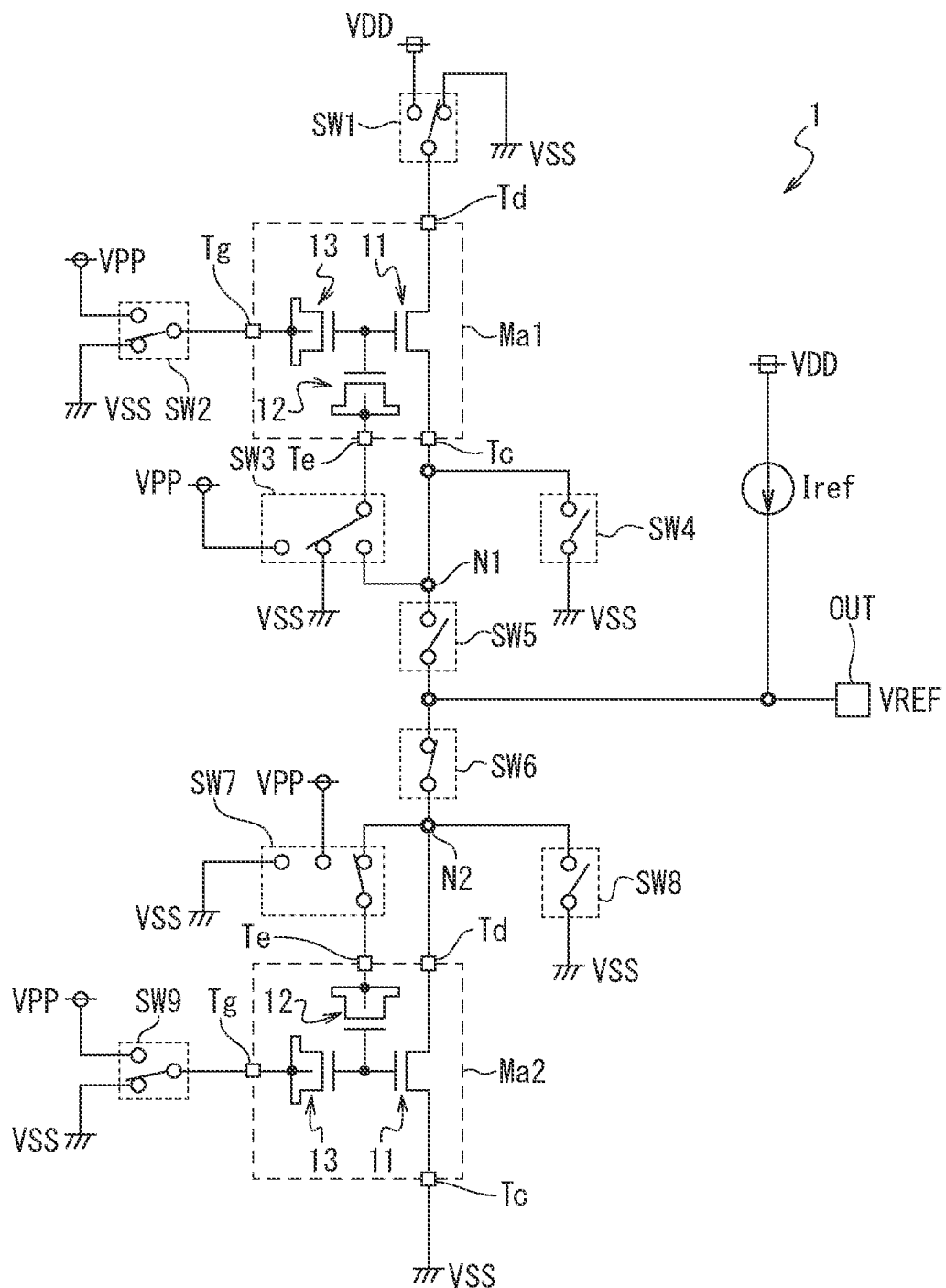
FIG. 29 is a diagram illustrating a state where the reference voltage VREF is confirmed in the actual circuit example of the reference voltage generation circuit 1 according to the first embodiment of the invention illustrated in FIG. 9.
Figure 30:
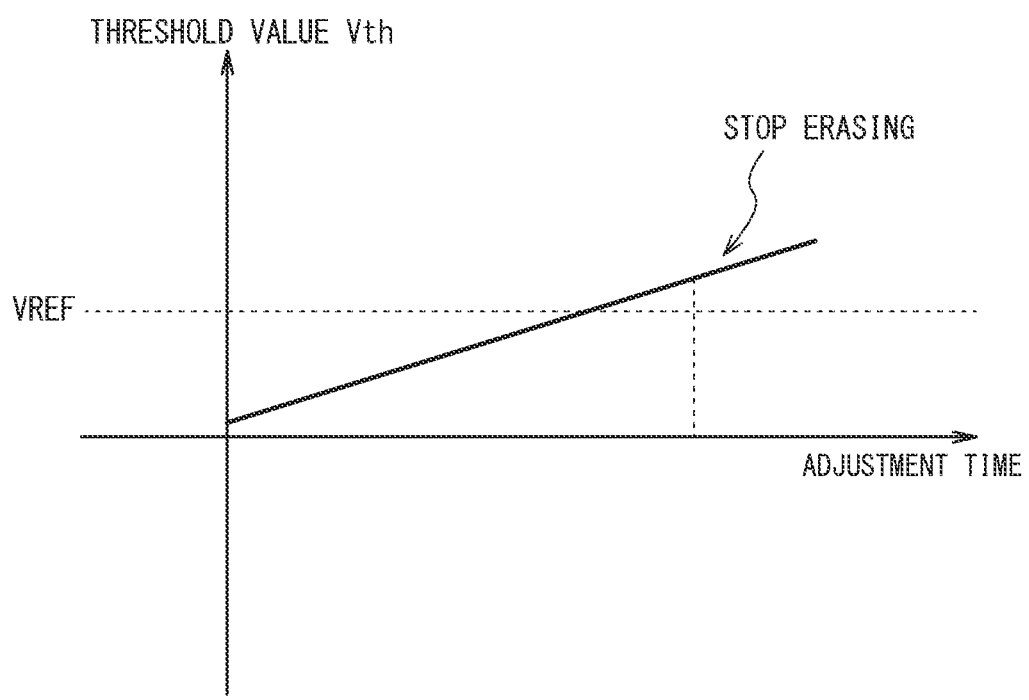
FIG. 30 is a diagram illustrating a relationship of the threshold voltage of the nonvolatile storage element Ma2 to erasing time in the state of the reference voltage generation circuit 1 illustrated in FIG. 28.

The nonvolatile storage element Ma2 is caused to transition into the enhancement state (the threshold voltage of the nonvolatile storage element Ma2 is made larger than the reference voltage VREF). The states of the switches SW1 to SW9 in the state of transition to the enhancement direction (in other words, the threshold voltage of the nonvolatile storage element Ma2 is adjusted to the plus direction) are as follows:

SW1: VSS
SW2: VSS
SW3: VSS
SW4: Optional (OFF-state (open) in FIG. 28)
SW5: OFF-state (open)
SW6: OFF-state (open)
SW7: VPP
SW8: ON-state (connected)
SW9: VSS FIG. 29 is a diagram illustrating a state where the reference voltage VREF is confirmed in the actual circuit example of the reference voltage generation circuit 1 according to the present embodiment illustrated in FIG. 9. The states of the switches SW1 to SW9 in the confirmation state are as follows:

SW1: VSS
SW2: VSS
SW3: VSS
SW4: Optional (OFF-state (open) in FIG. 29)
SW5: OFF-state (open)
SW6: ON-state (connected)
SW7: ON-state (connected to the connection node N2 between one terminal of the switch SW6 and the terminal Td)
SW8: OFF-state (open)
SW9: VSS FIG. 30 is a diagram illustrating a relationship of the threshold voltage of the nonvolatile storage element Ma2 to erasing time in FIG. 28. The horizontal axis represents adjustment time, and the vertical axis represents the threshold voltage of the nonvolatile storage element Ma2. As in FIG. 30, the threshold voltage Vth of the nonvolatile storage element Ma2 changes with time and gradually increases in the state of FIG. 28. By adjusting the erasing time, the threshold voltage Vth of the nonvolatile storage element Ma2 is made larger than a desired reference voltage VREF. Confirmation of the threshold voltage Vth of the nonvolatile storage element Ma2 is performed in the state illustrated in FIG. 29.

<Adjustment Sequence (4)>

Figure 31:
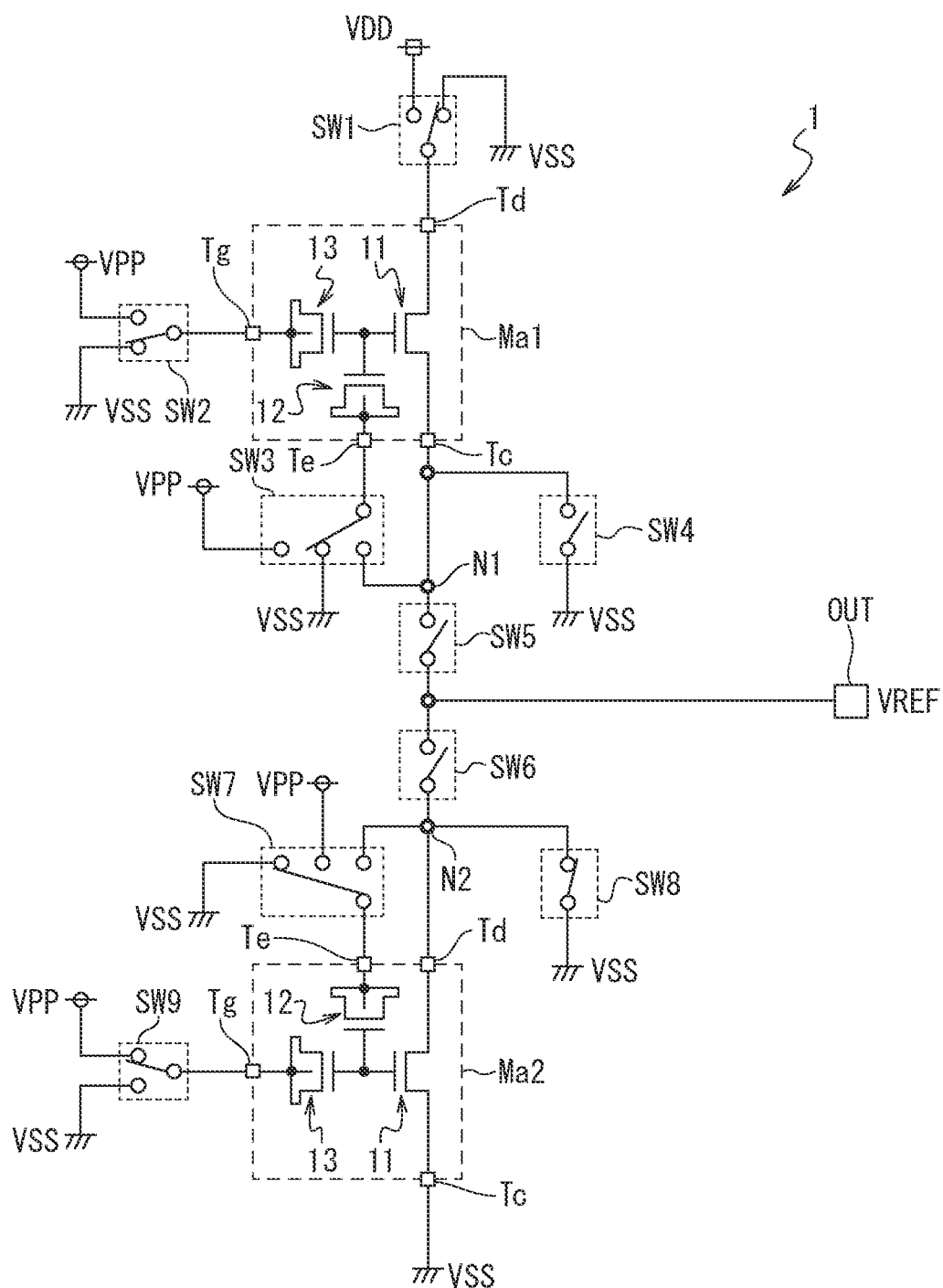
FIG. 31 is a diagram illustrating a state where the nonvolatile storage element Ma2 is caused to transition into a desired enhancement state (a state where the threshold voltage of the nonvolatile storage element Ma2 is adjusted to the minus direction) in the actual circuit example of the reference voltage generation circuit 1 according to the first embodiment of the invention illustrated in FIG. 9.

FIG. 31 is a diagram illustrating a state where the nonvolatile storage element Ma2 is caused to transition into a desired enhancement state (a state where the threshold voltage of the nonvolatile storage element Ma2 is adjusted to the minus direction, that is, a state of transition to a depletion direction) in the actual circuit example of the reference voltage generation circuit 1 according to the present embodiment illustrated in FIG. 9.

Figure 32:
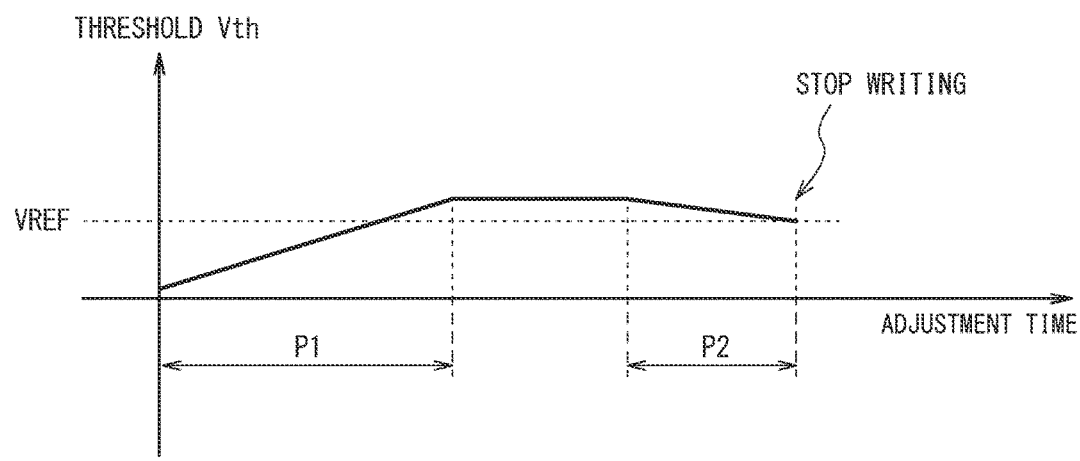
FIG. 32 is a diagram illustrating a relationship of the threshold voltage of the nonvolatile storage element Ma2 to writing time in the state of the reference voltage generation circuit 1 illustrated in FIG. 31.

By bringing the nonvolatile storage element Ma2 into the desired enhancement state, an adjustment is made so that a desired reference voltage VREF is output. As illustrated in FIG. 19, the nonvolatile storage element Ma1 in the desired depletion state is also connected, and the adjustment is performed while monitoring and confirming the reference voltage VREF. When the reference voltage VREF is excessively reduced than the desired voltage, the above-described <Adjustment Sequence (3)> is again performed. The states of the switches SW1 to SW9 in the state where the transition to the depletion direction is performed (the state where the threshold voltage of the nonvolatile storage element Ma2 is adjusted to the minus direction) are as follows:

SW1: VSS
SW2: VSS
SW3: VSS
SW4: Optional (OFF-state (open) in FIG. 31)
SW5: OFF-state (open)
SW6: OFF-state (open)
SW7: VSS
SW8: ON-state (connected)
SW9: VPP FIG. 32 is a diagram illustrating a relationship of the threshold voltage of the nonvolatile storage element Ma2 to writing time in FIG. 31. The horizontal axis represents adjustment time, and the vertical axis represents the threshold voltage of the nonvolatile storage element Ma2. As depicted by a period P2 in FIG. 32, the threshold voltage of the nonvolatile storage element Ma2 changes with time and gradually decreases in the state illustrated in FIG. 31. By adjusting the writing time, the threshold voltage Vth of the nonvolatile storage element Ma2 is set to a desired value of the reference voltage VREF.

Figure 33:
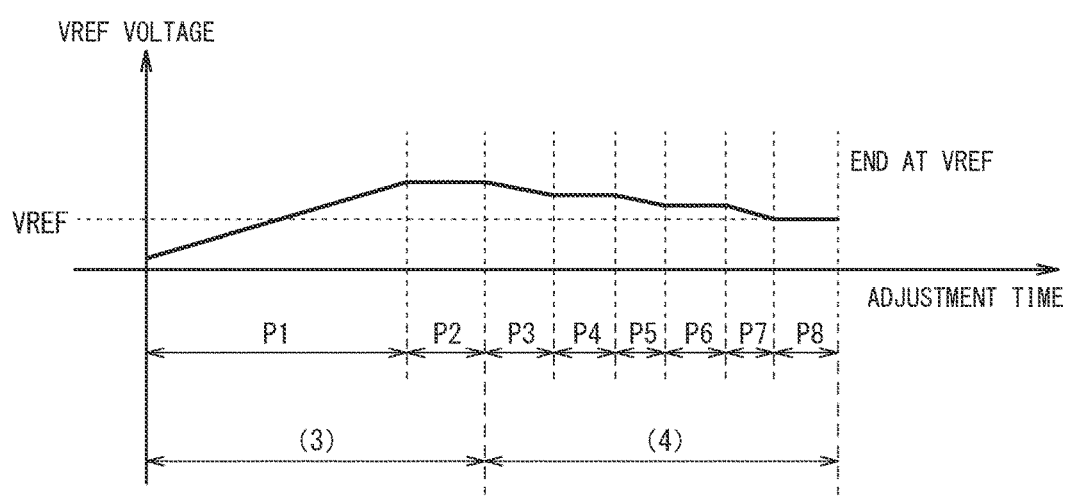
FIG. 33 is a diagram illustrating a state of transition of the reference voltage VREF with respect to adjustment time for adjusting the state of the nonvolatile storage element Ma1.

FIG. 33 is a diagram illustrating a state of transition of the reference voltage VREF with respect to adjustment time. The horizontal axis represents adjustment time, and the vertical axis represents the threshold voltage of the nonvolatile storage element Ma2. FIG. 33 illustrates the state of transition of the reference voltage VREF in the above-described <Adjustment Sequence (3)> and <Adjustment Sequence (4)>. As illustrated in FIG. 33, in a period P1, the nonvolatile storage element Ma2 is caused to transition to an enhancement direction to make the reference voltage VREF larger than a desired voltage value (described as "VREF" in FIG. 33). Next, in periods P2 to P8, the transition of the nonvolatile storage element Ma2 to a depletion direction (in other words, the state where the threshold voltage Vth is adjusted to the minus direction) and the monitoring of the reference voltage VREF are repeated. In FIG. 33, the periods P2, P4, P6, and P8 are periods in which the reference voltage VREF is monitored. The periods P3, P5, and P7 are periods in which the nonvolatile storage element Ma2 is caused to transition to the depletion direction. In the period P8, when the value of the reference voltage VREF becomes the desired voltage value (VREF), the adjustment of the reference voltage VREF is ended.

Figure 34:
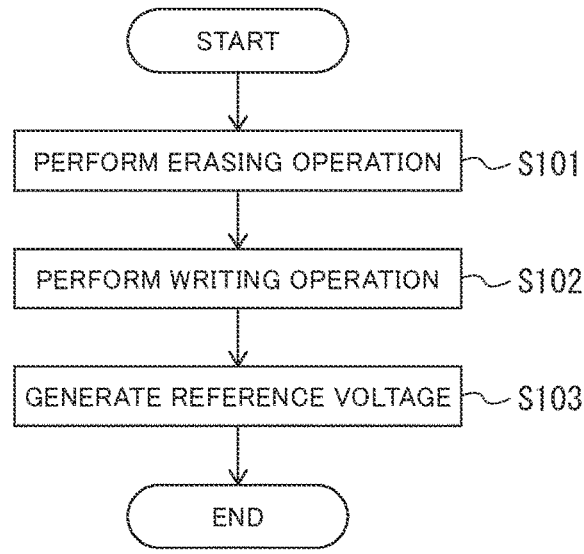
FIG. 34 is a diagram depicting a flowchart for illustrating a reference voltage generation method of the reference voltage generation circuit 1 according to the first embodiment of the invention.

FIG. 34 is a diagram depicting a flowchart for illustrating a reference voltage generation method of the reference voltage generation circuit 1 according to the present embodiment. The reference voltage generation method according to the present embodiment is a method for eliminating manufacturing variation in reference voltage that occurs due to difference of characteristics between respective circuit elements.

The reference voltage generation circuit 1 includes at least one or more depletion type MOS transistors and at least one or more enhancement type MOS transistors in which a current that flows to the enhancement type MOS transistors is the same as or relevant to a current that flows to the depletion type MOS transistors, and each of the MOS transistors is a nonvolatile storage element.

As illustrated in FIG. 34, first, erasing operation is performed at step S101, and processing is moved to step S102. Specifically, at step S101, the erasing operation is performed in at least one of the plurality of nonvolatile storage elements, in which currents that flow to each of the plurality of nonvolatile storage elements are the same or relevant to each other.

Next, at step S102, writing operation is performed, and processing is moved to step S103. Specifically, at step S102, the writing operation is performed in at least one of the plurality of nonvolatile storage elements.

Next, at step S103, a reference voltage is generated, and the processing is ended.

Figure 35:
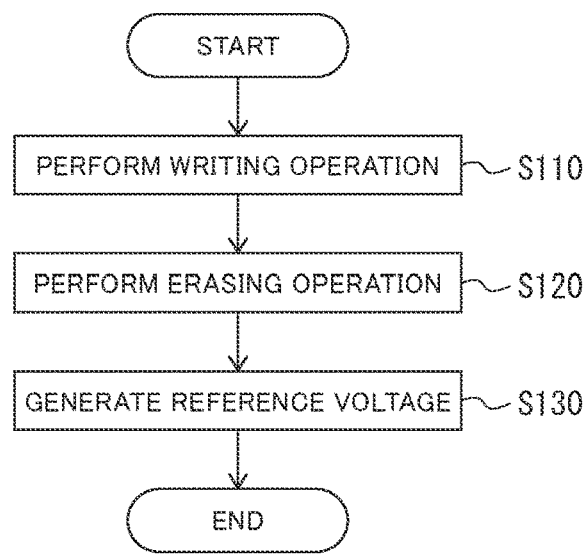
FIG. 35 is a diagram depicting a flowchart for illustrating another reference voltage generation method of the reference voltage generation circuit 1 according to the first embodiment of the invention.

FIG. 35 is a diagram depicting a flowchart for illustrating another reference voltage generation method of the reference voltage generation circuit 1 according to the present embodiment. The other reference voltage generation method according to the present embodiment is a method for eliminating manufacturing variation in reference voltage that occurs due to difference of characteristics between the respective circuit elements.

The reference voltage generation circuit 1 includes at least one or more depletion type MOS transistors and at least one or more enhancement type MOS transistors in which a current that flows to the enhancement type transistors is the same as or relevant to a current that flows to the depletion type MOS transistors, and each of the MOS transistors is a nonvolatile storage element.

As illustrated in FIG. 35, first, at step S111, writing operation is performed, and processing is moved to step S112. Specifically, at step S111, the writing operation is performed in at least one of the plurality of nonvolatile storage elements in which currents that flow to each of the plurality of nonvolatile storage elements are the same as or relevant to each other.

Next, at step S112, erasing operation is performed, and processing is moved to step S113. Specifically, at step S112, the erasing operation is performed in at least one of the plurality of nonvolatile storage elements.

Next, at step S113, a reference voltage is generated, and the processing is ended.

The reference voltage VREF to be generated is the same as that in a circuit using depletion MOS and enhancement MOS transistors. However, adjustment of the reference voltage VREF to be generated can be optionally performed by the nonvolatile storage elements. Additionally, since the same nonvolatile storage elements are used, variation in process can also be prevented.

[Second Embodiment]

Figure 36:
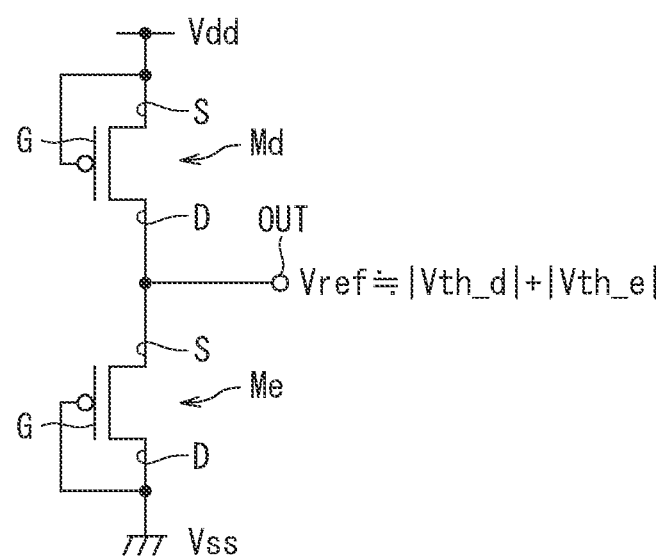
FIG. 36 is a circuit structural diagram of a reference voltage generation circuit using PMOS transistors.

A reference voltage generation circuit according to a second embodiment of the invention will be described with reference to FIG. 36 to FIG. 40. The reference voltage generation circuit illustrated in FIG. 1 is formed by using the NMOS transistors. However, as illustrated in FIG. 36, even in the reference voltage generation circuit using PMOS transistor, a reference voltage can be generated.

Figure 37:
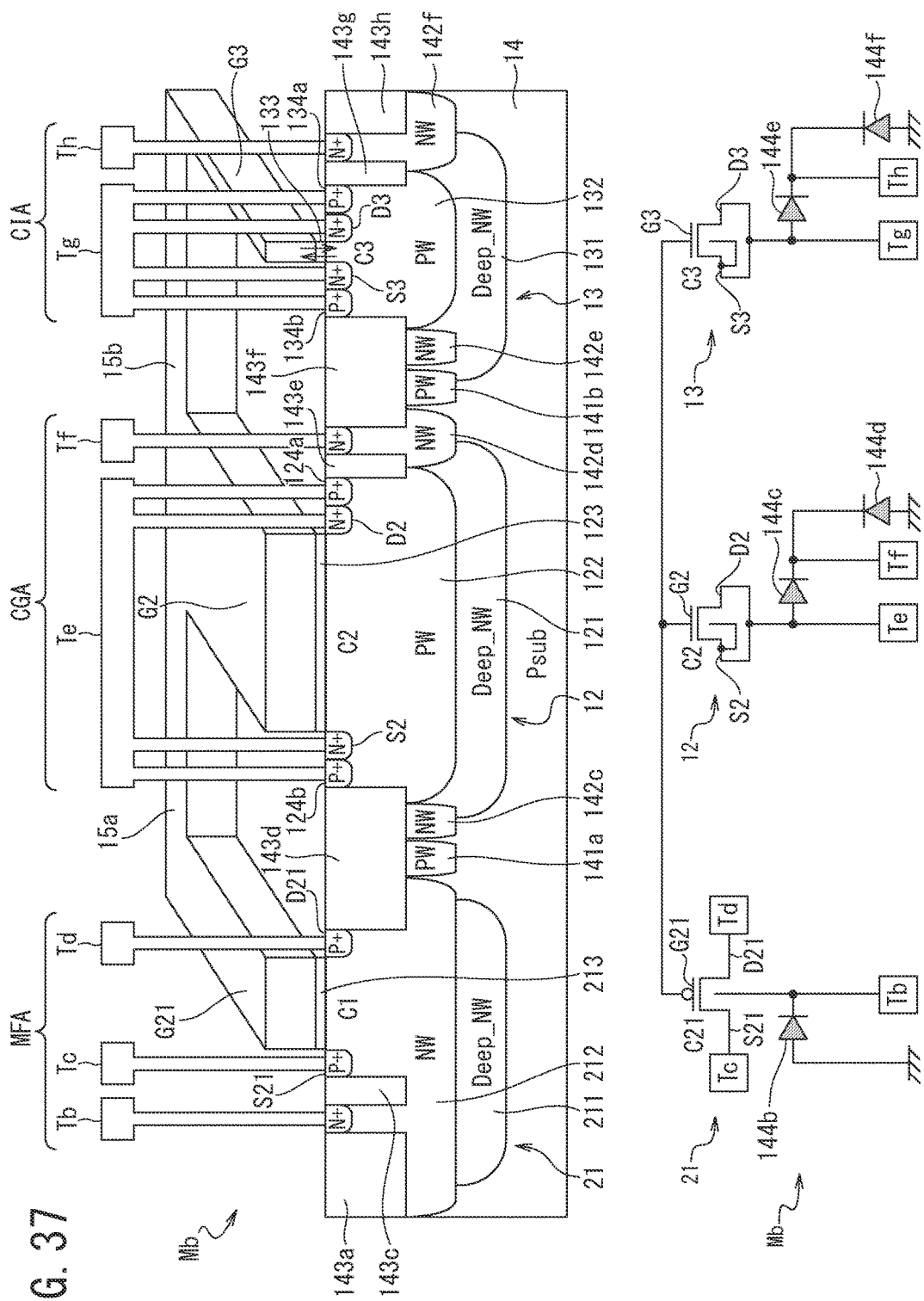
FIG. 37 is a cross-sectional view and a circuit structural diagram illustrating a schematic structure of a nonvolatile storage element Mb according to a second embodiment of the invention.

The reference voltage generation circuit according to the present embodiment uses two or more nonvolatile storage elements that can be driven as PMOS transistors formed of single layer polysilicon. In the nonvolatile storage element Ma according to the above first embodiment, the MOS transistor provided in the MOSFET area MFA is a NMOS transistor (see FIG. 1). By contrast, a nonvolatile storage element Mb according to the present embodiment is characterized in that a MOS transistor provided in the MOSFET area MFA is a PMOS transistor, as illustrated in FIG. 37.

In the MOSFET area MFA of the present embodiment is provided a MOS transistor 21 formed of a MOSFET. The MOS transistor 21 includes a floating gate G21 formed of polysilicon. The floating gate G21 is formed of single layer polysilicon. The floating gate G21 is formed above an N-well region 212 via a gate insulating film 213. The MOS transistor 21 includes a drain region D21 formed on one of both sides below the floating gate G21 via the gate insulating film 213 and a source region S21 formed on the other one of both sides below the floating gate G21. The drain region D21 is a P+region formed inside the N-well region 212, and is connected to a terminal Td. The source region S21 is a P+ region formed inside the N-well region 212, and is connected to a terminal Tc. The nonvolatile storage element Mb is element-isolated from other parts of the nonvolatile storage element Mb and other elements by element-isolating regions 143a and 143c to 143h. The floating gate G21 is not directly connected to any electrode for electric contact therewith, and is, as the name suggests, in a floating state. The control gate area CGA and the electric charge injection area CIA other than the MOSFET area MFA have the same structure as the control gate area CGA and the electric charge injection area CIA of the nonvolatile storage element Ma according to the first embodiment. Thus, respective structural components of the control gate area CGA and the electric charge injection area CIA of the present embodiment are denoted by the same reference numerals as those of the first embodiment, and detailed description thereof will be omitted.

Next will be a description of the reference voltage generation circuit using the nonvolatile storage element according to the present embodiment. The reference voltage generation circuit according to the present embodiment is a circuit configured to generate a reference voltage by using a plurality of nonvolatile storage elements configured to operate as single-layer polysilicon type PMOS transistors. The reference voltage generation circuit according to the present embodiment uses the nonvolatile storage elements by bringing into two states: enhancement type transistor(s) and depletion type transistor(s). The nonvolatile storage element (s) used as the enhancement type transistor (s) and the nonvolatile storage element(s) used as the depletion type transistor(s) are same in size and structure as element.

The reference voltage generation circuit according to the present embodiment is a circuit configured to eliminate manufacturing variation in reference voltage that occurs due to difference of characteristics between respective circuit elements forming the circuit. The reference voltage generation circuit according to the present embodiment includes at least one or more depletion type transistors and at least one or more enhancement type transistors to which there flows a current that is the same as or relevant to a current that flows to the depletion type transistor. The one or more depletion type transistors and the one or more enhancement type transistors forming the reference voltage generation circuit according to the present embodiment are nonvolatile storage elements configured to operate as single-layer polysilicon type PMOS transistors.

Figure 38:
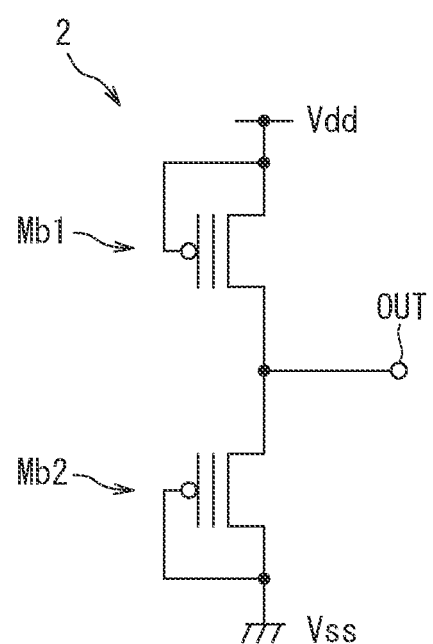
FIG. 38 is a diagram simply representing a circuit structure for illustrating a reference voltage generation circuit 2 according to the second embodiment of the invention.

As illustrated in FIG. 38, a reference voltage generation circuit 2 according to the present embodiment includes a plurality of (two in the present example) nonvolatile storage elements Mb1 and Mb2. In FIG. 38, the nonvolatile storage elements Mb1 and Mb2 are simply represented, but actually have the structure illustrated in FIG. 37. When the reference voltage generation circuit 2 illustrated in FIG. 38 is represented by using the nonvolatile storage element Mb illustrated in FIG. 37, the circuit 2 can be represented as in a structure illustrated in FIG. 39. The nonvolatile storage elements Mb1 and Mb2, respectively, correspond to the nonvolatile storage element Mb illustrated in FIG. 37. At least some (all in the present example) of the plurality of nonvolatile storage elements Mb1 and Mb2 are connected in series. To a connection portion between the plurality of nonvolatile storage elements Mb1 and Mb2 connected in series is connected a voltage output terminal OUT from which a reference voltage Vref is output. The nonvolatile storage elements Mb1 and Mb2 are driven by the MOS transistor 21 of the MOSFET area MFA during circuit operation, and therefore both operate as transistors.

The nonvolatile storage element Mb1 and the nonvolatile storage element Mb2 are connected in series between a high voltage supply terminal Vdd to which high voltage is supplied and a low voltage supply terminal Vss to which low voltage is supplied. The source region S21 of the nonvolatile storage element Mb1 is connected to the high voltage supply terminal Vdd via the terminal Tc, and the drain region D21 of the nonvolatile storage element Mb2 is connected to the low voltage supply terminal Vss via the terminal Td. The source region S21 of the nonvolatile storage element Mb1 and the source region S2, the drain region D2, and the P+ regions 124a and 124b (see FIG. 37) of the nonvolatile storage element Mb1 are connected to each other via the terminal Tc and the terminal Te. The drain region D21 of the nonvolatile storage element Mb2 and the source region S2, the drain region D2, and the P+ regions 124a and 124b (see FIG. 37) of the nonvolatile storage element Mb2 are connected to each other via the terminal Td and the terminal Te.

Figure 39:
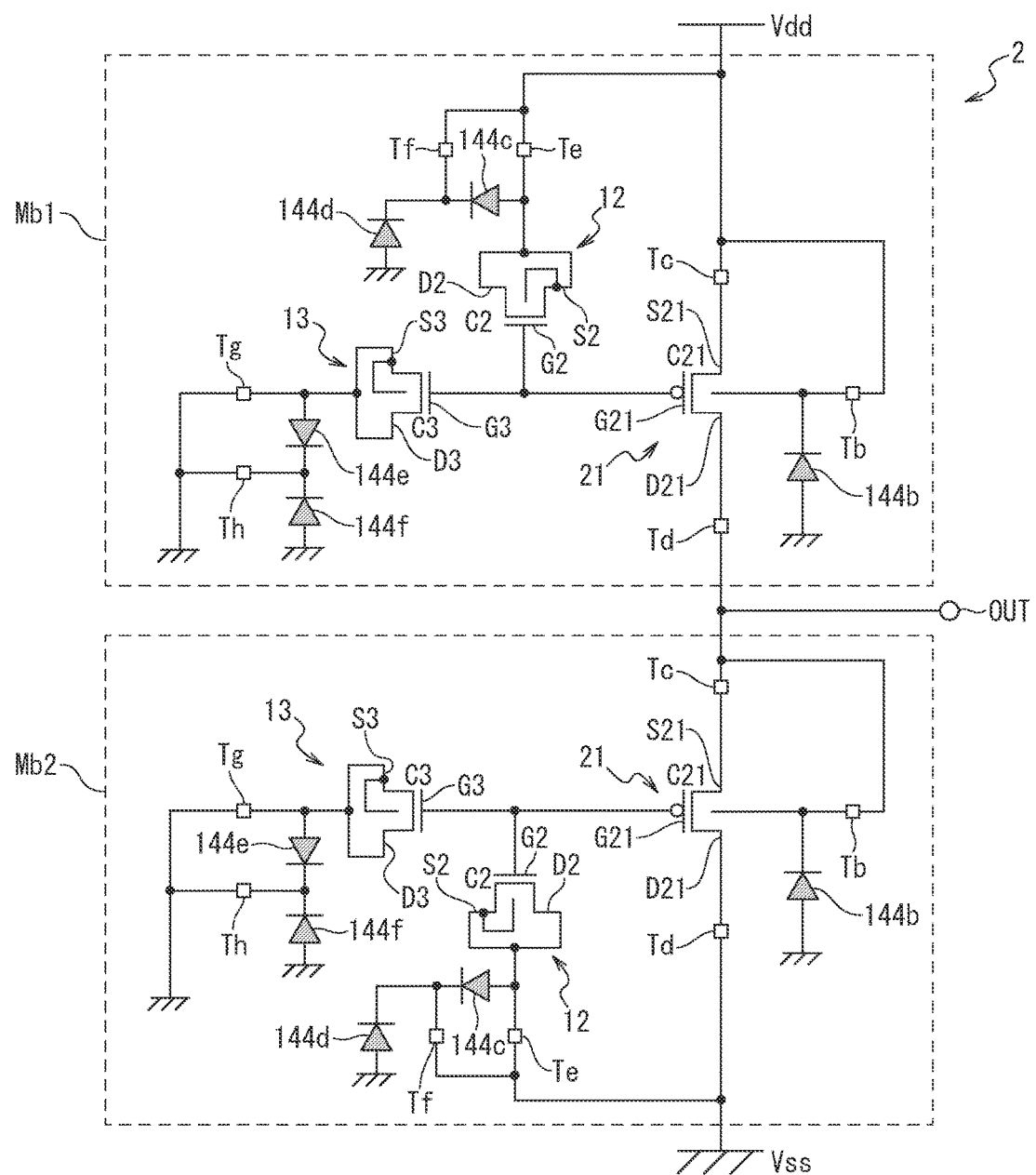
FIG. 39 is a diagram specifically representing a circuit structure for illustrating the reference voltage generation circuit 2 according to the second embodiment of the invention.

Furthermore, the drain region D21 of the nonvolatile storage element Mb1 and the source region S21 of the nonvolatile storage element Mb2 are connected to each other via the terminal Td and the terminal Tc. To a connection portion between the drain D21 and the source region S21 is connected the voltage output terminal OUT. In FIG. 39, the terminal Ta and the terminals Tb to Tf are illustrated in such a manner as to provide a clear comparison with FIG. 37. However, in the reference voltage generation circuit 2, the respective regions, such as the source regions, the drain regions, and the floating gates, provided in each of the nonvolatile storage element Mb1 and the nonvolatile storage element Mb2 may obviously be connected not via the terminals but directly by predetermined electrode plugs or wiring.

In the reference voltage generation circuit 2, the nonvolatile storage element Mb2 on the lower stage side (the low voltage supply terminal Vss side) is adjusted into an enhancement state, and the nonvolatile storage element Mb1 on the upper stage side (the high voltage supply terminal Vdd side) is adjusted into a depletion state. The nonvolatile storage elements Mb1 and Mb2 both include a control gate (for example, the P-well region 122 of the control gate area CGA) and floating gates (for example, the floating gates G21, G2, and G3 of the respective areas). Thereby, the nonvolatile storage elements Mb1 and Mb2 can perform writing and erasing, and can hold a rewritten state for a long period. Since the MOS transistor 21 is formed of a PMOS transistor, the threshold voltage of the depletion type transistor is positive, and the threshold voltage of the enhancement type transistor is negative. Thus, the plurality of nonvolatile storage elements Mb1 and Mb2 provided in the reference voltage generation circuit 2 of the present embodiment include at least the nonvolatile storage element Mb1 having a positive threshold voltage and the nonvolatile storage element Mb2 having a negative threshold voltage.

An element area of each of the nonvolatile storage elements Mb1 and Mb2 provided in the reference voltage generation circuit 2 may be from 1000 $\mu m^2$ to 1 $mm^2$. The nonvolatile storage elements Mb1 and Mb2 do not have any array structure, even when having any such element area.

Constituent elements of the reference voltage generation circuit 2 can be made to correspond as follows.

The MOS transistor 21 of the nonvolatile storage element Mb1 corresponds to one example of the first MOS transistor. The source region S21 of the MOS transistor 21 of the nonvolatile storage element Mb1 corresponds to one example of the first source terminal. The drain region D21 of the MOS transistor 21 of the nonvolatile storage element Mb1 corresponds to one example of the first drain terminal. The gate G21 of the MOS transistor 21 of the nonvolatile storage element Mb1 corresponds to one example of the first gate terminal.

The MOS transistor 12 of the nonvolatile storage element Mb1 corresponds to one example of the second MOS transistor. The source region S2 of the MOS transistor 12 of the nonvolatile storage element Mb1 corresponds to one example of the second source terminal. The drain region D2 of the MOS transistor 12 of the nonvolatile storage element Mb1 corresponds to one example of the second drain terminal. The gate G2 of the MOS transistor 12 of the nonvolatile storage element Mb1 corresponds to one example of the second gate terminal. The P-well region 122 of the nonvolatile storage element Mb1 corresponds to one example of the second bulk terminal.

The MOS transistor 21 of the nonvolatile storage element Mb2 corresponds to one example of the third MOS transistor. The source region S21 of the MOS transistor 21 of the nonvolatile storage element Mb2 corresponds to one example of the third source terminal. The drain region D21 of the MOS transistor 21 of the nonvolatile storage element Mb2 corresponds to one example of the third drain terminal.

The gate G21 of the MOS transistor 21 of the nonvolatile storage element Mb2 corresponds to one example of the third gate terminal.

The MOS transistor 12 of the nonvolatile storage element Mb2 corresponds to one example of the fourth MOS transistor. The source region S2 of the MOS transistor 12 of the nonvolatile storage element Mb2 corresponds to one example of the fourth source terminal. The drain region D2 of the MOS transistor 12 of the nonvolatile storage element Mb2 corresponds to one example of the fourth drain terminal. The gate G2 of the MOS transistor 12 of the nonvolatile storage element Mb2 corresponds to one example of the fourth gate terminal. The P-well region 122 of the nonvolatile storage element Mb2 corresponds to one example of the fourth bulk terminal.

In the reference voltage generation circuit 2, the MOS transistor 21 of the nonvolatile storage elements Mb1, Mb2 is a P-channel MOS transistor, and the low voltage supply terminal Vss has a lower voltage than the voltage of the high voltage supply terminal Vdd. Thus, in the reference voltage generation circuit 2, the high voltage supply terminal Vdd corresponds to one example of the second power source terminal, and the low voltage supply terminal Vss corresponds to one example of the first power source terminal. Furthermore, in the reference voltage generation circuit 2, the drain region D21 of the MOS transistor 21 of the nonvolatile storage element Mb2 is connected to the low voltage supply terminal Vss via the terminal Td, and the source region S21 of the MOS transistor 21 of the nonvolatile storage element Mb1 is connected to the high voltage supply terminal Vdd via the terminal Tc. The drain region D21 of the MOS transistor 21 of the nonvolatile storage element Mb1 is connected to the source region S21 of the MOS transistor 21 of the nonvolatile storage element Mb2 via the terminals Td and Tc.

Figure 40:
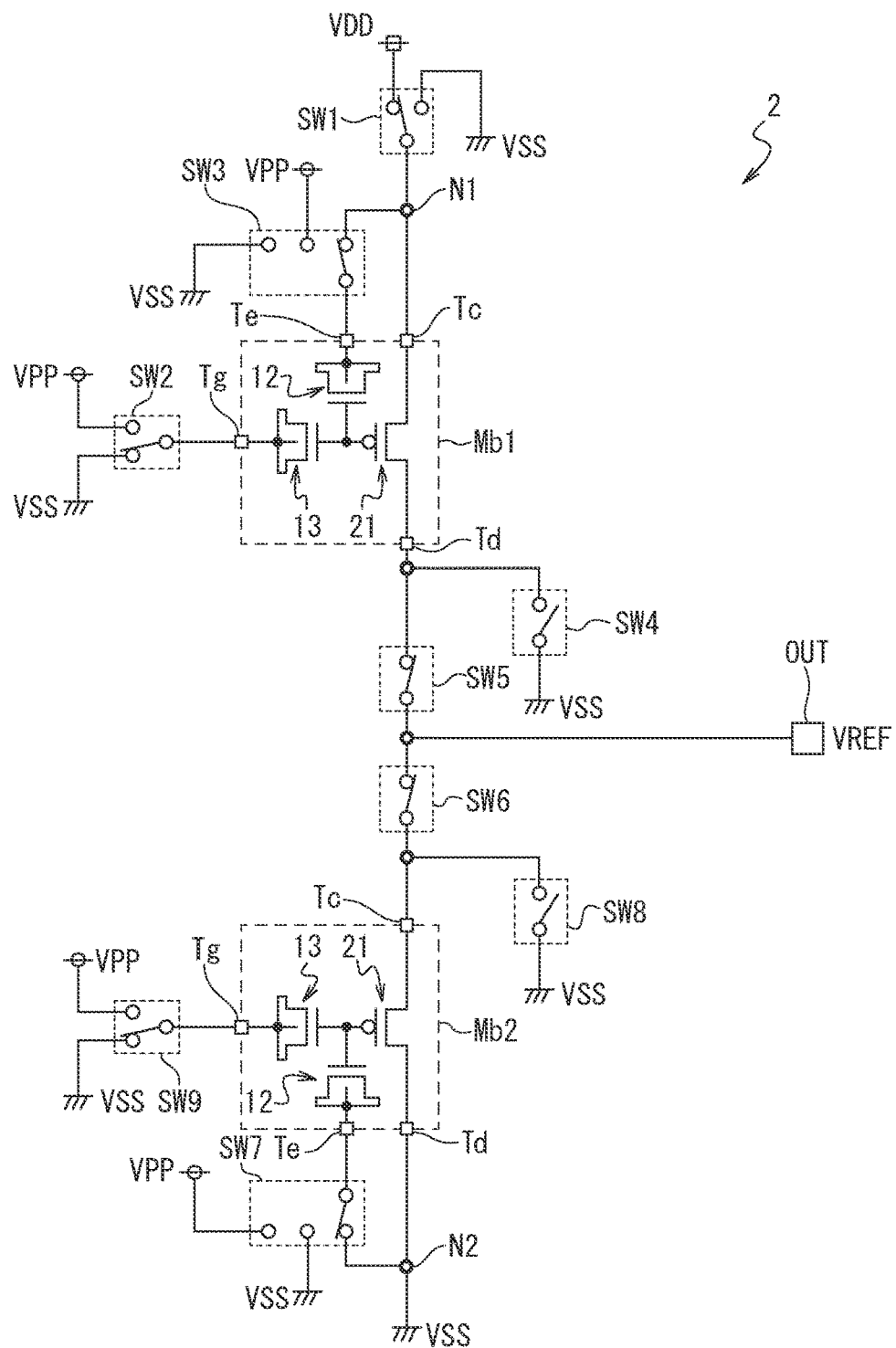
FIG. 40 is a structural diagram illustrating an actual circuit example of the reference voltage generation circuit 2 according to the second embodiment of the invention.

FIG. 40 is a structural diagram illustrating an actual circuit example of the reference voltage generation circuit 2 using the nonvolatile storage elements Mb1 and Mb2 (a diagram corresponding to FIG. 9 of the first embodiment).

The states of switches SW1 to SW9 in a state where the reference voltage generation circuit 2 illustrated in FIG. 40 outputs the reference voltage VREF from the voltage output terminal OUT are as follows:

SW1: VDD
SW2: VSS
SW3: ON-state (connected to a connection node N1 between one terminal of the switch SW1 and the terminal Tc)
SW4: OFF-state (open)
SW5: ON-state (connected)
SW6: ON-state (connected)
SW7: ON-state (connected to a connection node N2 between one of three terminals of the switch SW7 and the terminal Td)
SW8: OFF-state (open)
SW9: VSS When the nonvolatile storage element Mb1 is in a depletion state and the nonvolatile storage element Mb2 is in an enhancement state in the state illustrated in FIG. 40, a reference voltage VREF is generated. In other words, the reference voltage generation circuit 2 according to the present embodiment includes switching portions configured to set each of the terminals of the MOS transistors 21, 12, and 13 of the nonvolatile storage element Mb1 and the MOS transistors 21, 12, and 13 of the nonvolatile storage element Mb2 to a desired potential.

By performing the same adjustment sequences as those of the first example of the first embodiment in the structure illustrated in FIG. 40, the reference voltage generation circuit 2 can rewrite the threshold voltages of the nonvolatile storage elements Mb1 and Mb2 by injecting electric charge into the floating gates. In this manner, the reference voltage generation circuit 2 can optionally output a highly precise reference voltage from the voltage output terminal OUT. Note that since the adjustment sequences are the same as those of the example 1 of the first embodiment, description thereof will be omitted.

[Third Embodiment]

Figure 41:
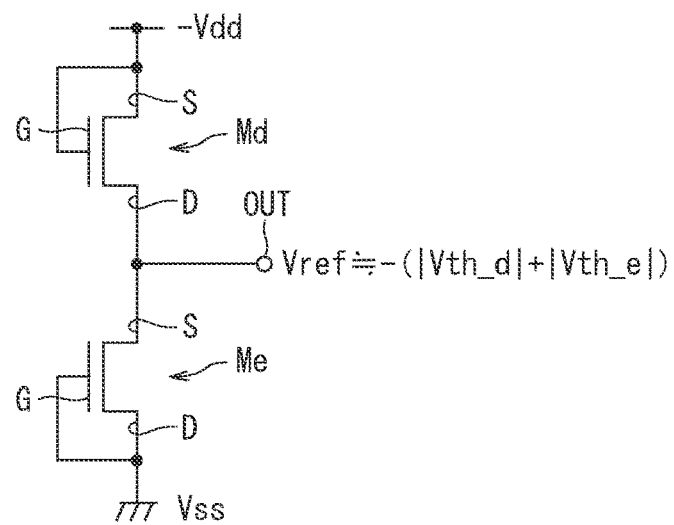
FIG. 41 is a circuit structural diagram of a negative reference voltage generation circuit using NMOS transistors.

A reference voltage generation circuit according to a third embodiment of the invention will be described with reference to FIG. 1 and FIG. 41 to FIG. 44. The reference voltage generation circuits 1 and 2 according to the first embodiment and the second embodiment are configured to generate a positive reference voltage, whereas the reference voltage generation circuit according to the third embodiment is configured to generate a negative reference voltage. As illustrated in FIG. 41, the reference voltage generation circuit includes a structure in which a plurality of NMOS transistors are connected in series between a negative voltage supply terminal −Vdd configured to supply a negative voltage when generating a negative reference voltage and a low voltage supply terminal Vss. Note that the sign "−Vdd" is also used as the sign of a negative voltage output from the negative voltage supply terminal −Vdd.

The reference voltage generation circuit according to the present embodiment is a circuit configured to generate a reference voltage by using a plurality of the nonvolatile storage elements Ma (see FIG. 1) configured to operate as the single-layer polysilicon type NMOS transistors. The reference voltage generation circuit according to the present embodiment uses the nonvolatile storage elements Ma by bringing into two states: enhancement type transistor(s) and depletion type transistor(s). The nonvolatile storage element(s) Ma used as the enhancement type transistor(s) and the nonvolatile storage element(s) Ma used as the depletion type transistor(s) are the same in size and structure as element.

The reference voltage generation circuit according to the present embodiment is a circuit configured to eliminate manufacturing variation in reference voltage that occurs due to difference of characteristics between respective circuit elements forming the circuit. The reference voltage generation circuit according to the present embodiment includes at least one or more depletion type transistors and at least one or more enhancement type transistors to which a current that is the same as or relevant to a current that flows to the depletion type transistors flows. The one or more depletion type transistors and the one or more enhancement type transistors forming the reference voltage generation circuit according to the present embodiment are nonvolatile storage elements configured to operate as single-layer polysilicon type NMOS transistors.

Figure 42:
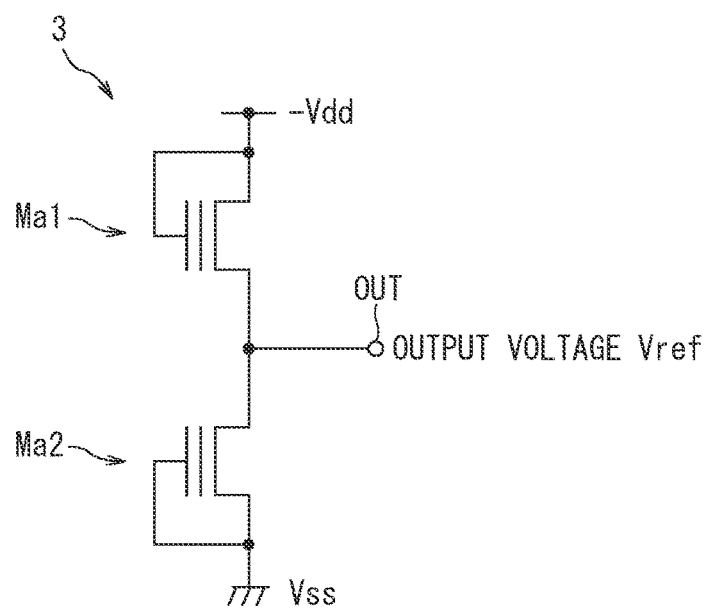
FIG. 42 is a diagram for illustrating a reference voltage generation circuit 3 according to a third embodiment of the invention, the diagram simply representing the circuit structure of the reference voltage generation circuit 3 configured to generate a negative reference voltage.

As illustrated in FIG. 42, a reference voltage generation circuit 3 according to the present embodiment includes a plurality of (two in the present example) nonvolatile storage elements Ma1 and Ma2. In FIG. 42, the nonvolatile storage elements Ma1 and Ma2 are simply represented, but actually have the structure illustrated in FIG. 1. When the reference voltage generation circuit 3 illustrated in FIG. 42 is represented by using the nonvolatile storage element Ma illustrated in FIG. 1, the circuit 3 can be represented as in a structure illustrated in FIG. 43. The nonvolatile storage elements Ma1 and Ma2, respectively, correspond to the nonvolatile storage element Ma illustrated in FIG. 1. At least some (all in the present example) of the plurality of nonvolatile storage elements Ma1 and Ma2 are connected in series. To a connection portion between the plurality of nonvolatile storage elements Ma1 and Ma2 connected in series is connected to a voltage output terminal OUT from which a reference voltage Vref is output. The nonvolatile storage elements Ma1 and Ma2 are driven by the MOS transistor 11 of the MOSFET area MFA during circuit operation, and therefore both operate as transistors.

The nonvolatile storage elements Ma1 and Ma2 are connected in series between the negative high voltage supply terminal −Vdd to which a negative high voltage is supplied and a low voltage supply terminal Vss to which a low voltage is supplied. The source region S1 of the nonvolatile storage element Ma1 is connected to the negative high voltage supply terminal −Vdd via the terminal Tc, and the drain region D1 of the nonvolatile storage element Ma2 is connected to the low voltage supply terminal Vss via the terminal Td. The source region S1 of the nonvolatile storage element Ma1 and the source region S2, the drain region D2, and the P+ regions 124a and 124b (see FIG. 1) of the nonvolatile storage element Ma1 are connected to each other via the terminal Tc and the terminal Te. The drain region D1 of the nonvolatile storage element Ma2 and the source region S2, the drain region D2, and the P+ regions 124a and 124b (see FIG. 1) of the nonvolatile storage element Ma2 are connected to each other via the terminal Td and the terminal Te.

Figure 43:
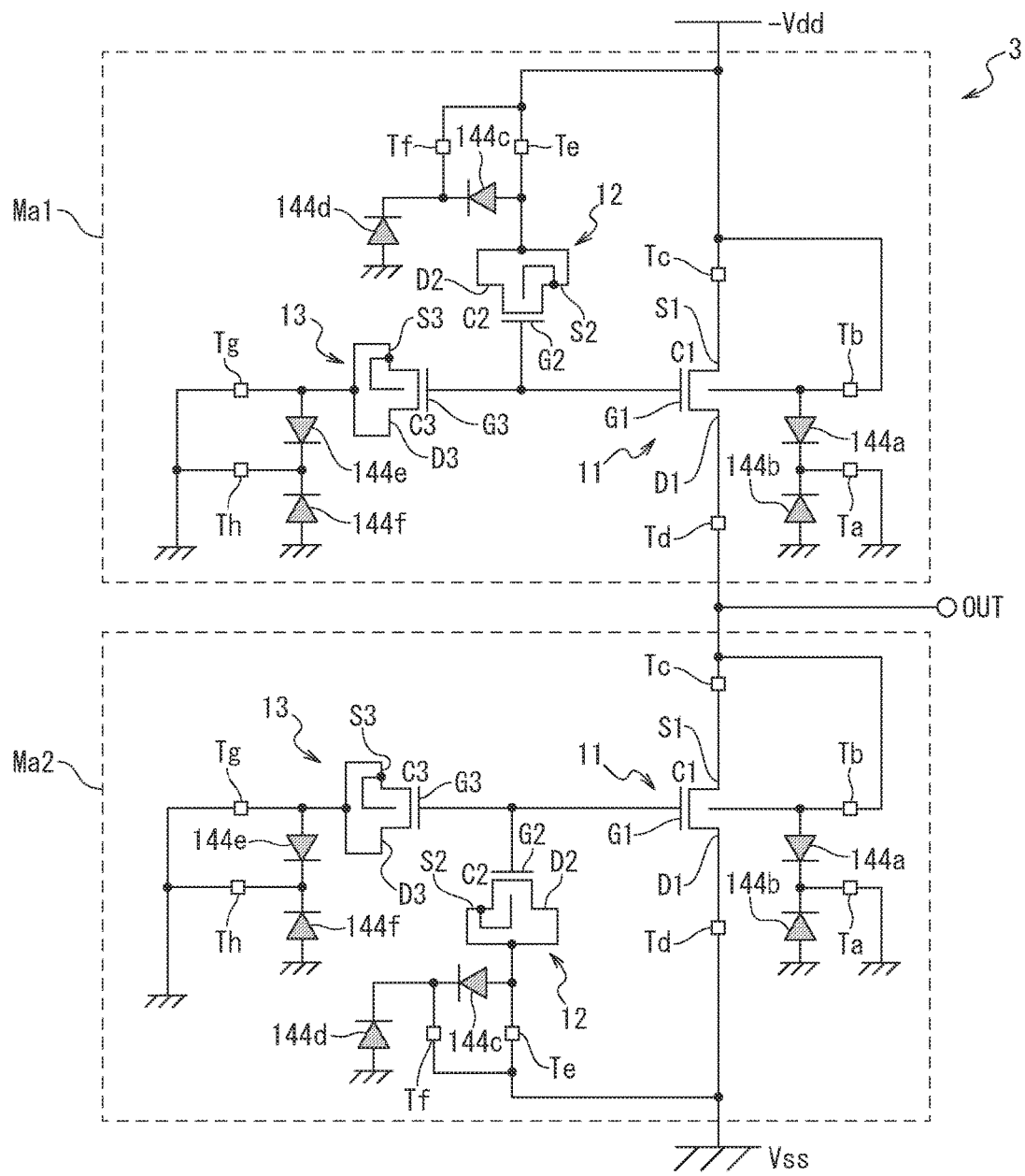
FIG. 43 is a diagram specifically representing the circuit structure of the reference voltage generation circuit 3 according to the third embodiment of the invention.

Furthermore, the drain region D1 of the nonvolatile storage element Ma1 and the source region S1 of the nonvolatile storage element Ma2 are connected to each other via the terminal Td and the terminal Tc. To a connection portion between the drain D1 and the source region S1 is connected the voltage output terminal OUT. In FIG. 43, the terminals Ta to Tf are illustrated in such a manner as to provide a clear comparison with FIG. 1. However, in the reference voltage generation circuit 3, the respective regions, such as the source regions, the drain regions, and the floating gates, provided in each of the nonvolatile storage element Ma1 and the nonvolatile storage element Ma2 may obviously be connected not via the terminals but directly by predetermined electrode plugs or wiring.

In the reference voltage generation circuit 3, the nonvolatile storage element Ma2 on the lower stage side (the low voltage supply terminal Vss side) is adjusted into an enhancement state, and the nonvolatile storage element Ma1 on the upper stage side (the negative high voltage supply terminal −Vdd side) is adjusted into a depletion state. The nonvolatile storage elements Ma1 and Ma2 both include a control gate (for example, the P-well region 122 of the control gate area CGA) and floating gates (for example, floating gates G1, G2, and G3 of the respective areas). Thereby, the nonvolatile storage elements Ma1 and Ma2 can perform writing and erasing, and can hold a rewritten state for a long period. The threshold voltage of the depletion type transistor is negative, and the threshold voltage of the enhancement type transistor is positive. Thus, the plurality of nonvolatile storage elements Ma1 and Ma2 provided in the reference voltage generation circuit 3 of the present embodiment include at least the nonvolatile storage element Ma1 having a negative threshold voltage and the nonvolatile storage element Ma2 having a positive threshold voltage.

An element area of each of the nonvolatile storage elements Ma1 and Ma2 provided in the reference voltage generation circuit 3 may be from 1000 µm² to 1 mm². The nonvolatile storage elements Ma1 and Ma2 do not have any array structure, even when having any such element area.

Constituent elements of the reference voltage generation circuit 3 can be made to correspond as follows.

The MOS transistor 11 of the nonvolatile storage element Ma2 corresponds to one example of the first MOS transistor. The source region S1 of the MOS transistor 11 of the nonvolatile storage element Ma2 corresponds to one example of the first source terminal. The drain region D1 of the MOS transistor 11 of the nonvolatile storage element Ma2 corresponds to one example of the first drain terminal. The floating gate G1 of the MOS transistor 11 of the nonvolatile storage element Ma2 corresponds to one example of the first gate terminal.

The MOS transistor 12 of the nonvolatile storage element Ma2 corresponds to one example of the second MOS transistor. The source region S2 of the MOS transistor 12 of the nonvolatile storage element Ma2 corresponds to one example of the second source terminal. The drain region D2 of the MOS transistor 12 of the nonvolatile storage element Ma2 corresponds to one example of the second drain terminal. The floating gate G2 of the MOS transistor 12 of the nonvolatile storage element Ma2 corresponds to one example of the second gate terminal. The P-well region 122 of the nonvolatile storage element Ma2 corresponds to one example of the second bulk terminal.

The MOS transistor 11 of the nonvolatile storage element Ma1 corresponds to one example of the third MOS transistor. The source region S1 of the MOS transistor 11 of the nonvolatile storage element Ma1 corresponds to one example of the third source terminal. The drain region D1 of the MOS transistor 11 of the nonvolatile storage element Ma1 corresponds to one example of the third drain terminal. The floating gate G1 of the MOS transistor 11 of the nonvolatile storage element Ma1 corresponds to one example of the third gate terminal.

The MOS transistor 12 of the nonvolatile storage element Ma1 corresponds to one example of the fourth MOS transistor. The source region S2 of the MOS transistor 12 of the nonvolatile storage element Ma1 corresponds to one example of the fourth source terminal. The drain region D2 of the MOS transistor 12 of the nonvolatile storage element Ma1 corresponds to one example of the fourth drain terminal. The floating gate G2 of the MOS transistor 12 of the nonvolatile storage element Ma1 corresponds to one example of the fourth gate terminal. The P-well region 122 of the nonvolatile storage element Ma1 corresponds to one example of the fourth bulk terminal.

In the reference voltage generation circuit 3, the MOS transistors 11 of the nonvolatile storage elements Ma1 and Ma2 are N-channel MOS transistors, and the low voltage supply terminal Vss has a higher voltage than the voltage of the negative high voltage supply terminal −Vdd. Thus, in the reference voltage generation circuit 3, the low voltage supply terminal Vss corresponds to one example of the first power source terminal, and the negative high voltage supply terminal −Vdd corresponds to one example of the second power source terminal. Furthermore, in the reference voltage generation circuit 3, the drain region D1 of the MOS transistor 11 of the nonvolatile storage element Ma2 is connected to the low voltage supply terminal Vss via the terminal Td, and the source region S1 of the MOS transistor 11 of the nonvolatile storage element Ma1 is connected to the negative voltage supply terminal −Vdd via the terminal Tc. The source region S1 of the MOS transistor 11 of the nonvolatile storage element Ma2 is connected to the drain region D1 of the MOS transistor 11 of the nonvolatile storage element Ma1 via the terminals Tc and Td.

Figure 44:
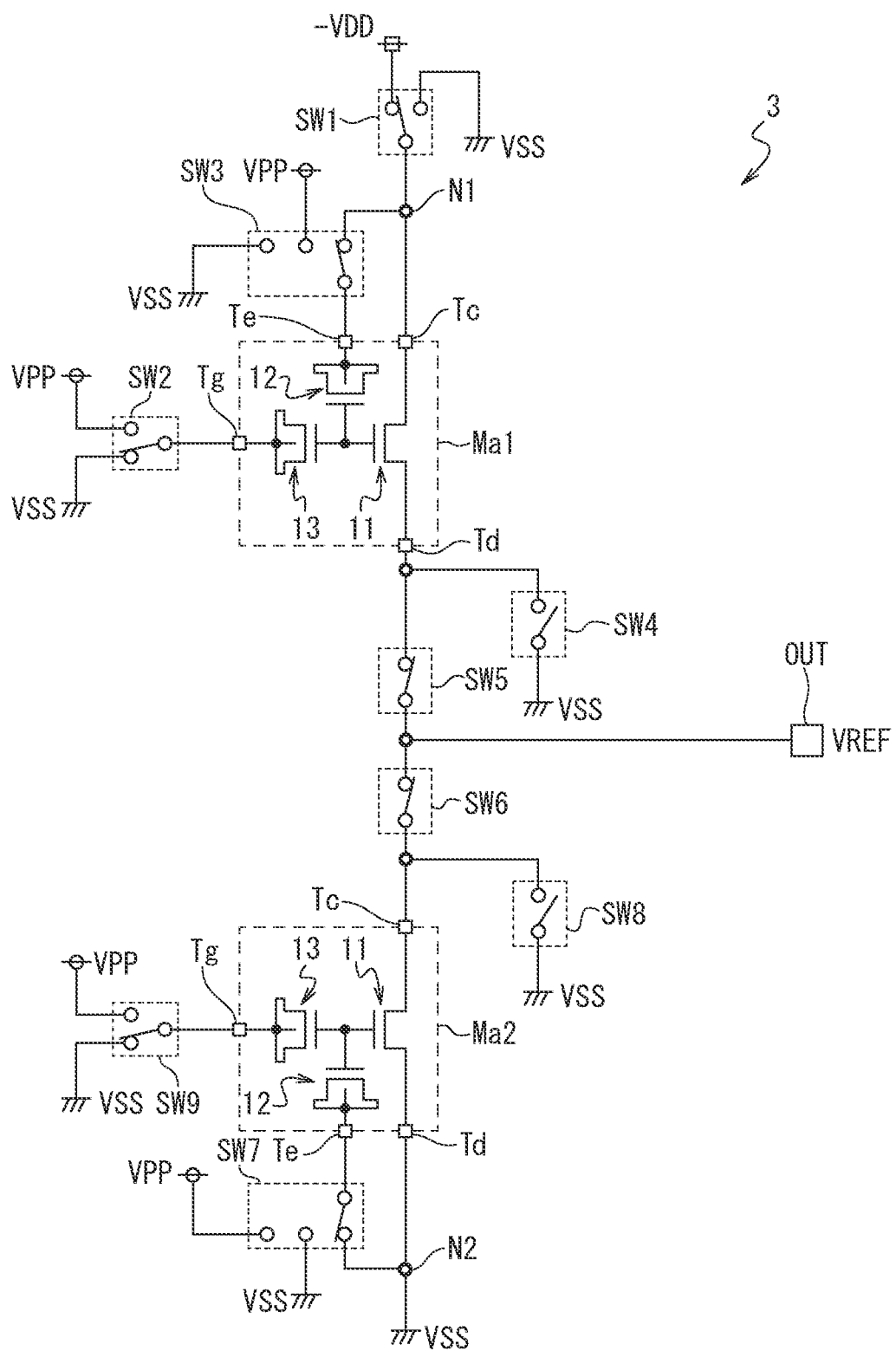
FIG. 44 is a structural diagram illustrating an actual circuit example of the reference voltage generation circuit 3 according to the third embodiment of the invention.

FIG. 44 is a structural diagram illustrating an actual circuit example of the reference voltage generation circuit 3 configured to use the nonvolatile storage elements Ma1 and Ma2 to output a negative reference voltage (a diagram corresponding to FIG. 9 of the first embodiment).

The states of switches SW1 to SW9 in a state where the reference voltage generation circuit 3 illustrated in FIG. 44 outputs a negative reference voltage VREF from the voltage output terminal OUT are as follows:

SW1: −VDD
SW2: VSS
SW3: ON-state (connected to a connection node N1 between one terminal of the switch SW1 and the terminal Tc)
SW4: OFF-state (open)
SW5: ON-state (connected)
SW6: ON-state (connected)
SW7: ON-state (connected to a connection node N2 between one of three terminals of the switch SW7 and the terminal Td)
SW8: OFF-state (open)
SW9: VSS When the nonvolatile storage element Ma1 is in a depletion state and the nonvolatile storage element Ma2 is in an enhancement state in the state illustrated in FIG. 44, a negative reference voltage VREF is generated. In other words, the reference voltage generation circuit 3 according to the present embodiment includes switching portions configured to set each of the terminals of the MOS transistors 11, 12, and 13 of the nonvolatile storage element Ma1 and the MOS transistors 11, 12, and 13 of the nonvolatile storage element Ma2 to a desired potential.

By performing the same adjustment sequences as those of the first example of the first embodiment in the structure illustrated in FIG. 44, the reference voltage generation circuit 3 can rewrite the threshold voltages of the nonvolatile storage elements Ma1 and Ma2 by injecting electric charge into the floating gates. In this manner, the reference voltage generation circuit 3 can optionally output a highly precise reference voltage from the voltage output terminal OUT. Note that since the adjustment sequences are the same as those of the example 1 of the first embodiment, description thereof will be omitted.

[Fourth Embodiment]

Figure 45:
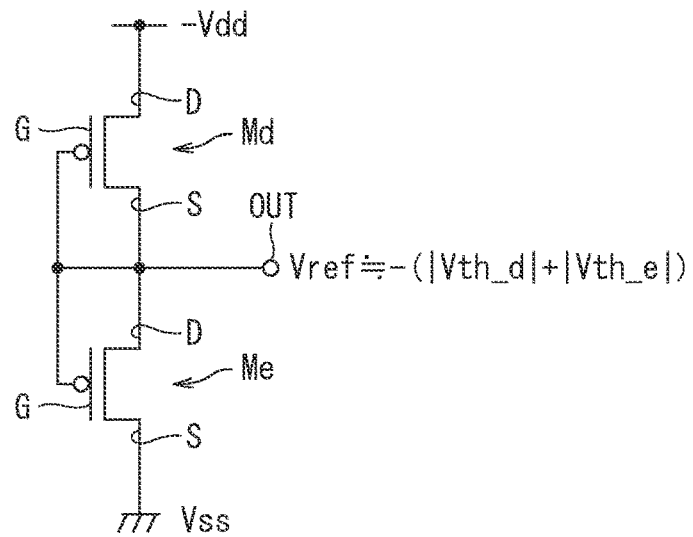
FIG. 45 is a circuit structural diagram of a reference voltage generation circuit configured to use PMOS transistors to generate a negative reference voltage.

A reference voltage generation circuit according to a fourth embodiment of the invention will be described with reference to FIG. 37 and FIG. 45 to FIG. 48. The reference voltage generation circuit according to the fourth embodiment is characterized in that the circuit has a circuit structure different from the reference voltage generation circuit 3 according to the third embodiment, and can generate a negative reference voltage. As illustrated in FIG. 45, the reference voltage generation circuit according to the present embodiment configured to generate a negative reference voltage has a structure in which a plurality of PMOS transistors are connected in series between the negative high voltage supply terminal −Vdd and the low voltage supply terminal Vss.

The reference voltage generation circuit according to the present embodiment is a circuit configured to generate a reference voltage by using a plurality of nonvolatile storage elements Mb (see FIG. 37) configured to operate as single-layer polysilicon type PMOS transistors. The reference voltage generation circuit according to the present embodiment uses the nonvolatile storage elements Mb by bringing into two states: enhancement type transistor(s) and depletion type transistor(s). The nonvolatile storage element(s) Mb used as the enhancement type transistor(s) and the nonvolatile storage element(s) Mb used as the depletion type transistor(s) are same in size and structure as element.

The reference voltage generation circuit according to the present embodiment is a circuit configured to eliminate manufacturing variation in reference voltage that occurs due to difference of characteristics between respective circuit elements forming the circuit. The reference voltage generation circuit according to the present embodiment includes at least one or more depletion type transistors and at least one or more enhancement type transistors to which a current flows that is the same as or relevant to a current that flows to the depletion type transistor. The one or more depletion type transistors and the one or more enhancement type transistors forming the reference voltage generation circuit according to the present embodiment are nonvolatile storage elements configured to operate as single-layer polysilicon type PMOS transistors.

Figure 46:
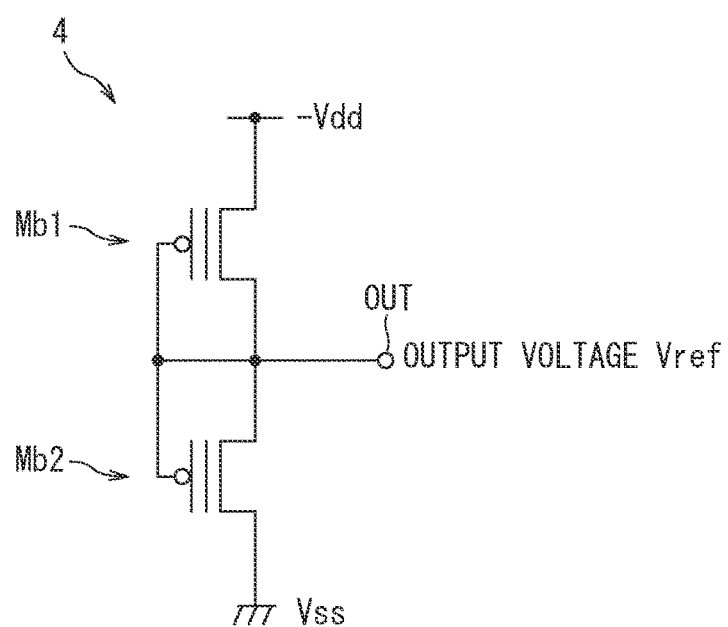
FIG. 46 is a diagram for illustrating a reference voltage generation circuit 4 according to a fourth embodiment of the invention, the diagram simply representing a circuit structure of the reference voltage generation circuit 4 configured to generate a negative reference voltage.
Figure 47:
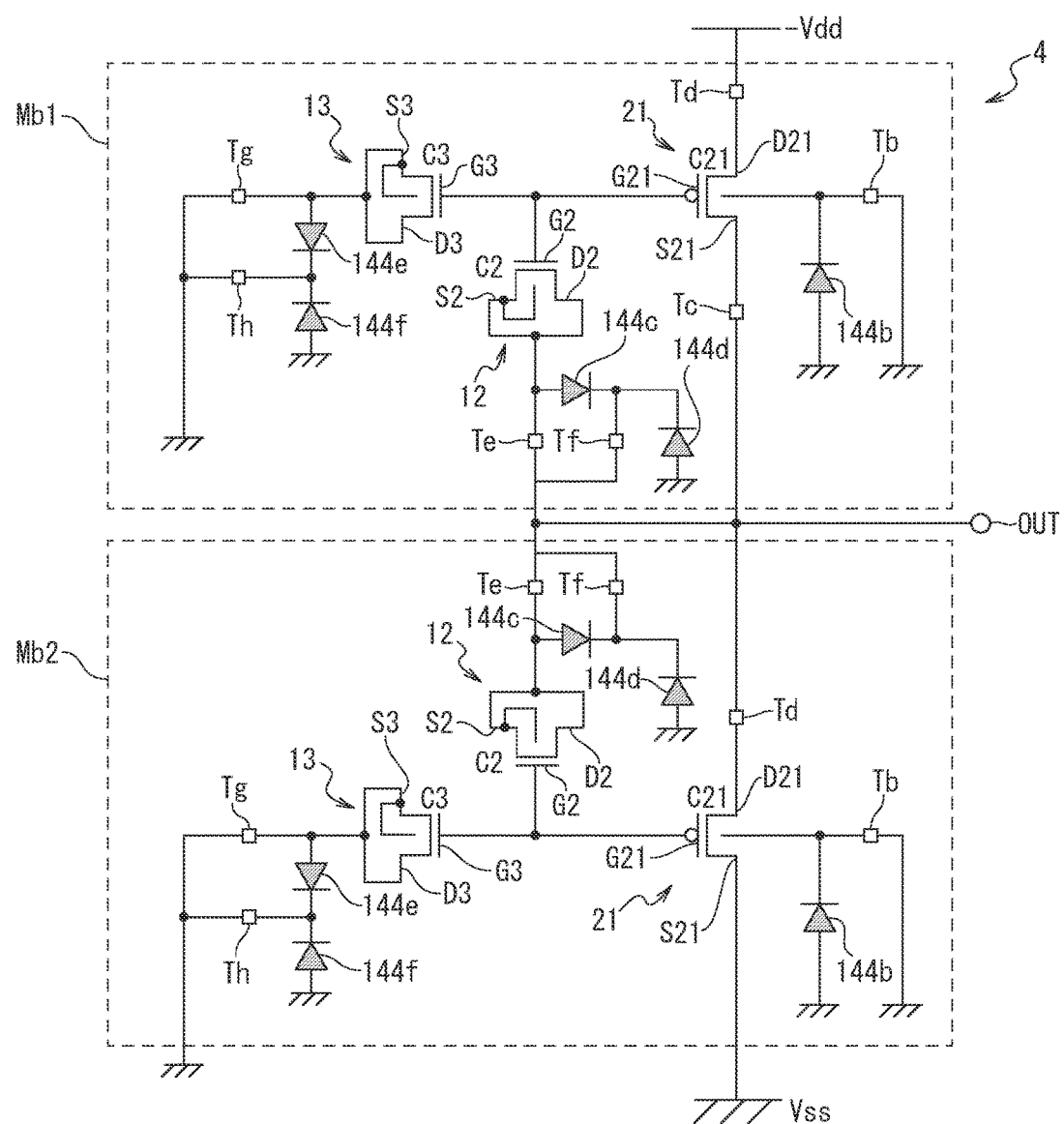
FIG. 47 is a diagram specifically representing the circuit structure of the reference voltage generation circuit 4 according to the fourth embodiment of the invention.

As illustrated in FIG. 46, a reference voltage generation circuit 4 according to the present embodiment includes a plurality of (two in the present example) nonvolatile storage elements Mb1 and Mb2. In FIG. 46, the nonvolatile storage elements Mb1 and Mb2 are simply represented, but actually have the structure illustrated in FIG. 37. When the reference voltage generation circuit 4 illustrated in FIG. 46 is represented by using the nonvolatile storage element Mb illustrated in FIG. 37, the circuit 4 can be represented as in a structure illustrated in FIG. 47. The nonvolatile storage elements Mb1 and Mb2, respectively, correspond to the nonvolatile storage element Mb illustrated in FIG. 37. At least some (all in the present example) of the plurality of nonvolatile storage elements Mb1 and Mb2 are connected in series. To a connection portion between the plurality of nonvolatile storage elements Mb1 and Mb2 connected in series is connected a voltage output terminal OUT from which a reference voltage Vref is output. The nonvolatile storage elements Mb1 and Mb2 are driven by the MOS transistor 21 of the MOSFET area MFA during circuit operation, and therefore both operate as transistors.

The nonvolatile storage elements Mb1 and Mb2 are connected in series between the negative high voltage supply terminal −Vdd to which a negative high voltage is supplied and a low voltage supply terminal Vss to which a low voltage is supplied. The drain region D21 of the nonvolatile storage element Mb1 is connected to the negative high voltage supply terminal −Vdd via the terminal Td, and the source region S21 of the nonvolatile storage element Mb2 is connected to the low voltage supply terminal Vss via the terminal Tc. The source region S21 of the nonvolatile storage element Mb1 and the source region S2, the drain region D2, and the P+ regions 124a and 124b (see FIG. 37) of the nonvolatile storage element Mb1 are connected to each other via the terminal Tc and the terminal Te. The drain region D21 of the nonvolatile storage element Mb2 and the source region S2, the drain region D2, and the P+ regions 124a and 124b (see FIG. 37) of the nonvolatile storage element Mb2 are connected to each other via the terminal Td and the terminal Te.

Furthermore, the source region S21 of the nonvolatile storage element Mb1 and the drain region D21 of the nonvolatile storage element Mb2 are connected to each other via the terminal Tc and the terminal Td. To the connection portion between the source region S21 of the nonvolatile storage element Mb1 and the drain region D21 of the nonvolatile storage element Mb2 is connected the voltage output terminal OUT.

In the reference voltage generation circuit 4, the nonvolatile storage element Mb2 on the lower stage side (the low voltage supply terminal Vss side) is adjusted into an enhancement state, and the nonvolatile storage element Mb1 on the upper stage side (the negative high voltage supply terminal −Vdd side) is adjusted into a depletion state. The nonvolatile storage elements Mb1 and Mb2 both include a control gate (for example, the P-well region 122 of the control gate area CGA) and floating gates (for example, the floating gates G21, G2, and G3 of the respective areas). Thereby, the nonvolatile storage elements Mb1 and Mb2 can perform writing and erasing, and can hold a rewritten state for a long period. Since the MOS transistor 21 is formed of a PMOS transistor, the threshold voltage of the depletion type transistor is positive, and the threshold voltage of the enhancement type transistor is negative. Thus, the plurality of nonvolatile storage elements Mb1 and Mb2 provided in the reference voltage generation circuit 4 of the present embodiment include at least the nonvolatile storage element Mb1 having a positive threshold voltage and the nonvolatile storage element Mb2 having a negative threshold voltage.

An element area of each of the nonvolatile storage elements Mb1 and Mb2 provided in the reference voltage generation circuit 4 may be from 1000 μm² to 1 mm². The nonvolatile storage elements Mb1 and Mb2 do not have any array structure, even when having any such element area.

Constituent elements of the reference voltage generation circuit 4 can be made to correspond as follows.

The MOS transistor 21 of the nonvolatile storage element Mb2 corresponds to one example of the first MOS transistor. The source region S21 of the MOS transistor 21 of the nonvolatile storage element Mb2 corresponds to one example of the first source terminal. The drain region D21 of the MOS transistor 21 of the nonvolatile storage element Mb2 corresponds to one example of the first drain terminal. The floating gate G21 of the MOS transistor 21 of the nonvolatile storage element Mb2 corresponds to one example of the first gate terminal.

The MOS transistor 12 of the nonvolatile storage element Mb2 corresponds to one example of the second MOS transistor. The source region S2 of the MOS transistor 12 of the nonvolatile storage element Mb2 corresponds to one example of the second source terminal. The drain region D2 of the MOS transistor 12 of the nonvolatile storage element Mb2 corresponds to one example of the second drain terminal. The floating gate G2 of the MOS transistor 12 of the nonvolatile storage element Mb2 corresponds to one example of the second gate terminal. The P-well region 122 of the nonvolatile storage element Mb2 corresponds to one example of the second bulk terminal.

The MOS transistor 21 of the nonvolatile storage element Mb1 corresponds to one example of the third MOS transistor. The source region S21 of the MOS transistor 21 of the nonvolatile storage element Mb1 corresponds to one example of the third source terminal. The drain region D21 of the MOS transistor 21 of the nonvolatile storage element Mb1 corresponds to one example of the third drain terminal. The floating gate G21 of the MOS transistor 21 of the nonvolatile storage element Mb1 corresponds to one example of the third gate terminal.

The MOS transistor 12 of the nonvolatile storage element Mb1 corresponds to one example of the fourth MOS transistor. The source region S2 of the MOS transistor 12 of the nonvolatile storage element Mb1 corresponds to one example of the fourth source terminal. The drain region D2 of the MOS transistor 12 of the nonvolatile storage element Mb1 corresponds to one example of the fourth drain terminal. The floating gate G2 of the MOS transistor 12 of the nonvolatile storage element Mb1 corresponds to one example of the fourth gate terminal. The P-well region 122 of the nonvolatile storage element Mb1 corresponds to one example of the fourth bulk terminal.

In the reference voltage generation circuit 4, the MOS transistors 21 of the nonvolatile storage elements Mb1 and Mb2 are P-channel MOS transistors, and the low voltage supply terminal Vss has a higher voltage than the voltage of the negative high voltage supply terminal −Vdd. Thus, in the reference voltage generation circuit 4, the low voltage supply terminal Vss corresponds to one example of the second power source terminal, and the negative high voltage supply terminal −Vdd corresponds to one example of the first power source terminal. Furthermore, in the reference voltage generation circuit 4, the drain region D21 of the MOS transistor 21 of the nonvolatile storage element Mb1 is connected to the negative high voltage supply terminal −Vdd via the terminal Td, and the source region S21 of the MOS transistor 21 of the nonvolatile storage element Mb2 is connected to the low voltage supply terminal Vss via the terminal Tc. The drain region D21 of the MOS transistor 21 of the nonvolatile storage element Mb2 is connected to the source region S21 of the MOS transistor 21 of the nonvolatile storage element Mb1 via the terminals Td and Tc.

Figure 48:
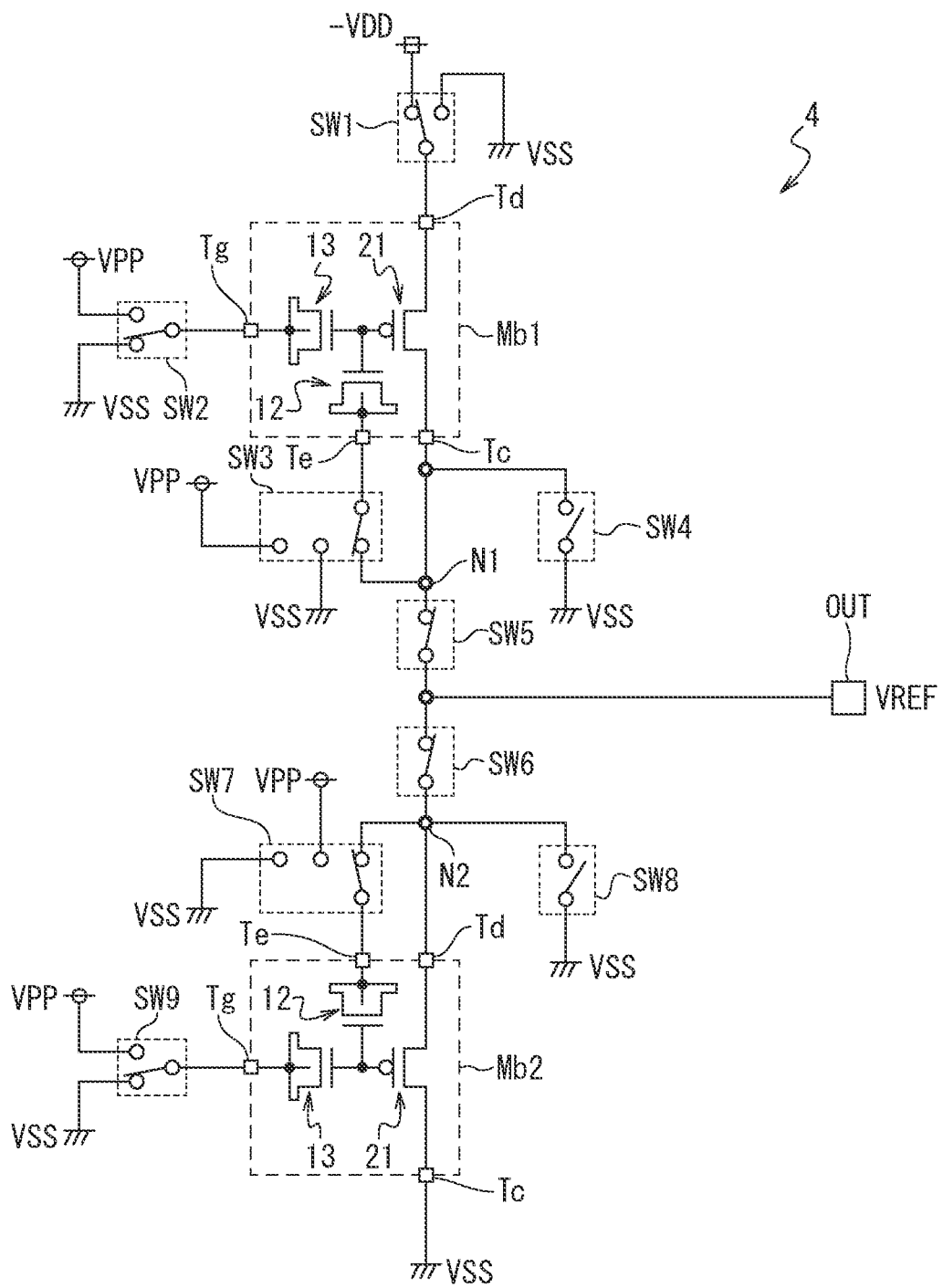
FIG. 48 is a structural diagram illustrating an actual circuit example of the reference voltage generation circuit 4 according to the fourth embodiment of the invention.

FIG. 48 is a structural diagram illustrating an actual circuit example of the reference voltage generation circuit 4 configured to use the nonvolatile storage elements Mb1 and Mb2 to output a negative reference voltage (a diagram corresponding to FIG. 9 of the first embodiment).

The states of switches SW1 to SW9 in a state where the reference voltage generation circuit 4 illustrated in FIG. 48 outputs a negative reference voltage VREF from the voltage output terminal OUT are as follows:

SW1: −VDD
SW2: VSS
SW3: ON-state (connected to a connection node N1 between one terminal of the switch SW5 and the terminal Tc)
SW4: OFF-state (open)
SW5: ON-state (connected)
SW6: ON-state (connected)
SW7: ON-state (connected to a connection node N2 between one terminal of the switch SW6 and the terminal Td)
SW8: OFF-state (open)
SW9: VSS When the nonvolatile storage element Mb1 is in a depletion state and the nonvolatile storage element Mb2 is in an enhancement state in the state illustrated in FIG. 48, a negative reference voltage VREF is generated. In other words, the reference voltage generation circuit 4 according to the present embodiment includes switching portions configured to set each of the terminals of the MOS transistors 21, 12, and 13 of the nonvolatile storage element Mb1 and the MOS transistors 21, 12, and 13 of the nonvolatile storage element Mb2 to a desired potential.

By performing the same adjustment sequences as those of the first example of the first embodiment in the structure illustrated in FIG. 48, the reference voltage generation circuit 4 can rewrite the threshold voltages of the nonvolatile storage elements Mb1 and Mb2 by injecting electric charge into the floating gates. In this manner, the reference voltage generation circuit 4 can optionally output a highly precise reference voltage from the voltage output terminal OUT.

Note that since the adjustment sequences are the same as those of the example 1 of the first embodiment, description thereof will be omitted.

[Fifth Embodiment]

Next will be a description of a reference voltage generation circuit using single-layer polysilicon nonvolatile storage elements having higher electric charge holding characteristics. Nonvolatile storage elements used in analog devices such as a reference voltage generation circuit require higher electric charge holding characteristics than nonvolatile storage elements treated as information of "1" or "0" in a nonvolatile memory or the like. In a fifth embodiment, polarities (P type/N type) of the floating gates of the nonvolatile storage elements described in the first to fourth embodiments are optimized to provide a reference voltage generation circuit excellent in electric charge holding characteristics. Hereinafter, a description will be given by exemplifying the structure of the reference voltage generation circuit according to the first embodiment. However, the same advantageous effects can also be obtained by applying the present embodiment to the structures of the reference voltage generation circuits according to the second to fourth embodiments.

The fifth embodiment optimizes the floating gate polarity of a nonvolatile storage element used as a depletion type transistor and the floating gate polarity of a nonvolatile storage element used as an enhancement type transistor, from the viewpoint of respective electric charge holding characteristics.

In the respective areas MFA, CGA, and CIA illustrated in FIG. 1, relationships between the floating gates and the electric charge holding characteristics will be as follows. The floating gate polarity of the MOSFET area MFA relates to the threshold voltage of the MOS transistor 11 in a state where there is no electric charge injected in the floating gate. Specifically, when the MOS transistor 11 is an NMOSFET, in the state where there is no electric charge injected in the floating gate G1, the threshold voltage of a P-type floating gate becomes higher by a work function difference (approximately 1 V) than that of an N-type floating gate if an impurity concentration in the P-well region 112 is equal. On the other hand, in general, the smaller the amount of electric charge injected into the floating gate, the higher the electric charge holding characteristics. Accordingly, by setting the threshold voltage in the state where there is no electric charge injected in the floating gate of the MOSFET to a value as close as possible to a desired value, the amount of electric charge to be injected in the floating gate can be reduced, so that excellent electric charge holding characteristics can be obtained.

Figure 49:
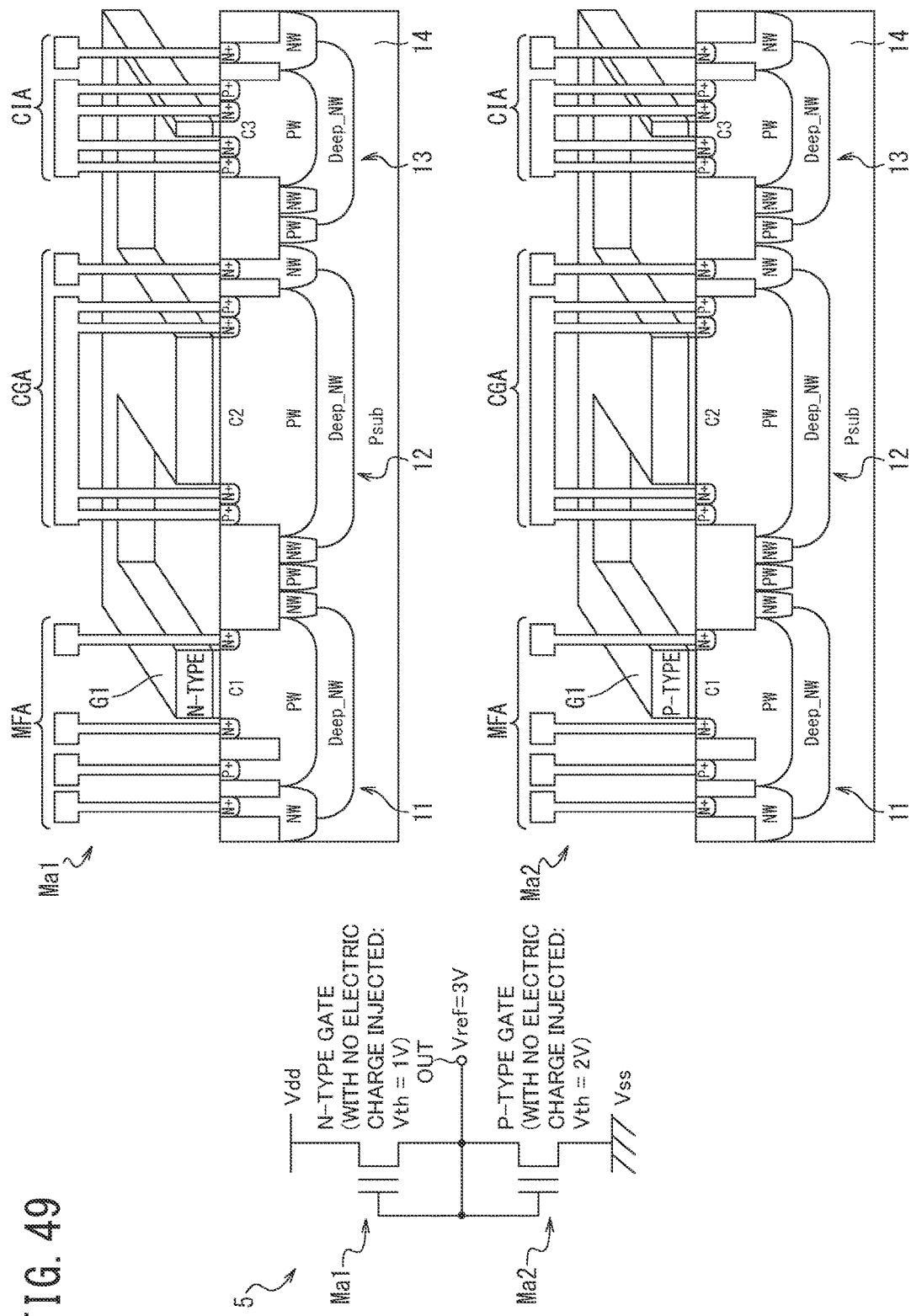
FIG. 49 is diagrams for illustrating floating gate polarities of MOSFET areas of nonvolatile storage elements Ma1 and Ma2 included in a reference voltage generation circuit 5 according to a fifth embodiment of the invention.

Here is an example of a case in which, for example, the threshold voltage in the state where there is no electric charge injected in the floating gate is 1 V when using the N-type floating gate, and 2 V when using the P-type floating gate. Using such a device, a reference voltage Vref of 3 V is output. When forming a reference voltage generation circuit 5 as illustrated in FIG. 49, a floating gate G1 of a nonvolatile storage element Ma1 (one example of a first nonvolatile storage element) used as a depletion type transistor is set to N type, and a floating gate G1 of a nonvolatile storage element Ma2 (one example of a second nonvolatile storage element) used as an enhancement type transistor is set to P type. Thereby, the reference voltage generation circuit 5 can have excellent electric charge holding characteristics. The reason for this will be as follows.

When 3 V as the reference voltage Vref is output while allowing a nA (nanoampere) order micro current to flow (in other words, when the MOS transistor 11 of each of the nonvolatile storage elements Ma1 and Ma1 operates at around the threshold voltage), it is necessary that, in the nonvolatile storage element Ma1 operated at a gate-source voltage Vgs of 0 V, positive electric charge is previously injected into the floating gate G1 so that the threshold voltage becomes slightly negative. On the other hand, in the nonvolatile storage element Ma2 operated at a gate-source voltage Vgs of 3 V, negative electric charge needs to be previously injected into the floating gate G1 so that the threshold voltage becomes smaller than the reference voltage Vref by a value slightly smaller than 3 V. At this time, the floating gate G1 of the nonvolatile storage element Ma1 is set to N type, and the floating gate G1 of the nonvolatile storage element Ma2 used as the enhancement type transistor is set to P type. In this manner, the amount of electric charge to be injected into each of the nonvolatile storage elements Ma1 and Ma2 can be reduced, whereby the amount of electric charge leaking out from within the floating gates G1 and G2 is reduced, thus enabling improvement in the electric charge holding characteristics of the reference voltage generation circuit 5.

Next will be a description of the polarity of the floating gate (hereinafter referred to as "floating gate polarity") of the control gate area CGA. The floating gate polarity of the control gate area CGA serves to reduce an electric field applied on the gate insulating film 123 of the control gate area CGA in the state where electric charge is injected in the floating gate G2. The reason for this will be as below.

In the control gate area CGA, the value of an insulating film capacitance C2 of the gate insulating film 123 needs to be sufficiently large compared to that in the MOSFET area MFA and the electric charge injection area CIA. In other words, the gate insulating film 123 needs to be made larger in area than the gate insulating films 113 and 133 of the other two areas MFA and CIA. Due to this, since the gate insulating film 123 of the control gate area CGA becomes a main path of electric charge leakage, an electric field applied to the gate insulating film 123 is made small. Reducing the electric field applied to the gate insulating film 123 of the control gate area CGA in the electric charge injected state enables significant improvement in the electric charge holding characteristics of the reference voltage generation circuit 5.

Figure 50:
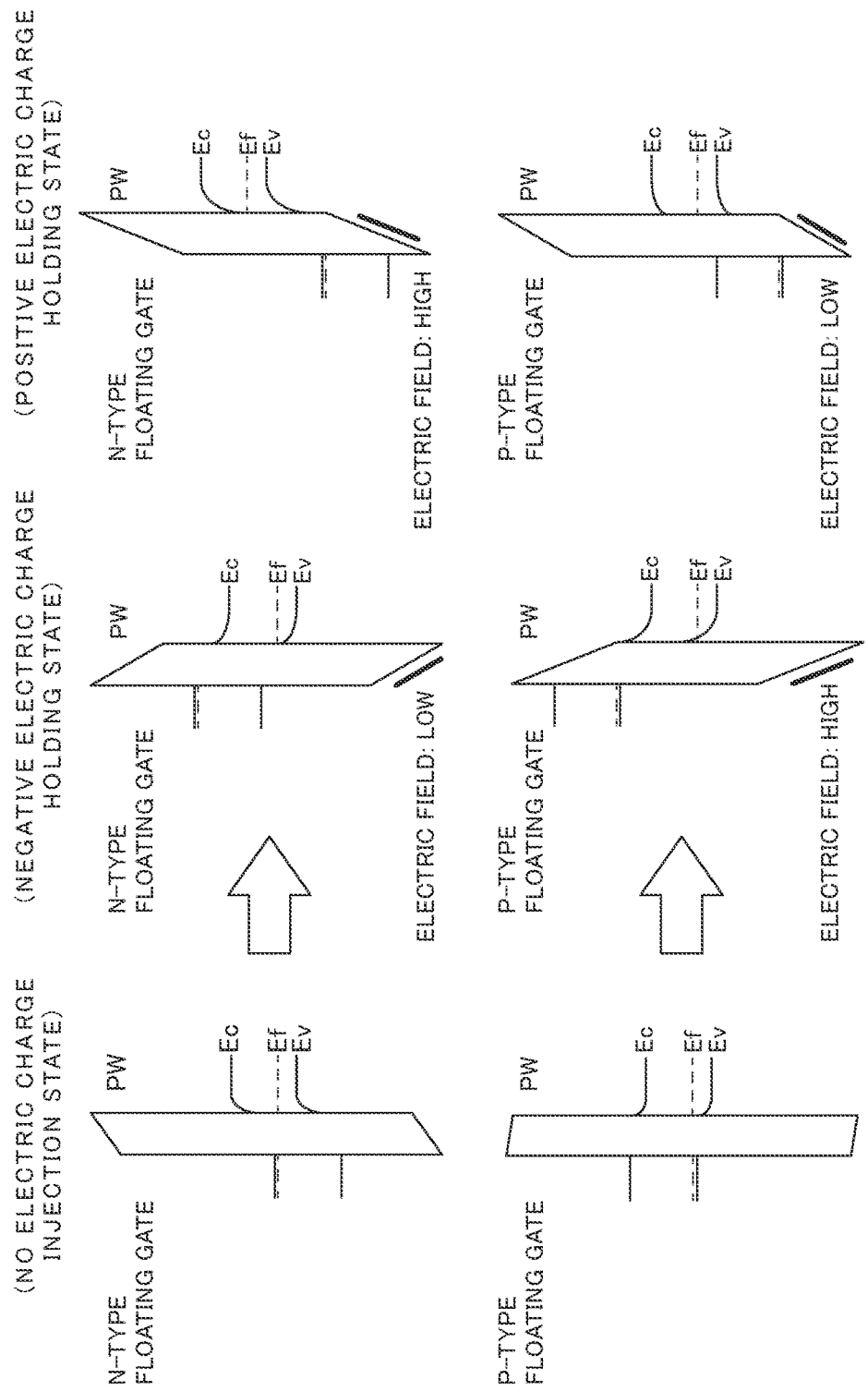
FIG. 50 is diagrams for illustrating the nonvolatile storage elements Ma1 and Ma2 according to the fifth embodiment of the invention, the diagrams illustrating electric fields applied to the gate insulating films of the control gate area and the electric charge injection area.

FIG. 50 illustrate an energy band structure near the gate insulating film 123 of the control gate area CGA and the gate insulating film 133 of the electric charge injection area CIA. Specifically, when a substrate polarity immediately under the floating gate G2 of the control gate area CGA is P type (namely, a P-well), the floating gate of a nonvolatile storage element used by injecting positive electric charge into the floating gate G2 is set to P type, whereas the floating gate of a nonvolatile storage element used by injecting negative electric charge into the floating gate is set to N type. This can reduce an electric field applied to the gate insulating film 123 in the state where electric charge is injected and held, as illustrated in the example of FIG. 50.

Figure 51:
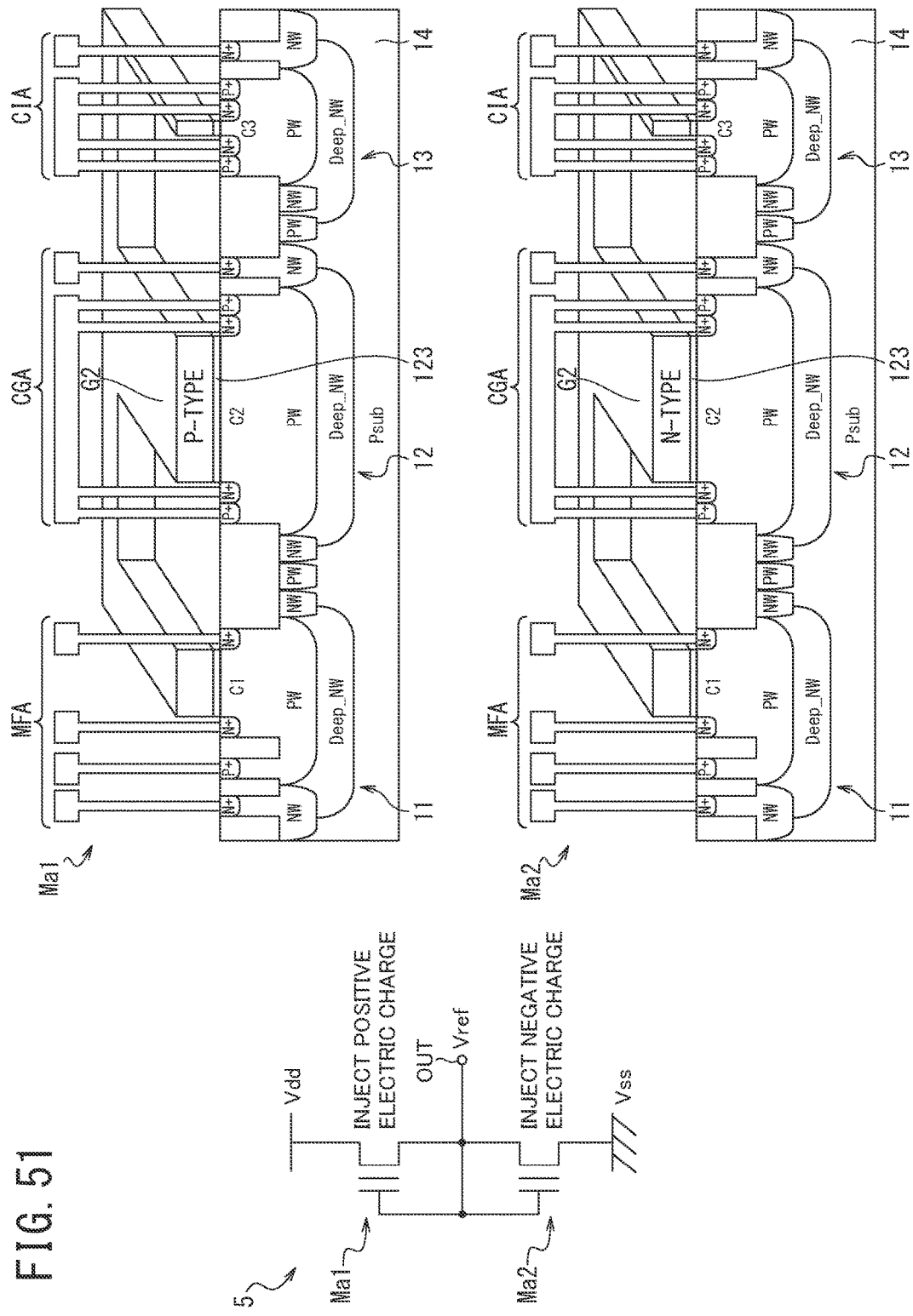
FIG. 51 is diagrams for illustrating floating gate polarities of the control gate areas of the nonvolatile storage elements Ma1 and Ma2 included in the reference voltage generation circuit 5 according to the fifth embodiment of the invention.

More specifically, for example, in the reference voltage generation circuit 5 configured to output a reference voltage Vref, illustrated in FIG. 51, assume a state where positive electric charge is injected in the floating gate G2 of the depletion type transistor and negative electric charge is injected in the floating gate G2 of the enhancement type transistor. In this case, the floating gate G2 of the control gate area CGA of the nonvolatile storage element Ma1 used as the depletion type transistor is set to P type, and the floating gate G2 of the control gate area CGA of the nonvolatile storage element Ma2 used as the enhancement type transistor is set to N type. Thereby, in the state where the electric charge is injected and held, an electric field applied to the gate insulating film 123 is reduced, so that the reference voltage generation circuit 5 can have excellent electric charge holding characteristics.

Lastly, a description will be given of the floating gate polarity of the electric charge injection area. The gate insulating film 133 of the electric charge injection area CIA allows a tunnel current to flow therethrough when electric current is injected, and therefore tends to become more defective than the gate insulating films 113 and 123 of the other areas MFA and CGA. Accordingly, the gate insulating film 133 of the electric charge injection area CIA can be a path of electric charge leakage, although it is small in area than the gate insulating film 123 of the control gate area CGA. Even in the electric charge injection area CIA, from exactly the same perspective as in the control gate area CGA illustrated in FIG. 50, the electric charge holding characteristics can be improved by reducing an electric field applied to the gate insulating film 133 in the state where electric charge is injected and held.

Figure 52:
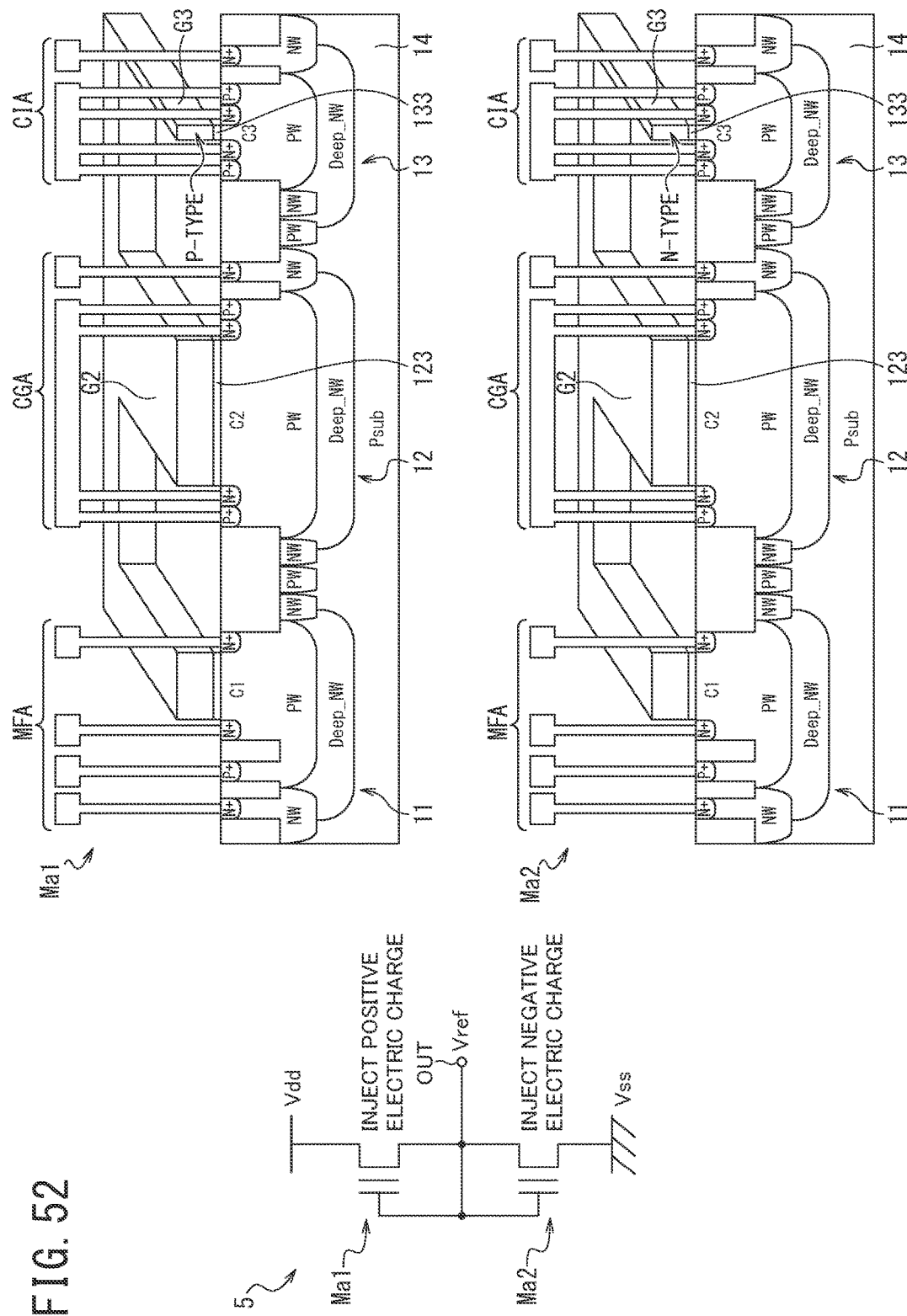
FIG. 52 is diagrams for illustrating floating gate polarities of the electric charge injection areas of the nonvolatile storage elements Ma1 and Ma2 included in the reference voltage generation circuit 5 according to the fifth embodiment of the invention.

Here, in the reference voltage generation circuit 5 configured to output the reference voltage Vref, illustrated in FIG. 52, assume a state where positive electric charge is injected into the floating gate of the depletion type transistor, and negative electric charge is injected into the floating gate of the enhancement type transistor. The floating gate G2 of the control gate area CGA of the nonvolatile storage element Ma1 used as the depletion type transistor is set to P type, and the floating gate G2 of the control gate area CGA of the nonvolatile storage element Ma2 used as the enhancement type transistor is set to N type. This can reduce an electric field applied to the gate insulating film 123 in the state where electric charge is injected and held, so that the reference voltage generation circuit 5 can have excellent electric charge holding characteristics.

Figure 53:
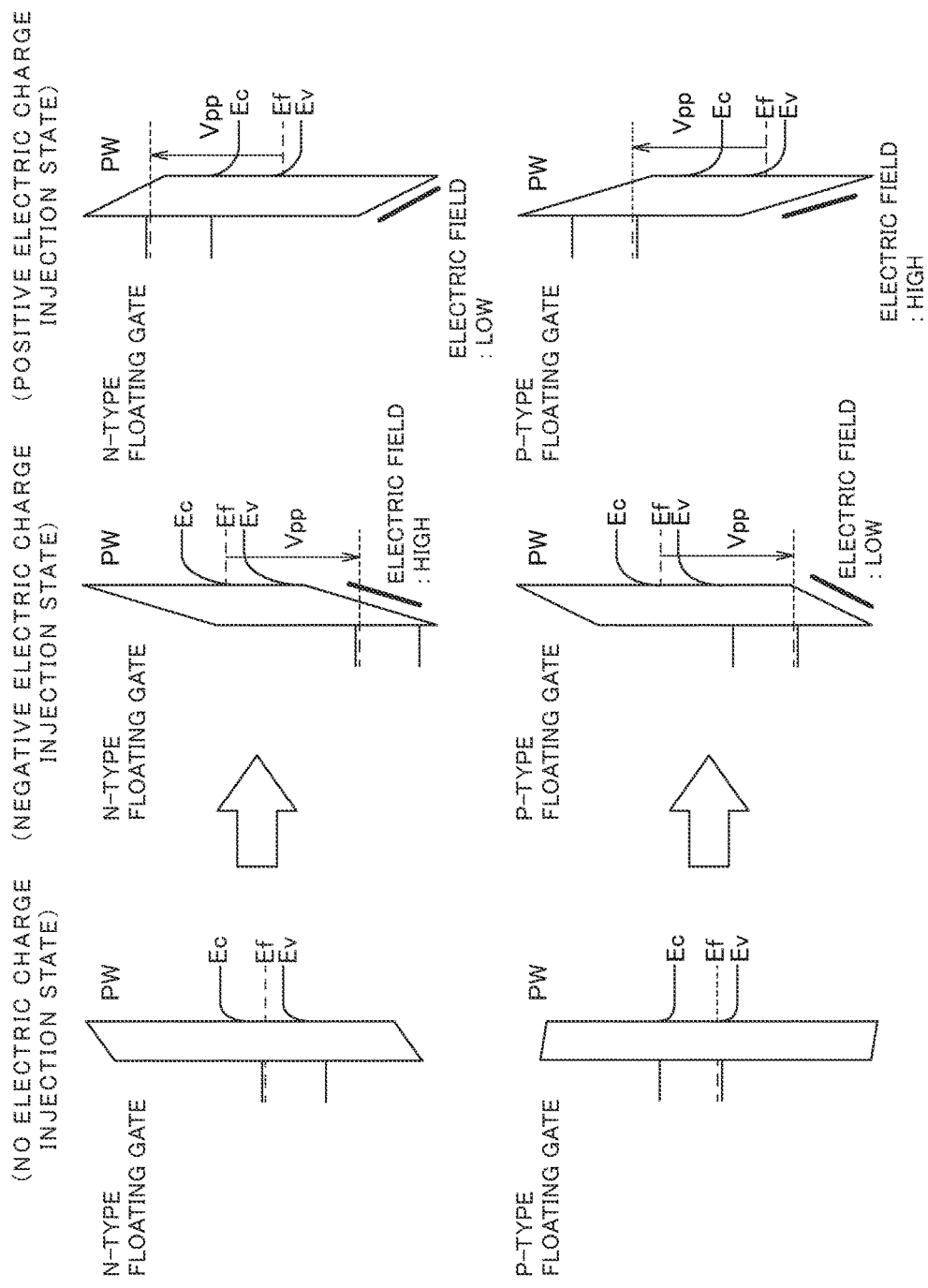
FIG. 53 is diagrams for describing the nonvolatile storage elements Ma1 and Ma2 according to the fifth embodiment of the invention, the diagrams illustrating electric fields applied to the gate insulating film of the electric charge injection area.

FIG. 53 illustrate an energy band structure near the gate insulating film 133 of the electric charge injection area CIA. In the structure in which an electric field applied to the gate insulating film is reduced in the state where the electric charge is injected and held, at a moment of electric charge injection, conversely, a high electric field is applied to the gate insulating film 133 of the electric charge injection area CIA, as illustrated in FIG. 53. This provides an advantage that an external power source voltage Vpp for use in electric charge injection can be reduced.

Figure 54:
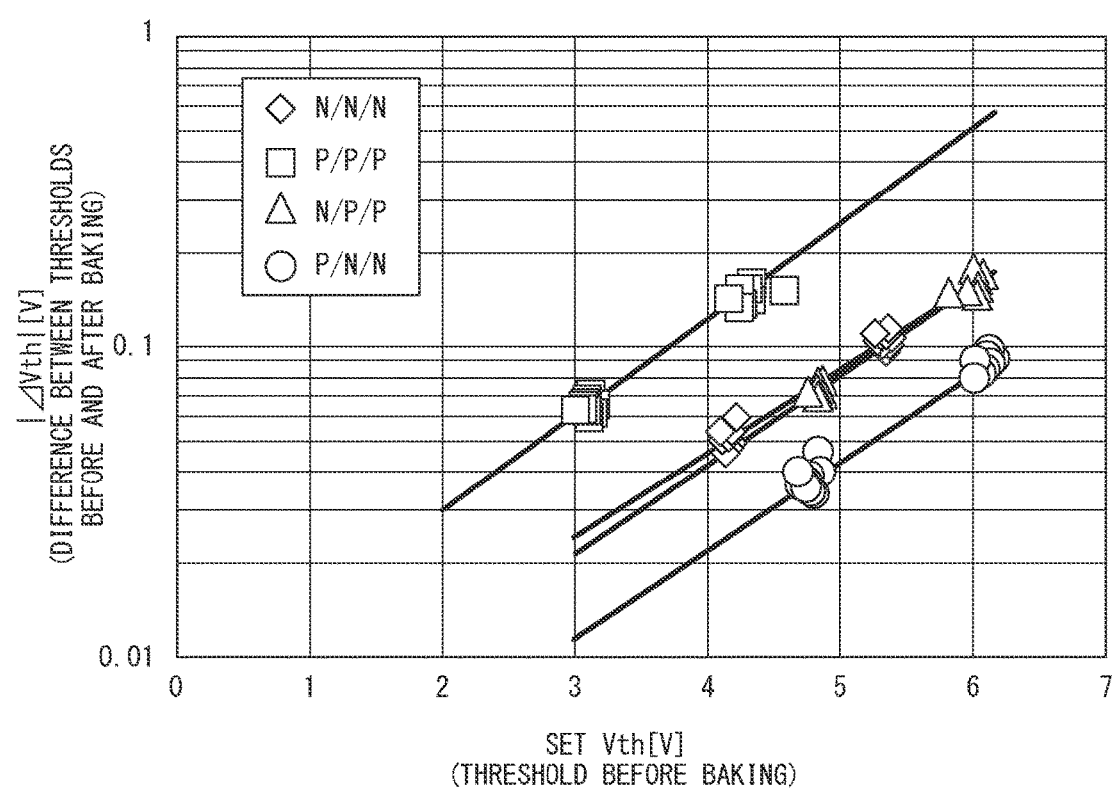
FIG. 54 is a diagram for illustrating the nonvolatile storage elements Ma1 and Ma2 according to the fifth embodiment of the invention, the diagram illustrating dependence of electric charge holding characteristics on floating gate polarity.

FIG. 54 illustrates a graph of evaluation of electric charge holding characteristics obtained by injecting negative electric charge into the floating gate in various combinations of floating gate polarities. The horizontal axis represents threshold voltages of the nonvolatile storage elements immediately after injecting negative electric charge, and the vertical axis represents threshold voltage fluctuation amount ΔVth of each nonvolatile storage element after performing baking at 250° C. for 12 hours. "N/N/N", "P/P/P", "N/P/P", and "P/N/N" depicted in FIG. 54, respectively, represent the floating gate polarities of the MOSFET area/control gate area/electric charge injection area from the left. "N" represents N type, and "P" represents P type. For example, "N/P/P" indicates that "floating gate polarity of the MOSFET area: N-type/floating gate polarity of the control gate area: P type/floating gate polarity of the electric charge injection area: P type".

It can be seen that the electric charge holding characteristics have been significantly influenced by the floating gate polarities. Regarding the electric charge holding characteristics of the present example, the best combination of the floating gate polarities in the nonvolatile storage element of the enhancement type transistor side is a combination of P type in the MOSFET area MFA, N type in the control gate area CGA, and N type in the electric charge injection area CIA. Additionally, the best combination of the floating gate polarities in the nonvolatile storage element of the depletion type transistor side is a combination obtained by inverting the polarities of the enhancement type transistor side. Specifically, the best combination of the floating gate polarities in the nonvolatile storage element of the depletion type transistor side is a combination of N type in the MOSFET area MFA, P type in the control gate area CGA, and P type in the electric charge injection area CIA.

Figure 55:
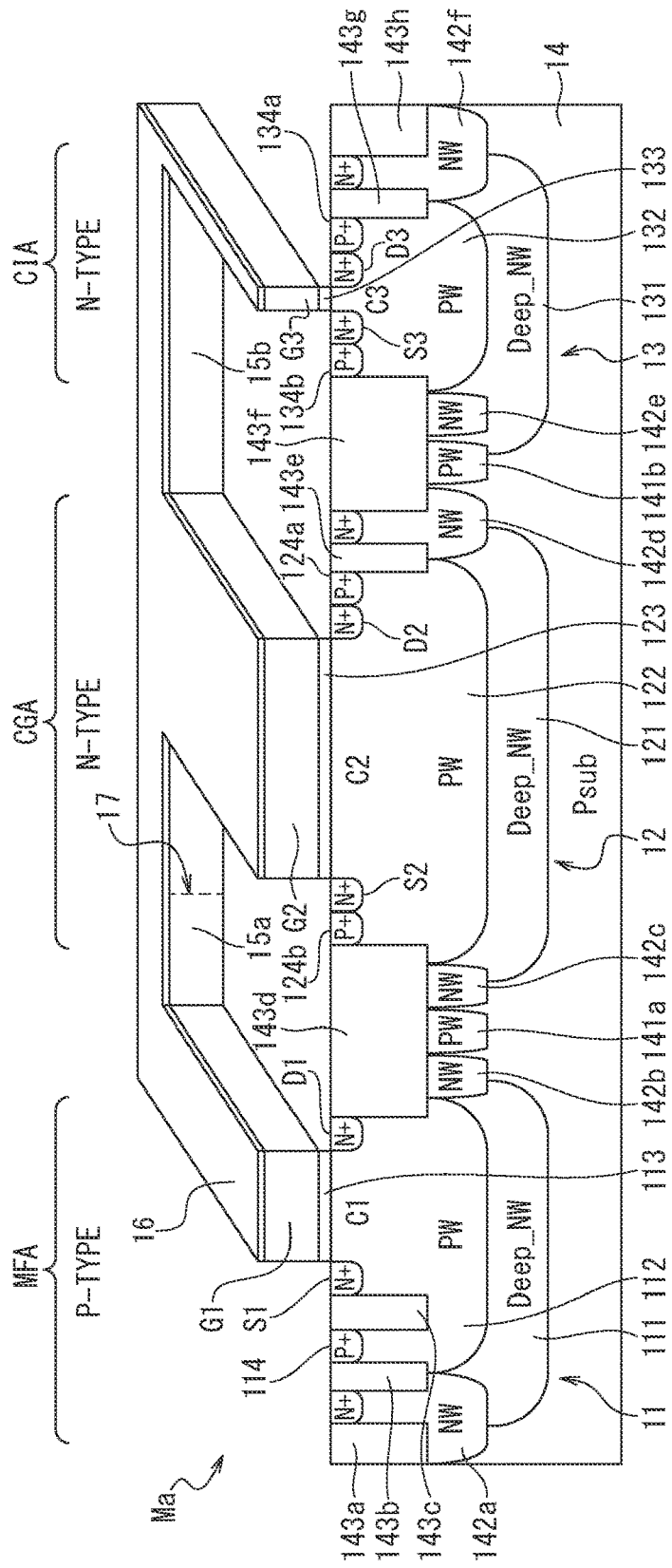
FIG. 55 is a diagram for illustrating a nonvolatile storage element Ma according to the fifth embodiment of the invention, the diagram illustrating a best combination of floating gate polarities of an enhancement-type transistor side.
Figure 56:
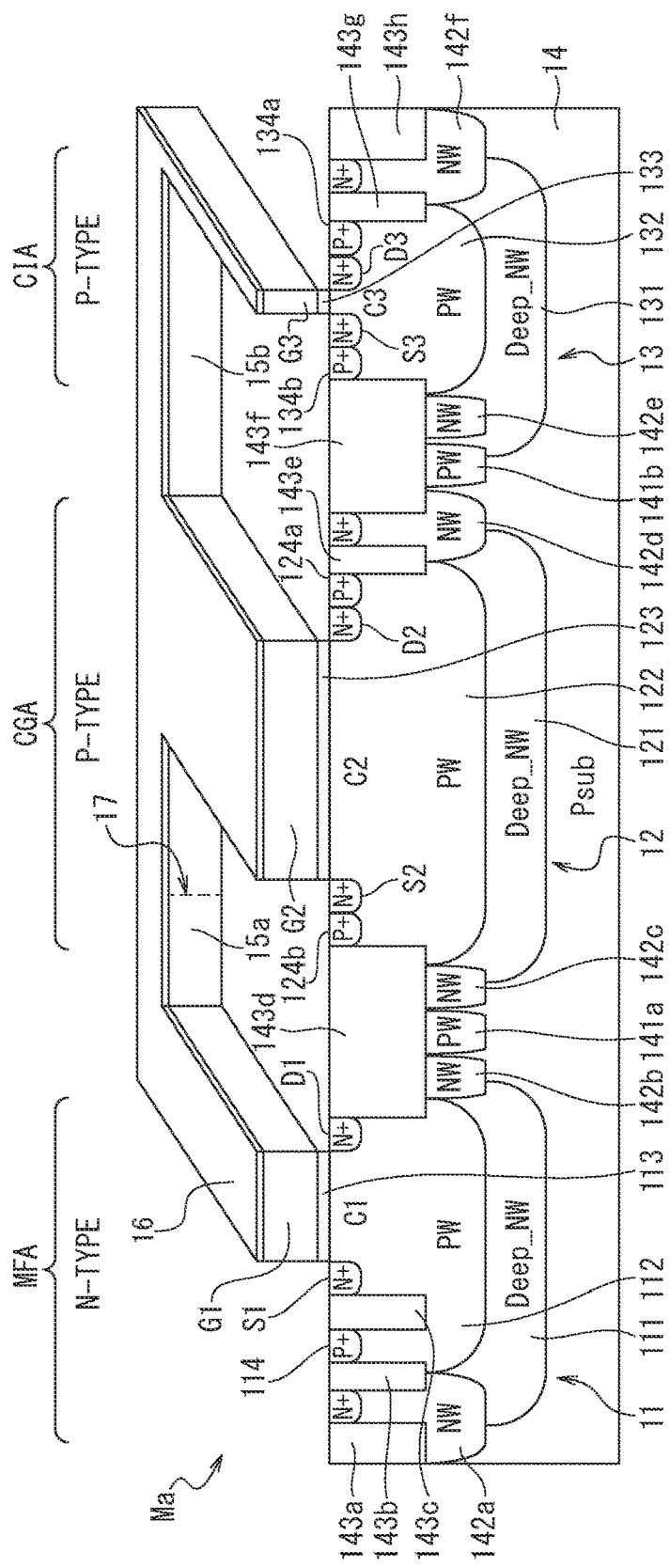
FIG. 56 is a diagram for illustrating a nonvolatile storage element Ma according to the fifth embodiment of the invention, which is a diagram illustrating a best combination of floating gate polarities of a depletion-type transistor side.

FIG. 55 and FIG. 56 illustrate states of the best combinations of the floating gate polarities. FIG. 55 illustrates the state of the enhancement type transistor side, and FIG. 56 illustrates the state of the depletion type transistor side. The nonvolatile storage elements Ma illustrated in FIG. 55 and FIG. 56 are examples in which each of the MOSFET area MFA, the control gate area CGA, and the electric charge injection area CIA includes a NMOS based structure including a source region and a drain region of N-type. Note that even in a structure in which the polarities of the floating gates are inverted between the enhancement side and the depletion side in only one or two of the areas, there is an effect that improves the electric charge holding characteristics.

The polarities (P-type) of the floating gates of the MOSFET area MFA in FIG. 55 and the control gate area CGA and the electric charge injection area CIA in FIG. 56 are different from the polarities (N-type) of the source regions/the drain regions of the respective area. That is, it is necessary to control the polarity of the floating gate separately from the formation of the source region/the drain region in the manufacturing process of the nonvolatile storage elements Ma according to the present embodiment. For example, an ion implantation is performed at a high concentration to a single layer polysilicon that eventually serves as the floating gate, before forming a pattern of the floating gate. Then, an ion implantation is performed to the semiconductor substrate to form the source region/drain region after forming the pattern of the floating gate. This makes it possible to form the nonvolatile storage elements Ma including the areas in which the polarities of the floating gates are different from the polarities of the source regions/drain regions of the respective area.

As illustrated in FIG. 55 and FIG. 56, the nonvolatile storage element Ma according to the present embodiment includes a MOS transistor 11 (one example of the first MOS transistor) including a source region S1 (one example of the first source region), a drain region D1 (one example of the first drain region), and a floating gate G1 that is one conductive type of P type or N type and is in a floating state (one example of the first gate). Additionally, the nonvolatile storage element Ma according to the present embodiment includes a MOS transistor 12 (one example of the second MOS transistor) including a floating gate G2 that is the other conductive type of P type or N type (one example of the second gate), as well as a source region S2 (one example of the second source region), a drain region D2 (one example of the second drain region), and a P-well region 122 (one example of the second bulk region) that are connected to each other. The nonvolatile storage element Ma according to the present embodiment further includes a PN junction portion 17 configured to form a PN junction between the floating gate G1 of the MOS transistor 11 and the floating gate G2 of the MOS transistor 12 and a silicide 16 formed on the PN junction portion 17.

As illustrated in FIG. 55, in the MOS transistor 11 in the nonvolatile storage element Ma according to the present embodiment, the conductivity type (P-type) of the floating gate G1 is different from the conductivity type (N-type) of the source region S1 and the drain region D1. On the other hand, in the MOS transistor 12, the conductivity type (N-type) of the floating gate G2 is the same as the conductivity type (N-type) of the source region S1 and the drain region D1.

In addition, as illustrated in FIG. 56, in the MOS transistor 12 in the nonvolatile storage element Ma according to the present embodiment, the conductivity type (P-type) of the floating gate G2 is different from the conductivity type (N-type) of the source region S1 and the drain region D1. On the other hand, in the MOS transistor 11, the conductivity type (N-type) of the floating gate G1 is the same as the conductivity type (N-type) of the source region S1 and the drain region D1.

Thus, it is preferable that the nonvolatile storage element Ma according to the present embodiment include at least one of the structure in which the conductivity type of the floating gate G1 is different from the conductivity type of the source region S1 in the MOS transistor 11 and the structure in which the conductivity type of the floating gate G2 is different from the conductivity type of the source region S2 in the MOS transistor 12.

The nonvolatile storage element Ma according to the present embodiment further includes a MOS transistor 13 (one example of the third MOS transistor) including a floating gate G3 that is connected to the floating gate G2 of the MOS transistor 12 and is the other conductive type of P type or N type (one example of the third gate), as well as a source region S3 (one example of the third source region), a drain region D3 (one example of the third drain region), and a P-well region 132 (one example of a third bulk region) that are connected to each other.

As illustrated in FIG. 55, the nonvolatile storage element Ma according to the present embodiment includes a structure in which the conductivity type (P-type) of the floating gate G1 is different from the conductivity type (N-type) of the source region S1 and the drain region D1 in the MOS transistor 11. On the other hand, as illustrated in FIG. 55, and the conductivity type (N-type) of the floating gates G2 and G3 is the same as the conductivity type (N-type) of the source region S2, the drain region D2, the source region S3, and the drain region D3 in the MOS transistor 12.

In addition, as illustrated in FIG. 56, the nonvolatile storage element Ma according to the present embodiment includes a structure in which the conductivity type (P-type) of the floating gates G2 and G3 is different from the conductivity type (N-type) of the source region S2, the drain region D2, the source region S3, and the drain region D3 in the MOS transistors 12 and 13. On the other hand, as illustrated in FIG. 56, and the conductivity type (N-type) of the floating gates G1 is the same as the conductivity type (N-type) of the source region S1 and the drain region D1 in the MOS transistor 11.

Thus, it is preferable that the nonvolatile storage element Ma according to the present embodiment include at least one of the structure in which the conductivity type of the floating gate G1 is different from the conductivity type of the source region S1 in the MOS transistor 11, the structure in which the conductivity type of the floating gate G2 is different from the conductivity type of the source region S2 in the MOS transistor 12, the structure in which the conductivity type of the floating gate G3 is different from the conductivity type of the source region S3 in the MOS transistor 13.

In addition, some or each of the MOSFET area MFA, the control gate area CGA, and the electric charge injection area CIA of the nonvolatile storage elements Ma may include a PMOS based structure including a source region and a drain region of P-type.

Figure 57:
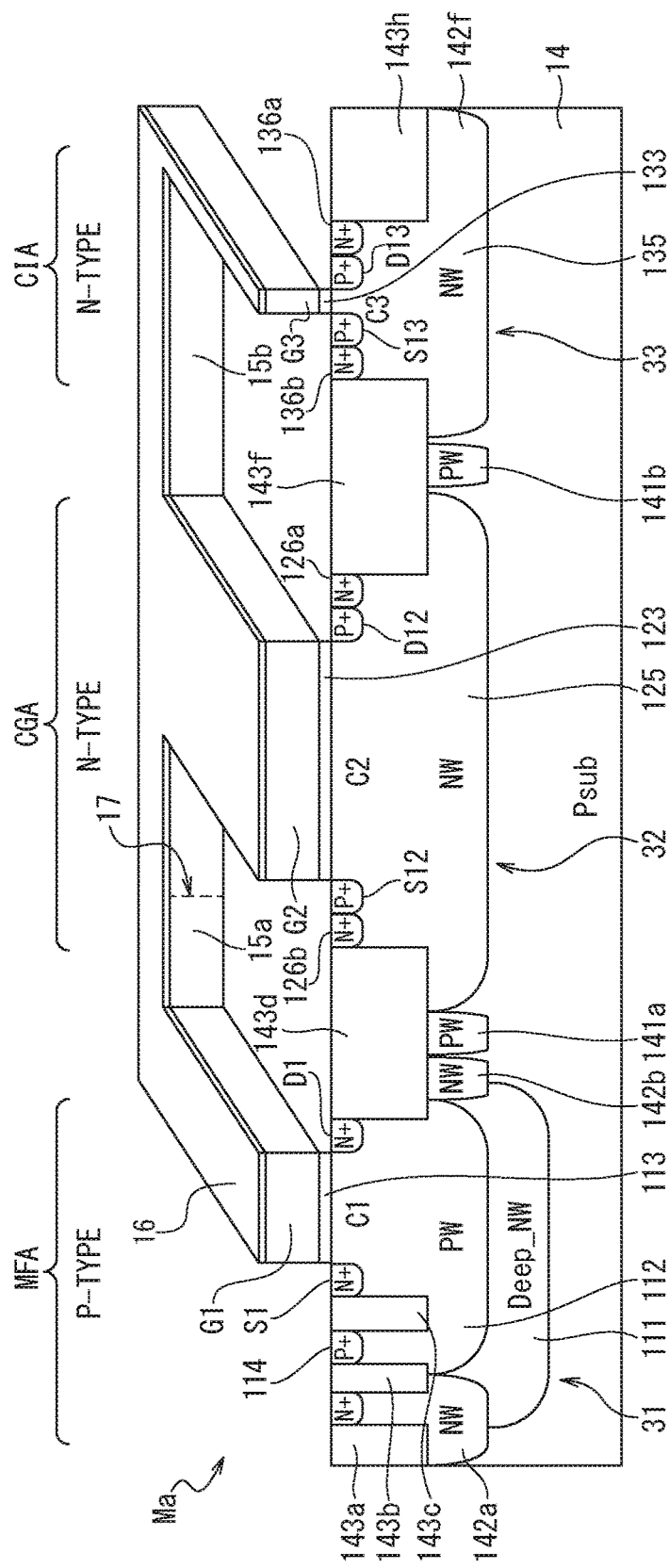
FIG. 57 is a diagram for illustrating a nonvolatile storage element Ma according to the fifth embodiment of the invention, the diagram illustrating another best combination of floating gate polarities of an enhancement-type transistor side.
Figure 58:
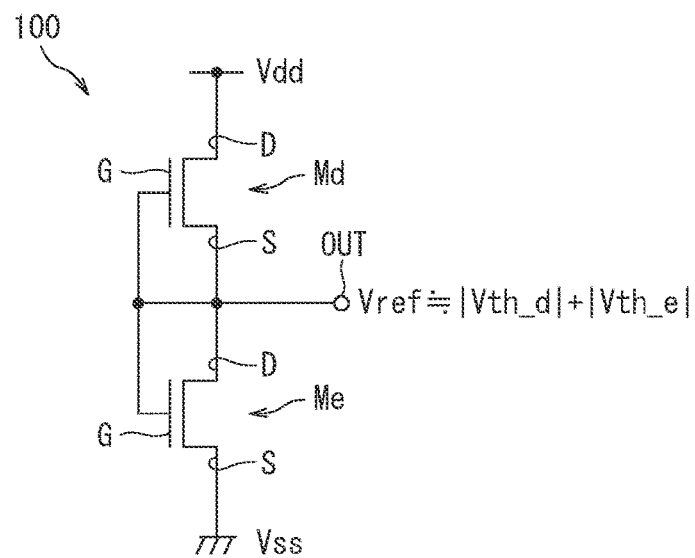
FIG. 58 is a circuit structural diagram of a conventional reference voltage generation circuit 100.
Figure 59:
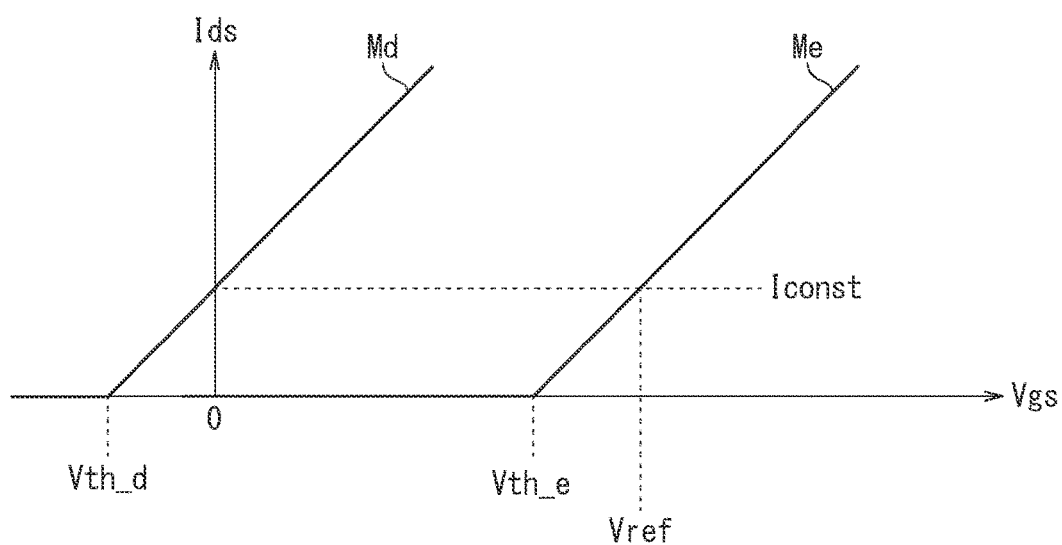
FIG. 59 is a diagram illustrating one example of current/voltage characteristics of a depletion-type transistor Md and an enhancement-type transistor Me included in the conventional reference voltage generation circuit 100.

For example, FIG. 57 illustrates the state of the enhancement type transistor side of the nonvolatile storage elements Ma with the MOSFET area MFA including the NMOS based structure, and the control gate area CGA and the electric charge injection area CIA each including the PMOS based structure. Note that the common portions of FIG. 57 and FIG. 55 are denoted by the same reference numerals.

In the nonvolatile storage elements Ma illustrated in FIG. 57, an N-well region 125 is provided instead of the deep N-well region 121 and the P-well region 122 of the nonvolatile storage elements Ma illustrated in FIG. 55. Furthermore, in the nonvolatile storage elements Ma illustrated in FIG. 57, an N-well region 135 is provided instead of the deep N-well region 131 and the P-well region 132 of the nonvolatile storage elements Ma illustrated in FIG. 55. In addition, in the nonvolatile storage elements Ma illustrated in FIG. 57, a drain region D12 and a source region S12 are formed inside the N-well region 125. The drain region D12 is connected to an N+ region 126a that is a contact portion of the N-well region 125. The source region S12 is connected to an N+ region 126b that is a contact portion of the N-well region 125. Similarly, in the nonvolatile storage elements Ma illustrated in FIG. 57, a drain region D13 and a source region S13 are formed inside the N-well region 135. The drain region D13 is connected to an N+ region 136a that is a contact portion of the N-well region 135. The source region S13 is connected to an N+ region 136b that is a contact portion of the N-well region 135.

The drain region D12 and the source region S12 are P+ regions formed inside the N-well region 125. The drain region D13 and the source region S13 are P+ regions formed inside the N-well region 135.

In the MOS transistor 31 in the nonvolatile storage element Ma illustrated in FIG. 57, the conductivity type (P-type) of the floating gate G1 is different from the conductivity type (N-type) of the source region S1 and the drain region D1. On the other hand, in the MOS transistor 32, the conductivity type (N-type) of the floating gate G2 is different from the conductivity type (P-type) of the source region S12 and the drain region D12. Further, in the MOS transistor 33, the conductivity type (N-type) of the floating gate G3 is different from the conductivity type (P-type) of the source region S13 and the drain region D13.

As described above, the nonvolatile storage element Ma according to the present invention may include a structure in which the conductivity type of the floating gate is different from the conductivity type of the source region in at least one of the plurality of MOS transistors.

In this manner, by appropriately optimizing the floating gate polarities of the respective areas MFA, CGA, and CIA, excellent electric charge holding characteristics can be obtained. Note that when changing the floating gate polarity of each one area among the MFA, the CGA, and CIA, it is necessary to previously silicide the surface of polysilicon forming the floating gates G1, G2, and G3, as illustrated in FIG. 55 and FIG. 56. The silicide 16 is provided to short-circuit the PN junction portion 17 that is a contact portion between the P-type floating gate and the N-type floating gate. The silicide 16 may be formed by siliciding the entire surface of the floating gates G1, G2, and G3 and the connection portions 15a and 15b formed of polysilicon or maybe formed by partially siliciding the PN junction portion 17.

As described hereinabove, by assembling the same reference voltage generation circuit as the first embodiment by using such nonvolatile storage elements, there can be provided a highly precise and highly versatile reference voltage generation circuit having excellent electric charge holding characteristics and capable of being formed of single layer polysilicon.

REFERENCE SIGNS LIST 1, 2, 3, 4, 5, 100: Reference voltage generation circuit
11, 12, 13, 21, 32, 33: MOS transistor
14: Semiconductor substrate
15a, 15b: Connection portion
16: Silicide
17, 144a, 144b, 144c, 144d, 144e, 144f: PN junction portion
111, 121, 131: Deep N-well region
112, 122, 132, 141a, 141b: P-well region
113, 123, 133, 213: Gate insulating film
114, 124a, 124b, 143a, 134b: P+ region
126a, 126b, 136a, 136b: N+ region
142a, 142b, 142c, 142d, 142e, 142f, 125, 135, 212: N-well region
143a, 143b, 143c, 143d, 143e, 143f, 143g, 143h: Element isolation region
CGA: Control gate area
CIA: Electric charge injection area
D, D1, D2, D3, D12, D13, D21: Drain region
G: Gate
G1, G2, G3, G21: Floating gate
Ma, Ma1, Ma2, Mb, Mb1, Mb2: Nonvolatile storage element
MFA: MOSFET area
S, S1, S2, S3, S12, S13, S21: Source region
SW1 to SW9: Switch
Ta, Tb, Tc, Td, Te, Tf, Tg, Th: Terminal

The invention claimed is:

1. A reference voltage generation circuit comprising:
a first MOS transistor including a first source terminal, a first drain terminal, and a first gate terminal in a floating state;
a second MOS transistor including a second gate terminal connected to the first gate terminal, a second source terminal, a second drain terminal, and a second bulk terminal, the second source terminal, the second drain terminal, and the second bulk terminal being connected to the first source terminal and being connected to each other;
a third MOS transistor including a third source terminal, a third drain terminal, and a third gate terminal in a floating state;
a fourth MOS transistor including a fourth gate terminal connected to the third gate terminal, a fourth source terminal, a fourth drain terminal, and a fourth bulk terminal, the fourth source terminal, the fourth drain terminal, and the fourth bulk terminal being connected to the third drain terminal and being connected to each other;
a first power source terminal; and
a second power source terminal configured to have a lower voltage than a voltage of the first power source terminal when the first MOS transistor and the third MOS transistor are N-channel MOS transistors, and to have a higher voltage than the voltage of the first power source terminal when the first MOS transistor and the third MOS transistor are P-channel MOS transistors,
wherein the first drain terminal is connected to the first power source terminal, the third source terminal is connected to the second power source terminal, and the first source terminal is connected to the third drain terminal; or
wherein the third drain terminal is connected to the first power source terminal, the first source terminal is connected to the second power source terminal, and the first drain terminal is connected to the third source terminal.

2. The reference voltage generation circuit according to claim 1, wherein the first MOS transistor and the second MOS transistor serve as a single depletion type MOS transistor, and the third MOS transistor and the fourth MOS transistor serve as a single enhancement type MOS transistor.

3. The reference voltage generation circuit according to claim 1, wherein the first MOS transistor and the third MOS transistor are of the same conductive type.

4. The reference voltage generation circuit according to claim 1, wherein an area of each of the second MOS transistor and the fourth MOS transistor is from 1000 μm$^2$ to 1 mm$^2$.

5. The reference voltage generation circuit according to claim 1, wherein the first to fourth MOS transistors do not have any array structure.

6. A nonvolatile storage element comprising:
a first MOS transistor including a first source region, a first drain region, and a first gate, the first gate being of one conductive type of P type or N type and being in a floating state;
a second MOS transistor including a second gate, a second source region, a second drain region, and a second bulk region, the second gate being of another conductive type of P type or N type, the second source region, the second drain region, and the second bulk region being connected to each other;
a PN junction portion configured to form a PN junction between the first gate and the second gate; and
a silicide formed on the PN junction portion, wherein
the nonvolatile storage element includes at least one of a structure in which the conductivity type of the first gate is different from a conductivity type of the first source region in the first MOS transistor, and a structure in which the conductivity type of the second gate is different from a conductivity type of the second source region in the second MOS transistor.

7. A nonvolatile storage element comprising:
a first MOS transistor including a first source region, a first drain region, and a first gate, the first gate being of one conductive type of P type or N type and being in a floating state;
a second MOS transistor including a second gate, a second source region, a second drain region, and a second bulk region, the second gate being of another conductive type of P type or N type, the second source region, the second drain region, and the second bulk region being connected to each other;
a PN junction portion configured to form a PN junction between the first gate and the second gate;

a silicide formed on the PN junction portion; and a third MOS transistor including a third gate connected to the second gate, a third source region, a third drain region, and a third bulk region, the third gate being of the other conductive type, the third source region, the third drain region, and the third bulk region being connected to each other, wherein the nonvolatile storage element includes at least one of a structure in which the conductivity type of the first gate is different from a conductivity type of the first source region in the first MOS transistor, a structure in which the conductivity type of the second gate is different from a conductivity type of the second source region in the second MOS transistor, and a structure in which the conductivity type of the third gate is different from a conductivity type of the third source region in the third MOS transistor.

8. A reference voltage generation circuit comprising a plurality of nonvolatile storage elements each of which comprising:
- a first MOS transistor including a first source region, a first drain region, and a first gate, the first gate being of one conductive type of P type or N type and being in a floating state;
- a second MOS transistor including a second gate, a second source region, a second drain region, and a second bulk region, the second gate being of another conductive type of P type or N type, the second source region, the second drain region, and the second bulk region being connected to each other;
- a PN junction portion configured to form a PN junction between the first gate and the second gate; and
- a silicide formed on the PN junction portion, the plurality of the nonvolatile storage elements including at least a first nonvolatile storage element configured to serve as a depletion type MOS transistor and a second nonvolatile storage element configured to serve as an enhancement type MOS transistor, and the first nonvolatile storage element and the second nonvolatile storage element being connected in series between a first power source terminal and a second power source terminal.

9. The reference voltage generation circuit according to claim 8, wherein at least one of the first gate and the second gate of the first nonvolatile storage element is of a different conductive type from the conductive type of at least one of the first gate and the second gate of the second volatile storage element in at least some regions.

10. The reference voltage generation circuit according to claim 8, wherein the first nonvolatile storage element is the same in size as the second nonvolatile storage element.

11. The reference voltage generation circuit according to claim 8, wherein an area of each of the first nonvolatile storage element and the second nonvolatile storage element is from 1000 $\mu m^2$ to 1 $mm^2$.

12. The reference voltage generation circuit according to claim 8, wherein the first nonvolatile storage element and the second nonvolatile storage element do not have any array structure.

13. A reference voltage generation circuit comprising a plurality of nonvolatile storage elements each of which comprising:
- a first MOS transistor including a first source region, a first drain region, and a first gate, the first gate being of one conductive type of P type or N type and being in a floating state;
- a second MOS transistor including a second gate, a second source region, a second drain region, and a second bulk region, the second gate being of another conductive type of P type or N type, the second source region, the second drain region, and the second bulk region being connected to each other;
- a PN junction portion configured to form a PN junction between the first gate and the second gate;
- a silicide formed on the PN junction portion; and
- a third MOS transistor including a third gate connected to the second gate, a third source region, a third drain region, and a third bulk region, the third gate being of the other conductive type, the third source region, the third drain region, and the third bulk region being connected to each other, the plurality of the nonvolatile storage elements including at least a first nonvolatile storage element configured to serve as a depletion type MOS transistor and a second nonvolatile storage element configured to serve as an enhancement type MOS transistor, and the first nonvolatile storage element and the second nonvolatile storage element being connected in series between a first power source terminal and a second power source terminal, wherein at least one of the first gate, the second gate and the third gate of the first nonvolatile storage element is of a different conductive type from the conductive type of at least one of the first gate, the second gate and the third gate of the second volatile storage element in at least some regions.

\* \* \* \* \*